United States Patent
Okamoto et al.

(10) Patent No.: US 12,034,322 B2
(45) Date of Patent: Jul. 9, 2024

(54) SEMICONDUCTOR DEVICE AND OPERATING METHOD OF SEMICONDUCTOR DEVICE

(71) Applicant: Semiconductor Energy Laboratory Co., Ltd., Atsugi (JP)

(72) Inventors: Yuki Okamoto, Isehara (JP); Takahiko Ishizu, Sagamihara (JP); Kei Takahashi, Isehara (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 423 days.

(21) Appl. No.: 17/422,314

(22) PCT Filed: Jan. 14, 2020

(86) PCT No.: PCT/IB2020/050244
§ 371 (c)(1),
(2) Date: Jul. 12, 2021

(87) PCT Pub. No.: WO2020/152541
PCT Pub. Date: Jul. 30, 2020

(65) Prior Publication Data
US 2022/0094177 A1    Mar. 24, 2022

(30) Foreign Application Priority Data

Jan. 24, 2019   (JP) .................................. 2019-010581
Jan. 28, 2019   (JP) .................................. 2019-012339
(Continued)

(51) Int. Cl.
*H02J 7/00*      (2006.01)
*H01M 10/48*     (2006.01)

(52) U.S. Cl.
CPC ........... *H02J 7/0019* (2013.01); *H01M 10/48* (2013.01); *H02J 7/0016* (2013.01)

(58) Field of Classification Search
CPC ....... H02J 7/0019; H02J 7/0016; H01M 10/48
See application file for complete search history.

(56) References Cited

U.S. PATENT DOCUMENTS 7,978,274 B2   7/2011  Umezaki et al.
8,520,159 B2   8/2013  Umezaki et al.
(Continued)

FOREIGN PATENT DOCUMENTS

CN    103119779 A    5/2013
EP      2589104 A    5/2013
(Continued)

OTHER PUBLICATIONS

International Search Report (Application No. PCT/IB2020/050244) dated Apr. 21, 2020.
(Continued)

*Primary Examiner* — Robert Grant
(74) *Attorney, Agent, or Firm* — Eric J. Robinson; Robinson Intellectual Property Law Office, P.C.

(57) ABSTRACT

A battery control circuit having a novel structure, a battery protection circuit having a novel structure, and a power storage device including the battery circuit are provided. A semiconductor device includes n cell balancing circuits that respectively correspond to one secondary battery and each include a transistor, a comparator circuit, and a capacitor. In each of the n cell balancing circuits, an inverting input terminal of the comparator circuit and one electrode of the capacitor are electrically connected to one of a source and a drain of the transistor. The semiconductor device has functions of supplying a ground potential to the other electrode of the capacitor; turning on the transistor; supplying a first
(Continued)

potential to the one electrode of the capacitor; turning off the transistor; electrically connecting the other electrode of the capacitor and a negative electrode of the secondary battery corresponding to each cell balancing circuit; supplying a sum of the first potential and a potential of the negative electrode of the secondary battery corresponding to each cell balancing circuit, to the one electrode of the capacitor; and controlling charging of the secondary battery corresponding to each cell balancing circuit.

17 Claims, 31 Drawing Sheets

(30) Foreign Application Priority Data

| | | | |
|---|---|---|---|
| Feb. 6, 2019 | (JP) | ................................. | 2019-019478 |
| Dec. 4, 2019 | (JP) | ................................. | 2019-219308 |
| Dec. 6, 2019 | (JP) | ................................. | 2019-221555 |

(56) References Cited

U.S. PATENT DOCUMENTS

| | | |
|---|---|---|
| 8,908,115 B2 | 12/2014 | Umezaki et al. |
| 9,263,468 B2 | 2/2016 | Umezaki et al. |
| 9,606,408 B2 | 3/2017 | Umezaki et al. |
| 10,048,558 B2 | 8/2018 | Umezaki et al. |
| 10,527,902 B2 | 1/2020 | Umezaki et al. |
| 11,237,445 B2 | 2/2022 | Umezaki et al. |
| 2005/0184795 A1 | 8/2005 | Koshita |
| 2006/0139004 A1 | 6/2006 | Uesugi et al. |
| 2007/0298753 A1 | 12/2007 | Tary et al. |
| 2010/0239896 A1 | 9/2010 | Kanno |
| 2010/0253285 A1 | 10/2010 | Takahashi et al. |
| 2011/0187329 A1 | 8/2011 | Majima et al. |
| 2011/0267726 A1 | 11/2011 | Ikeuchi et al. |
| 2013/0095350 A1 | 4/2013 | Aradachi et al. |
| 2013/0114330 A1 | 5/2013 | Takemura |
| 2013/0242446 A1* | 9/2013 | Oshima ................. H02H 3/207 361/86 |
| 2013/0271146 A1 | 10/2013 | Sakabe et al. |
| 2013/0271220 A1 | 10/2013 | Takahashi et al. |
| 2017/0063112 A1 | 3/2017 | Takahashi |
| 2021/0190471 A1 | 6/2021 | Ikeda et al. |
| 2021/0242690 A1 | 8/2021 | Okamoto et al. |
| 2021/0294367 A1 | 9/2021 | Takahashi et al. |
| 2022/0146872 A1 | 5/2022 | Umezaki et al. |

FOREIGN PATENT DOCUMENTS

| | | |
|---|---|---|
| EP | 2632021 A | 8/2013 |
| JP | 57-206238 A | 12/1982 |
| JP | 2010-066161 A | 3/2010 |
| JP | 2010-220389 A | 9/2010 |
| JP | 2012-016114 A | 1/2012 |
| JP | 2012-090474 A | 5/2012 |
| JP | 2017-022928 A | 1/2017 |
| KR | 2013-0103531 A | 9/2013 |
| TW | 201730865 | 9/2017 |
| WO | WO-2012/002570 | 1/2012 |
| WO | WO-2012/053643 | 4/2012 |

OTHER PUBLICATIONS

Written Opinion (Application No. PCT/IB2020/050244) dated Apr. 21, 2020.

* cited by examiner

50

4mm

SEMICONDUCTOR DEVICE AND OPERATING METHOD OF SEMICONDUCTOR DEVICE

TECHNICAL FIELD

One embodiment of the present invention relates to a semiconductor device and an operation method of the semiconductor device. One embodiment of the present invention relates to a battery control circuit, a battery protection circuit, a power storage device, and an electric device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specific examples of the technical field of one embodiment of the present invention disclosed in this specification include a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electric devices to automobiles. As the application range of batteries expands, the number of applications each with a multi-cell battery stack where a plurality of battery cells are connected in series increases.

The power storage device is provided with a circuit for detecting an abnormality at charging and discharging, such as overdischarging, overcharging, overcurrent, or a short circuit. In such a circuit performing protection and control of a battery, data of a voltage, a current, and the like is obtained in order to detect an abnormality at charging and discharging. Also in such a circuit, stop of charging and discharging, cell balancing, and the like are controlled on the basis of the observed data.

Patent Document 1 discloses a protection IC that functions as a battery protection circuit. The protection IC described in Patent Document 1 is disclosed to detect an abnormality in charging and discharging by comparing, using a plurality of comparators provided inside, a reference voltage and a voltage of a terminal to which a battery is connected.

Patent Document 2 discloses a battery state detector that detects a micro-short circuit of a secondary battery and a battery pack incorporating the detector.

Patent Document 3 discloses a protection semiconductor device for protecting an assembled battery in which secondary battery cells are connected in series.

REFERENCE

Patent Document

[Patent Document 1] Specification of United States Patent Application Publication No. 2011-267726
[Patent Document 2] Japanese Published Patent Application No. 2010-66161
[Patent Document 3] Japanese Published Patent Application No. 2010-220389

SUMMARY OF THE INVENTION

Problems to be Solved by the Invention

An object of one embodiment of the present invention is to provide a novel battery control circuit, a novel battery protection circuit, a power storage device, an electric device, and the like. Another object of one embodiment of the present invention is to provide a battery control circuit, a battery protection circuit, a power storage device, an electric device, and the like that have a novel structure and can have low power consumption.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the description listed above and/or the other objects.

Means for Solving the Problems

One embodiment of the present invention is an operating method of a semiconductor device including n cell balancing circuits, in which the n cell balancing circuits respectively correspond to one secondary battery; each of the n cell balancing circuits includes a transistor, a comparator circuit, and a capacitor; in each of the n cell balancing circuits, a channel formation region of the transistor includes a metal oxide containing indium; and in each of the n cell balancing circuits, an inverting input terminal of the comparator circuit and one electrode of the capacitor are electrically connected to one of a source and a drain of the transistor. The operating method includes a first step of supplying a ground potential to the other electrode of the capacitor; a second step of turning on the transistor; a third step of supplying a first potential to the one electrode of the capacitor; a fourth step of turning off the transistor; a fifth step of electrically connecting the other electrode of the capacitor and a negative electrode of the secondary battery corresponding to each cell balancing circuit; a sixth step of supplying a sum of the first potential and a potential of the negative electrode of the secondary battery corresponding to each cell balancing circuit, to the one electrode of the capacitor; and a seventh step of outputting a signal controlling charging of the secondary battery corresponding to each cell balancing circuit, from an output of the comparator circuit.

In the above structure, it is preferred that in each of the n cell balancing circuits, a positive electrode of the secondary battery corresponding to the cell balancing circuit be electrically connected to a non-inverting input terminal of the comparator circuit.

Another embodiment of the present invention is a semiconductor device including a first comparator circuit, a second comparator circuit, a third comparator circuit, a first transistor, a second transistor, a third transistor, a first capacitor, a second capacitor, a third capacitor, and a selector circuit. A first signal controlling charging of a secondary battery is output from an output terminal of the first comparator circuit. A second signal controlling charging of the secondary battery is output from an output terminal of the second comparator circuit. A third signal controlling discharging of the secondary battery is output from an output terminal of the third comparator circuit. One of a source and a drain of the first transistor, one of a source and a drain of the second transistor, and one of a source and a drain of the third transistor are electrically connected to each other. The other of the source and the drain of the first transistor is electrically connected to an inverting input terminal of the first comparator circuit and one electrode of the first capacitor. The other of the source and the drain of the second transistor is electrically connected to an inverting input terminal of the second comparator circuit and one electrode of the second capacitor. The other of the source and the drain of the third transistor is electrically connected to a non-inverting input terminal of the third comparator circuit and one electrode of the third capacitor. The selector circuit includes two input terminals and one output terminal. The output terminal of the selector circuit is electrically connected to the other electrode of the first capacitor, the other electrode of the second capacitor, and the other electrode of the third capacitor. One of the non-inverting input terminal and the inverting input terminal is electrically connected to a negative electrode of the secondary battery.

In the above structure, it is preferred that a non-inverting input terminal of the first comparator circuit, a non-inverting input terminal of the second comparator circuit, and an inverting input terminal of the third comparator circuit be electrically connected to a positive electrode of the secondary battery. Moreover, in the above structure, it is preferred that a channel formation region of each of the first transistor, the second transistor, and the third transistor include a metal oxide containing indium.

Another embodiment of the present invention is an operating method of a semiconductor device including a first comparator circuit, a second comparator circuit, a third comparator circuit, a first transistor, a second transistor, a third transistor, a first capacitor, a second capacitor, and a third capacitor, in which one of a source and a drain of the first transistor, one of a source and a drain of the second transistor, and one of a source and a drain of the third transistor are electrically connected to each other; the other of the source and the drain of the first transistor is electrically connected to an inverting input terminal of the first comparator circuit and one electrode of the first capacitor; the other of the source and the drain of the second transistor is electrically connected to an inverting input terminal of the second comparator circuit and one electrode of the second capacitor; and the other of the source and the drain of the third transistor is electrically connected to a non-inverting input terminal of the third comparator circuit and one electrode of the third capacitor. The operating method includes a first step of supplying a ground potential to the other electrode of the first capacitor, the other electrode of the second capacitor, and the other electrode of the third capacitor; a second step of turning on the first transistor, the second transistor, and the third transistor; a third step of supplying a first potential to the one electrode of the first capacitor; a fourth step of turning off the first transistor; a fifth step of supplying a second potential to the one electrode of the second capacitor; a sixth step of turning off the second transistor; a seventh step of supplying a third potential to the one electrode of the third capacitor; and an eighth step of turning off the third transistor.

In the above structure, it is preferred that after the third step, the other electrode of the first capacitor be electrically connected to a negative electrode of a secondary battery, a sum of the first potential and a potential of the negative electrode of the secondary battery be supplied to the one electrode of the first capacitor, and a signal controlling charging of the secondary battery be output from the first comparator circuit.

In the above structure, it is preferred that after the fifth step, the other electrode of the second capacitor be electrically connected to a negative electrode of a secondary battery, a sum of the second potential and a potential of the negative electrode of the secondary battery be supplied to the one electrode of the second capacitor, and a signal controlling discharging of the secondary battery be output from the second comparator circuit.

In the above structure, it is preferred that after the seventh step, the other electrode of the third capacitor be electrically connected to a negative electrode of a secondary battery, a sum of the third potential and a potential of the negative electrode of the secondary battery be supplied to the one electrode of the third capacitor, and a signal controlling discharging of the secondary battery be output from the third comparator circuit.

Effect of the Invention

One embodiment of the present invention can provide a novel battery control circuit, a novel battery protection circuit, a power storage device, an electric device, and the like. Another embodiment of the present invention can provide a battery control circuit, a battery protection circuit, a power storage device, an electric device, and the like that have a novel structure and can have low power consumption.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1:
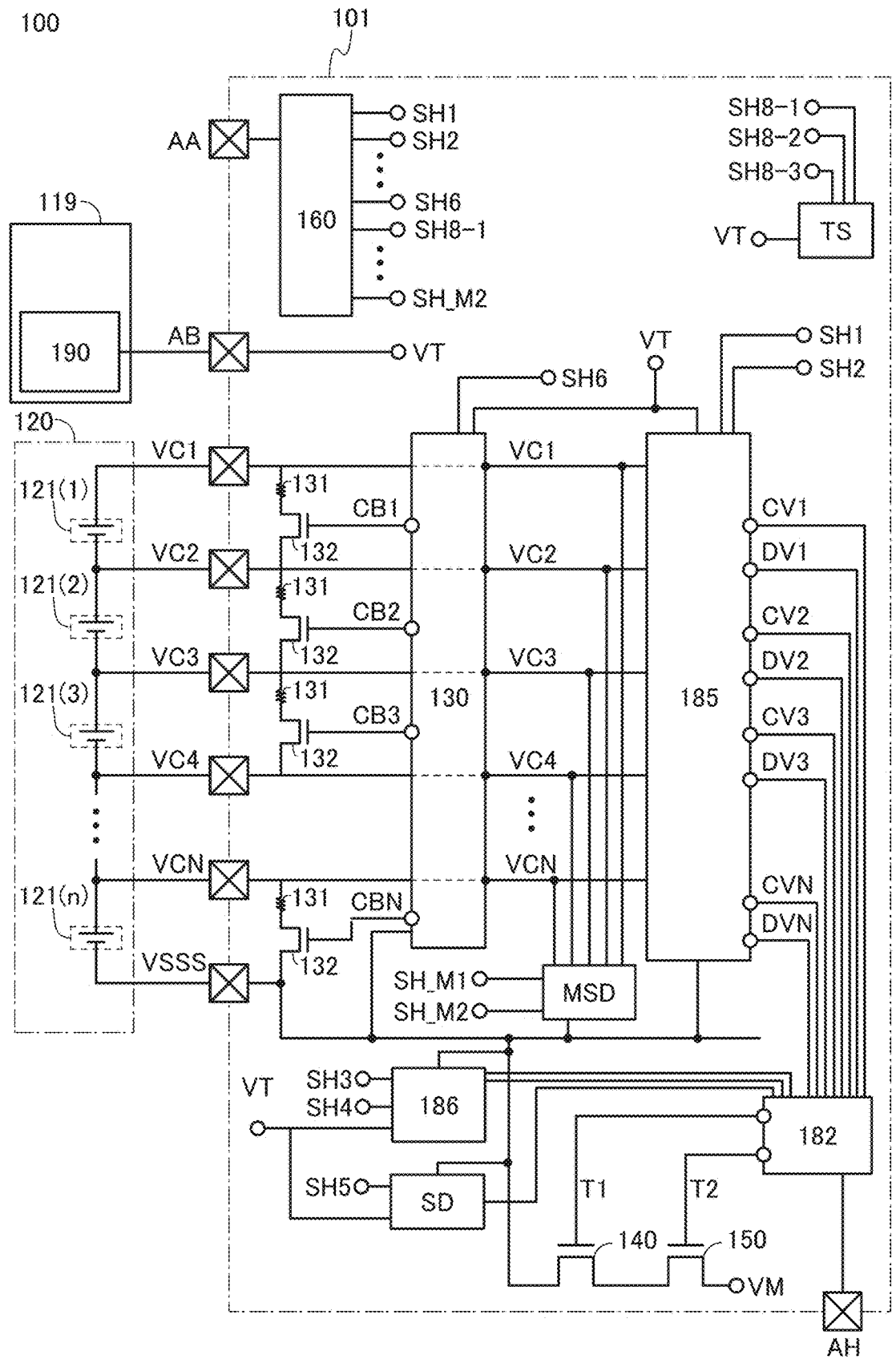
FIG. 1 is a block diagram illustrating one embodiment of the present invention.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. For example, in this specification and the like, a "first" component in one embodiment can be referred to as a "second" component in other embodiments or claims. Alternatively, for example, in this specification and the like, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

The position, size, range, and the like of each component illustrated in the drawings and the like are not accurately represented in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 800 and less than or equal to 100°, for example. Accordingly, the case where the angle is greater than or equal to 850 and less than or equal to 950 is also included.

In this specification and the like, the terms "identical", "same", "equal", "uniform", and the like used in describing calculation values and measurement values allow for a margin of error of ±20% unless otherwise specified.

In this specification, in the case where an etching treatment is performed after a resist mask is formed, the resist mask is removed after the etching treatment unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is the ground potential, VSS is a potential lower than the ground potential, and in the case where VSS is the ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

This embodiment will describe structures of a battery control circuit and a power storage device including the battery control circuit.

A battery control circuit of one embodiment of the present invention or a power storage device including the battery control circuit is called "BTOS" in some cases. "BTOS" can build a system with low power consumption in some cases. "BTOS" can build a system with a simple circuit in some cases.

The battery control circuit of one embodiment of the present invention has a function of controlling a battery. For example, the battery control circuit has a function of changing a condition for charging or discharging a battery. Examples of the condition include current density, upper voltage limit, lower voltage limit, and mode switching. Examples of the mode include a constant-current mode and a constant-voltage mode. Moreover, the battery control circuit of one embodiment of the present invention preferably has a function of protecting a battery. For example, the battery control circuit has a function of stopping charge or discharge of a battery. For example, the battery control circuit has a function of discharging a battery in response to detection of overcharge. For example, the battery control circuit has a function of detecting an abnormality of a battery and stopping the operation of the battery or changing the condition of the battery. Stopping the operation of a battery means stopping charge or stopping discharge, for example. Examples of an abnormality of a battery include overcharge, overdischarge, overcurrent at charging, overcurrent at discharging, a short circuit, a micro-short circuit that will be described later, and a deviation from a predetermined range of operating temperature. The battery control circuit of one embodiment of the present invention is sometimes referred to as a battery protection circuit.

Example 1 of Power Storage Device

FIG. 1 illustrates an example of a power storage device 100. The power storage device 100 illustrated in FIG. 1 includes a battery control circuit 101, a voltage generator circuit 119, and an assembled battery 120. The battery control circuit 101 preferably includes a circuit using a transistor containing an oxide semiconductor in a channel formation region (hereinafter referred to as an OS transistor).

The battery control circuit 101 includes a cell balancing circuit 130, a detection circuit 185, a detection circuit 186, a detection circuit MSD, a detection circuit SD, a temperature sensor TS, a decoder 160, and a logic circuit 182.

The battery control circuit 101 also includes a transistor 140 and a transistor 150. OS transistors can be used as the transistor 140 and the transistor 150.

OS transistors can be used as transistors included in the cell balancing circuit 130, the detection circuit 185, the detection circuit 186, the detection circuit MSD, the detection circuit SD, the temperature sensor TS, the decoder 160, and the logic circuit 182, which are included in the battery control circuit 101. These circuits may include an OS transistor and a Si transistor formed under the layer where the OS transistor is provided. Alternatively, these circuits may be formed using OS transistors, and in a layer thereunder, a circuit other than these circuits may be formed using Si transistors. Alternatively, a structure may be employed in which Si transistors are not provided in a layer under these circuits.

For example, the transistor included in the decoder 160 may be formed using an OS transistor, and in a layer thereunder, the transistor included in the voltage generator circuit 119 may be formed using a Si transistor.

When OS transistors that include one oxide semiconductor layer or a plurality of oxide semiconductor layers provided over one substrate as a channel formation region are used as the transistors included in the cell balancing circuit 130, the detection circuit 185, the detection circuit 186, the detection circuit MSD, the detection circuit SD, the temperature sensor TS, the decoder 160, and the logic circuit 182 and the transistor 140 and the transistor 150, which are included in the battery control circuit 101, the battery control circuit 101 can be provided over one substrate. In such a case, for example, a terminal AA, a terminal AB, and a terminal AH that will be described later are used to transmit and receive signals to/from circuits provided on a substrate different from the substrate where the battery control circuit 101 is provided, for instance, arithmetic circuits such as an MCU and an MPU.

The terminal AA, the terminal AB, and the terminal AH are sometimes referred to as "external terminals".

The assembled battery 120 includes a plurality of battery cells 121. FIG. 1 illustrates an example in which N battery cells 121 are included. A k-th battery cell (k is an integer greater than or equal to 1 and less than or equal to N) is represented by a battery cell 121(k) in some cases. The plurality of battery cells included in the assembled battery 120 are electrically connected in series.

Here, as the battery cell, a secondary battery shown in Embodiment described later can be used, for example. For example, a secondary battery including a wound battery element can be used. Furthermore, the battery cell preferably includes an exterior body. For example, a cylindrical exterior body, a rectangular exterior body, or the like can be used. As a material for the exterior body, a metal plate covered with an insulator, a metal film sandwiched between insulators, or the like can be used. The battery cell includes a set of positive and negative electrodes, for example. The battery cell may include a terminal electrically connected to the positive electrode and a terminal electrically connected to the negative electrode. In some cases, the battery cell includes some components of the battery control circuit of one embodiment of the present invention.

The cell balancing circuit 130 has a function of controlling charging of each battery cell 121 included in the assembled battery 120. The detection circuit 185 has a function of detecting overcharge and overdischarge of the assembled battery 120. The detection circuit 186 has a function of detecting discharge overcurrent and charge overcurrent of the assembled battery 120.

The detection circuit MSD has a function of detecting a micro-short circuit.

A micro-short circuit refers to a minute short circuit in a secondary battery, and is not a short circuit of a positive electrode and a negative electrode of a secondary battery which makes charging and discharging impossible but a phenomenon in which a short-circuit current flows through a minute short-circuit portion for a short period. A micro-short circuit is presumably caused in the following manner: a plurality of charges and discharges cause deterioration, a metal element such as lithium or cobalt is precipitated in the battery, the growth of the precipitate causes a local current concentration in part of a positive electrode and part of a negative electrode, and the function of a separator partially stops or a by-product is generated.

The detection circuit SD detects a short circuit of a group of circuits that are operated with the use of the assembled battery 120, for example. Moreover, the detection circuit SD detects a charge current and a discharge current of the assembled battery 120, for example.

The battery control circuit 101 includes a terminal VC1 to a terminal VCN that are electrically connected to the respective positive electrodes of the N battery cells 121 included in the assembled battery 120, and a terminal VSSS electrically connected to the negative electrode of the N-th battery cell 121.

The battery control circuit 101 includes a terminal group AA, a terminal group AB, and a terminal group AH. The terminal group AA, the terminal group AB, and the terminal group AH each include one terminal or a plurality of terminals.

The decoder 160 is supplied with digital signals corresponding to a predetermined bit count from the terminal group AA. The decoder 160 has a function of generating and outputting a signal supplied to a terminal SH6 included in the cell balancing circuit 130, signals supplied to a terminal SH1 and a terminal SH2 included in the detection circuit 185, signals supplied to a terminal SH3 and a terminal SH4 included in the detection circuit 186, a signal supplied to a terminal SH5 included in the detection circuit SD, and signals supplied to a terminal SH8-1, a terminal SH8-2, and a terminal SH8-3 included in the temperature sensor TS.

The voltage generator circuit 119 includes a digital-to-analog converter circuit 190. A potential generated in the voltage generator circuit 119 is converted into an analog signal by the digital-to-analog converter circuit 190, and then supplied to the terminal group AB, for example.

In the case where potentials supplied to each of the circuits included in the battery control circuit are different from each other or the case where a plurality of potentials are supplied to one circuit, the battery control circuit of one embodiment of the present invention can supply these potentials without having terminals corresponding to the number of required potentials. Thus, the number of terminals can be reduced. Specifically, for example, in the battery control circuit of one embodiment of the present invention, the number of terminals of the terminal group AB can be reduced when circuits such as of the cell balancing circuit 130 and the detection circuit 185 include OS transistors. For example, signals input from one terminal can be sequentially supplied to each of the circuits and retained by memory elements including the OS transistors. In the example illustrated in FIG. 1, one terminal (hereinafter a terminal VT) is electrically connected to the terminal group AB, and the terminal VT supplies analog signals to the cell balancing circuit 130, the detection circuit 185, the detection circuit 186, the detection circuit SD, and the temperature sensor TS.

Since signals supplied from the voltage generator circuit 119 are retained by the memory elements, power consumption of the voltage generator circuit 119 can be reduced when the voltage generator circuit 119 is powered off or set in a standby state after supplying signals to each of the circuits. For example, the voltage generator circuit can be power-gated.

Figure 2A:
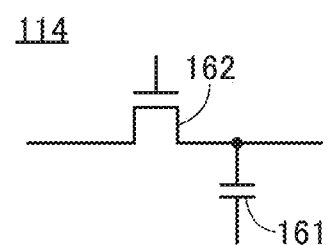
FIG. 2A is a circuit diagram illustrating one embodiment of the present invention.

The memory element can employ the structure of a memory element 114 illustrated in FIG. 2A. The memory element 114 illustrated in FIG. 2A includes a capacitor 161 and a transistor 162.

An OS transistor is preferably used as the transistor 162. In the structure of one embodiment of the present invention, with the use of the memory element 114 including the OS transistor, a desired voltage can be retained in the memory element by utilizing an extremely low leakage current flowing between a source and a drain when the transistor is off (hereinafter off-state current).

Figure 2B:
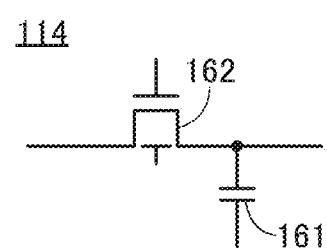
FIG. 2B is a circuit diagram illustrating one embodiment of the present invention.

FIG. 2B is different from FIG. 2A in that the transistor 162 included in the memory element 114 has a second gate. The second gate is sometimes referred to as a back gate or a bottom gate. The second gate included in the OS transistor will be described in detail in Embodiment below.

The terminal group AH preferably has a function of supplying a signal to the logic circuit 182 and a function of supplying a signal from the logic circuit 182 to a circuit provided outside the battery control circuit 101.

The logic circuit 182 has functions of controlling the transistor 140 and the transistor 150 in accordance with output signals from the detection circuit 185, the detection circuit 186, the detection circuit SD, the detection circuit MSD, and the temperature sensor TS. The logic circuit 182 may supply a signal to a charging circuit that is provided outside or inside the battery control circuit 101. In this case, the charging of a secondary battery is controlled in accordance with a signal supplied from the logic circuit 182 to the charging circuit, for example. Here, the charging circuit has a function of controlling the condition for charging a battery, for example. Alternatively, the charging circuit supplies a signal for controlling the condition for charging a battery to other circuits, such as the decoder 160, the cell balancing circuit, the overcharge detection circuit, the transistor 140, the transistor 150, and the circuit controlling the transistor 140 and the transistor 150, which are included in one embodiment of the present invention.

The transistor 140 and the transistor 150 have a function of controlling charge or discharge of the assembled battery 120. For example, a conducting state or a non-conducting state of the transistor 140 is controlled by a control signal T1 supplied from the logic circuit 182, so that whether the assembled battery 120 is charged or not is controlled. A conducting state or a non-conducting state of the transistor 150 is controlled by a control signal T2 supplied from the logic circuit 182, so that whether the assembled battery 120 is discharged or not is controlled. In the example illustrated in FIG. 1, one of a source and a drain of the transistor 140 is electrically connected to the terminal VSSS. The other of the source and the drain the transistor 140 is electrically connected to one of a source and a drain of the transistor 150. The other of the source and the drain of the transistor 150 is electrically connected to a terminal VM. The terminal VM is electrically connected to a negative electrode of a charger, for example. The terminal VM is electrically connected to a load at the time of discharge, for example.

The battery control circuit 101 may have a function of observing a voltage value (a monitor voltage) of each of terminals of the battery cells 121 included in the assembled battery 120 and a current value (a monitor current) flowing through the assembled battery. For example, the on-state current of the transistor 140 or the transistor 150 may be observed as the monitor current. Alternatively, a resistor may be provided in series with the transistor 140 or the like, and the current value of the resistor may be observed.

The battery control circuit 101 may have functions of measuring the temperature of the battery cell 121 and controlling charge and discharge of the battery cell in accordance with the measured temperature. For example, the resistance of a secondary battery may increase at low temperatures; thus, the charge current density and discharge current density are reduced in some cases. The resistance of a secondary battery may decrease at high temperatures; hence, the discharge current density is increased in some cases. When the increase in charge current at high temperatures causes a concern for deterioration of secondary battery characteristics, the charge current is controlled to be a current with which deterioration is suppressed, for example. Data on the charging condition, the discharging condition, and the like is preferably stored in a memory circuit or the like included in the battery control circuit 101 of one embodiment of the present invention. The temperature of the battery control circuit 101 or the assembled battery 120 is sometimes increased by charging. In such a case, charging is preferably controlled in accordance with the measured temperature. For example, the charge current is decreased along with the temperature increase.

One cell balancing circuit 130 and one detection circuit 185 of one embodiment of the present invention are preferably provided for each of the plurality of battery cells 121 included in the assembled battery 120.

Components of the cell balancing circuit 130 and the detection circuit 185 are described with reference to FIG. 3A. For simplicity, FIG. 3A illustrates the cell balancing circuit 130 and the detection circuit 185 that correspond to one battery cell 121.

Figure 3A:
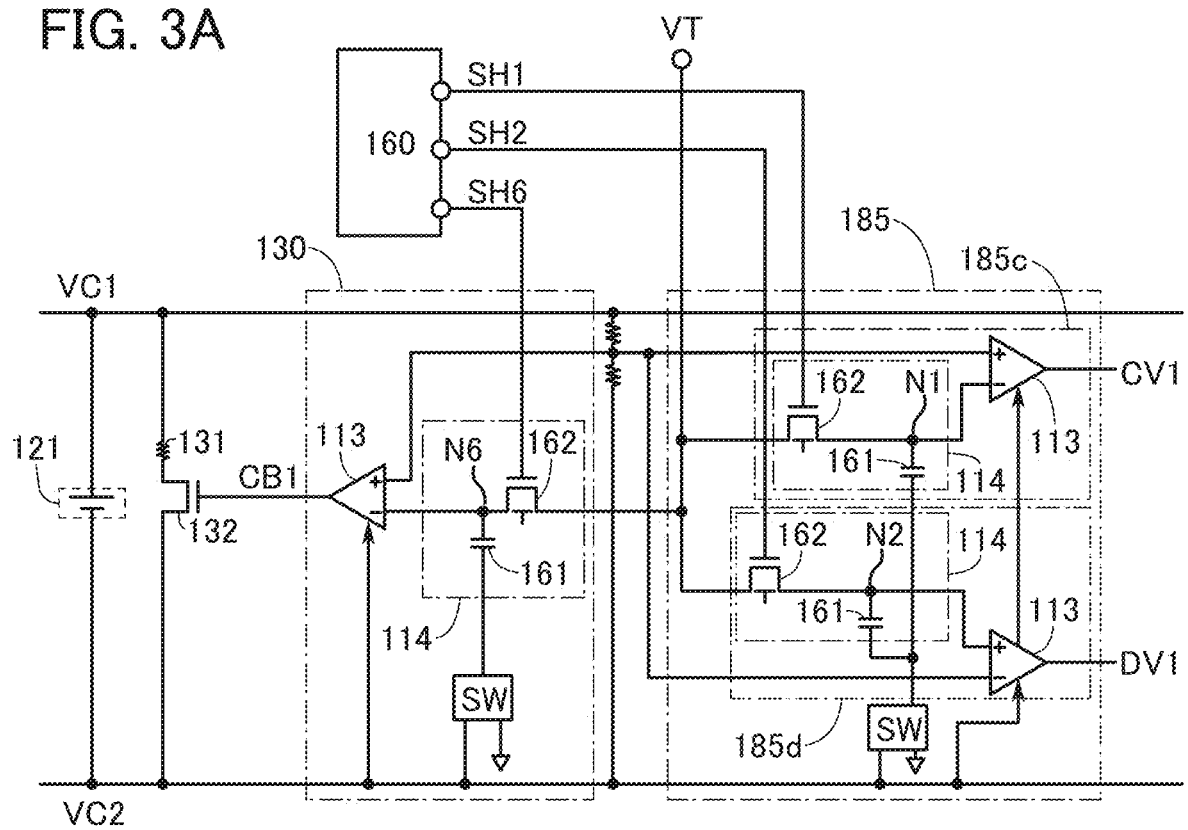
FIG. 3A is a block diagram illustrating one embodiment of the present invention.

FIG. 3A illustrates an example where the cell balancing circuit 130 and the detection circuit 185 are connected to one battery cell 121. The detection circuit 185 includes a circuit 185*c* and a circuit 185*d*. The detection circuit 185 has a function of detecting overcharge, and the detection circuit 186 has a function of detecting overdischarge.

In FIG. 3A, a transistor 132 and a resistor 131 are connected in series, one of a source and a drain of the transistor 132 is electrically connected to the negative electrode of the battery cell 121, and the other thereof is electrically connected to one electrode of the resistor. The other electrode of the resistor is electrically connected to the positive electrode of the secondary battery.

Here, one of the source and the drain of the transistor 132 may be electrically connected to the positive electrode of the battery cell 121, the other thereof may be electrically connected to one electrode of the resistor 131, and the other electrode of the resistor 131 may be electrically connected to the negative electrode of the battery cell 121.

In FIG. 3A, the cell balancing circuit 130 and the detection circuit 185 each include a switch SW. Each switch SW is electrically connected to a terminal VC2 and a terminal supplied with a ground potential, and has a function of supplying the potential of either terminal to one electrode of the capacitor 161.

Figure 3B:
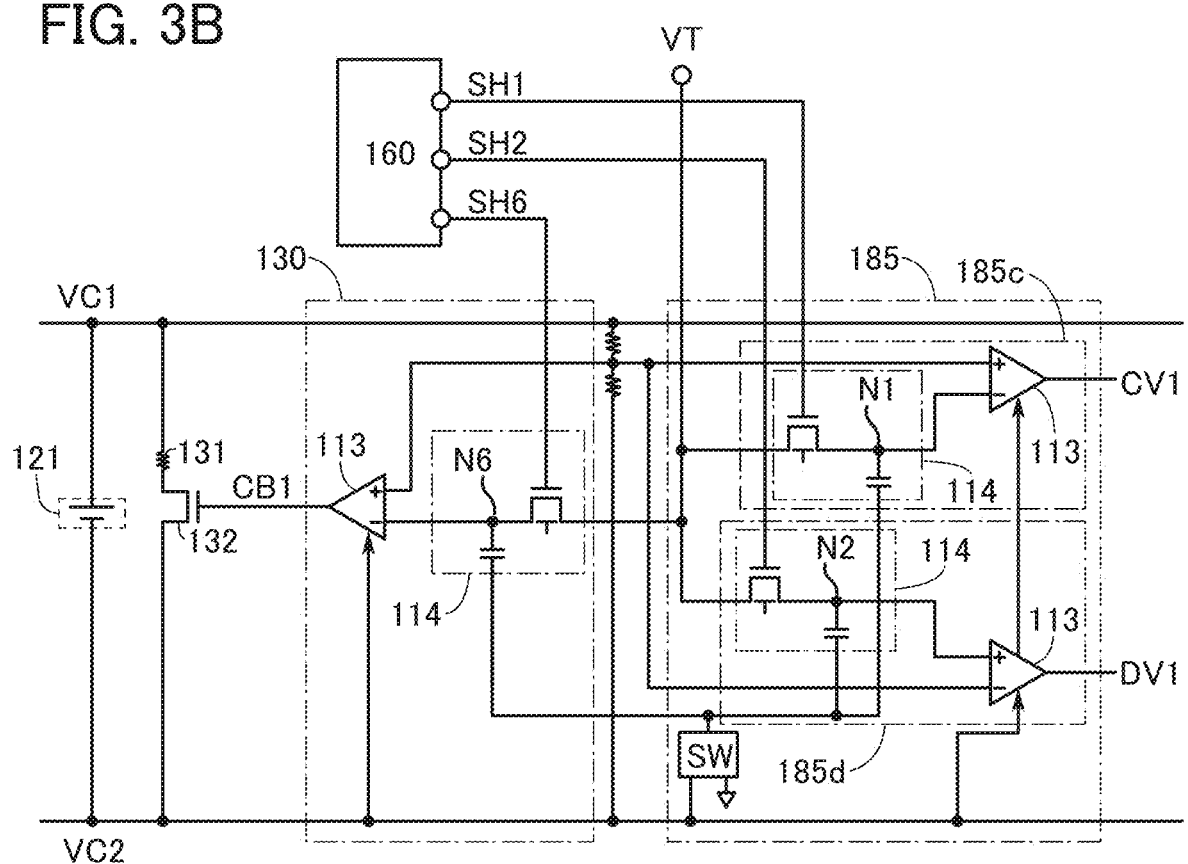
FIG. 3B is a block diagram illustrating one embodiment of the present invention.

As illustrated in FIG. 3B, the cell balancing circuit 130 and the detection circuit 185 may have a common switch SW.

In FIG. 3A, the cell balancing circuit 130, the circuit 185*c*, and the circuit 185*d* each include a comparator 113 and the memory element 114. The memory element 114 includes the capacitor 161 and the transistor 162. A common terminal, here the terminal VT, is electrically connected to one of the source and the drain of the transistor 162 included in each of the cell balancing circuit 130, the circuit 185*c*, and the circuit 185*d*. To the other of the source and the drain of each transistor 162, the other electrode of the capacitor 161 and one of a non-inverting input terminal and an inverting input terminal of the comparator 113 that are included in the corresponding circuit are electrically connected.

In FIG. 3A, the cell balancing circuit 130 is electrically connected to the positive electrode and the negative electrode of the battery cell 121. The positive electrode of the battery cell 121 is electrically connected to the terminal VC1, and the negative electrode is electrically connected to the terminal VC2. In the cell balancing circuit 130, the inverting input terminal of the comparator 113 is electrically connected to the other of the source and the drain of the transistor 162, and the terminal SH6 is electrically connected to a gate of the transistor 162. In the cell balancing circuit 130, the non-inverting input terminal of the comparator 113 is preferably electrically connected to the terminal VC1. Alternatively, as illustrated in FIG. 3A, the non-inverting input terminal of the comparator 113 may be supplied with a voltage that is divided by resistors between the terminal VC1 and the terminal VC2. In the cell balancing circuit 130, a node connected to the other of the source and the drain of the transistor 162 is referred to as a node N6.

In FIG. 3A, the detection circuit 185 is electrically connected to the positive electrode and the negative electrode of the battery cell 121. In the circuit 185*c*, the inverting input terminal of the comparator is electrically connected to the other of the source and the drain of the transistor 162, and the terminal SH1 is electrically connected to the gate of the transistor 162. In the circuit 185*c*, the non-inverting input terminal of the comparator 113 is preferably electrically connected to the terminal VC1. Alternatively, as illustrated in FIG. 3A, the non-inverting input terminal of the comparator 113 may be supplied with a voltage that is divided by the resistors between the terminal VC1 and the terminal VC2. In the circuit 185*c*, a node connected to the other of the source and the drain of the transistor 162 is referred to as a node N1.

In the circuit 185*d*, the non-inverting input terminal of the comparator is electrically connected to the other of the source and the drain of the transistor 162, and the terminal SH2 is electrically connected to the gate of the transistor 162. In the circuit 185*d*, the inverting input terminal of the comparator 113 is preferably electrically connected to the terminal VC1. Alternatively, as illustrated in FIG. 3, the inverting input terminal of the comparator 113 may be supplied with a voltage that is divided by the resistors between the terminal VC1 and the terminal VC2. In the circuit 185*d*, a node connected to the other of the source and the drain of the transistor 162 is referred to as a node N2.

In the cell balancing circuit 130 and the detection circuit 185, a potential is retained at the node to which the other electrode of the capacitor 161 included in each circuit is connected (here, the node N6, the node N1, and the node N2) by turning off the transistor 162.

The terminal VT supplies analog signals sequentially to the cell balancing circuit 130, the circuit 185*c*, and the circuit 185*d*. Analog signals are sequentially supplied to the node N6, the node N1, and the node N2 and retained. After an analog signal is supplied to the first node, the transistor 162 connected to the node is turned off, whereby the potential of the first node is retained. After that, a potential is supplied to the second node and retained, and then a potential of the third node is supplied and retained. The on/off state of the transistor 162 is controlled by a signal output from the decoder 160 (here, signals supplied to the terminal SH1, the terminal SH2, and the terminal SH6).

Then, while the potential is retained at the node, the potential supplied to the one electrode of the capacitor 161 is changed from the ground potential to the potential of the terminal VC2 by switching the switch SW, and the potential retained at each of the node N6, the node N1, and the node N2 can be changed with capacitive coupling by a difference between the terminal VC2 and the ground potential.

In this manner, the cell balancing circuit 130 and the detection circuit 185 can retain the sum of the potential supplied from the terminal VT and the potential of the terminal VC2 at the node N6, the node N1, and the node N2. Since the terminal VC2 has the negative electrode potential of the battery cell 121, the sum of the potential supplied from the terminal VT and the potential of the negative electrode of the battery cell 121 can be retained at the node N6, the node N1, and the node N2.

Figure 4:
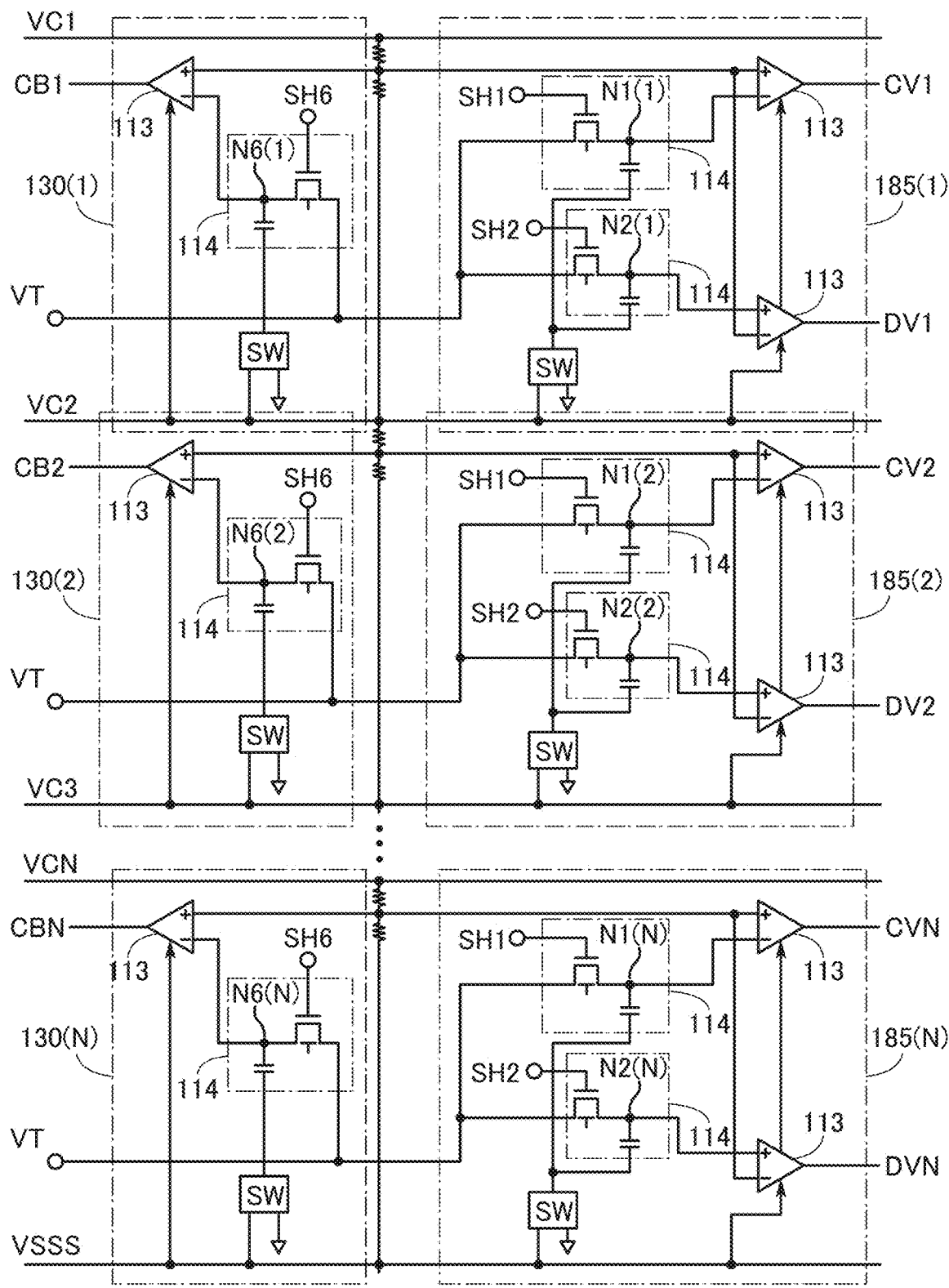
FIG. 4 is a block diagram illustrating one embodiment of the present invention.

FIG. 4 illustrates an example where the cell balancing circuit 130 and the detection circuit 185 illustrated in FIG.

3A are provided for one battery cell 121 included in the assembled battery 120. The assembled battery 120 includes N battery cells 121. The k-th battery cell 121 (k is an integer greater than or equal to 1 and less than or equal to N) is represented by the battery cell 121(k). The cell balancing circuit 130 connected to the battery cell 121(k) is represented by a cell balancing circuit 130(k), and the detection circuit 185 connected to the battery cell 121(k) is represented by a detection circuit 185(k). Hereinafter, a cell balancing circuit 130(1) to a cell balancing circuit 130(N) are each referred to as the cell balancing circuit 130. A detection circuit 185(1) to a detection circuit 185(N) are each referred to as the detection circuit 185.

The cell balancing circuits 130 and the detection circuits 185 to which the plurality of battery cells 121 are connected have a function of individually controlling a difference in voltage between both ends (a voltage difference between the positive electrode and the negative electrode) of the corresponding battery cell 121.

The cell balancing circuit 130 for each battery cell 121 can make the memory element 114 retain a preferable value as a first upper limit voltage of the positive electrode.

The node N6 included in the cell balancing circuit 130(k) is referred to as a node N6(k). The potential of the negative electrode of the battery cell (k) is electrically connected to the switch SW included in the cell balancing circuit 130(k). In other words, the switch SW included in each cell balancing circuit 130 is supplied with the potential corresponding to the negative electrode of the corresponding battery cell. The sum of the potential supplied from the terminal VT and the potential of the negative electrode of the battery cell 121(k) can be retained at the node N6(k).

In this manner, a potential that uses the common potential supplied from the terminal VT on the basis of the negative electrode of the corresponding battery cell can be supplied to each cell balancing circuit; hence, the common terminal can be used for the N battery cells. Thus, the number of terminals can be reduced.

The cell balancing circuit 130 controls whether the transistor 132 is turned on or turned off in accordance with the relation between the voltage of the positive electrode of the battery cell 121 and the voltage of the non-inverting input terminal of the comparator 113. The control of the transistor 132 can adjust the ratio between the amount of current flowing through the resistor 131 and the amount of current flowing through the battery cell 121. For example, to stop charging of the battery cell 121, a current is made to flow through the resistor 131 and a current flowing through the battery cell 121 is limited.

In FIG. 1, the plurality of battery cells 121 are electrically connected in series between a terminal VDDD and the terminal VSSS. By making a current flow between the terminal VDDD and the terminal VSSS, the plurality of battery cells 121 are charged.

The case where the positive electrode of one battery cell 121 among the plurality of battery cells 121 reaches a certain voltage and the current is limited is considered. In such a case, a current flows through the transistor 132 and the resistor 131 that are connected in parallel to the battery cell, whereby charge of the other battery cells 121 whose positive electrodes do not reach the certain voltage can be continued without interruption of a current path between the terminal VDDD and the terminal VSSS. In other words, in the battery cell 121 where the charge is completed, the charge is stopped by turning on the transistor 132; whereas in the battery cell 121 where the charge is not completed, the transistor 132 is turned off and the charge is continued.

In the case where the battery cells 121 have different resistances, for example, charge of a low-resistance battery cell 121 may be completed first, and charge of a battery cell 121 that has higher resistance than the low-resistance battery cell 121 may be insufficient. Here, insufficient charge means, for example, that the voltage difference between the positive electrode and the negative electrode is lower than a desired voltage. With the use of the cell balancing circuit 130, the voltage of the positive electrode of the battery cell 121 during charge can be controlled on the basis of the voltage of the negative electrode of the battery cell.

The cell balancing circuit of one embodiment of the present invention can control a charge voltage, a charge capacity, and the like of one battery cell or a plurality of battery cells without using a circuit provided outside the battery control circuit 101, for example, an arithmetic circuit such as an MPU or an MCU.

In other words, the use of the N cell balancing circuits 130 can reduce variations of states of the plurality of battery cells 121 after being charged, for example, when being fully charged. Thus, the capacity of the assembled battery 120 as a whole is increased in some cases. The increase in capacity can sometimes reduce the number of charge and discharge cycles of the battery cells 121, which may increase the durability of the assembled battery 120.

The circuit 185c for each battery cell 121 enables the memory element 114 to retain a second upper limit voltage of the positive electrode in charging of the battery cell 121. The second upper limit voltage is sometimes referred to as an overcharge voltage. The circuit 185d enables the memory element 114 to retain a lower limit voltage of the positive electrode in discharging. The lower limit voltage is sometimes referred to as an overdischarge voltage.

Note that the comparator included in the detection circuit 185 may be what is called a hysteresis comparator whose threshold is different between when the output is changed from the L level to the H level and when the output is changed from the H level to the L level. The memory element connected to a reference potential input portion of the hysteresis comparator preferably has a function of retaining two thresholds.

The node N1 and the node N2 included in the detection circuit 185(k) are referred to as a node N1(k) and a node N2(k). The potential of the negative electrode of the battery cell (k) is electrically connected to the switch SW included in the detection circuit 185(k). In other words, the switch SW included in each detection circuit 185 is supplied with the potential corresponding to the negative electrode of the corresponding battery cell. The sum of the potential supplied from the terminal VT and the potential of the negative electrode of the battery cell 121(k) can be retained at the node N1(k). The sum of the potential supplied from the terminal VT and the potential of the negative electrode of the battery cell 121(k) can be retained at the node N2(k).

In this manner, a potential that uses the common potential supplied from the terminal VT on the basis of the negative electrode of the corresponding battery cell can be supplied to each detection circuit; hence, the common terminal can be used for the N battery cells. Thus, the number of terminals can be reduced.

The detection circuit 185 can detect overcharge and overdischarge of one battery cell or a plurality of battery cells and protect the battery cell without using a circuit provided outside the battery control circuit 101, for example, an arithmetic circuit such as an MPU or an MCU. When a voltage decrease due to overdischarge is detected, the control circuit of one embodiment of the present invention interrupts a discharge current and prevents a voltage decrease. When interrupt of the discharge current is not sufficient, a leakage current might be generated and a voltage decrease might occur. The circuit configuration using power gating may inhibit a leakage current. Moreover, the circuit configuration using OS transistors may inhibit a leakage current.

The upper limit voltage of a battery cell is controlled by the cell balancing circuit connected to the battery cell and the circuit for detecting overcharge. An upper limit voltage detected by the cell balancing circuit is, for example, lower than an upper limit voltage detected by the circuit for detecting overcharge. Thus, in the process of charging, in a first step, the cell balancing circuit senses that the battery cell reaches the upper limit voltage, and changes the charging condition. Here, the charge current density is decreased, for example. Alternatively, discharging may be started. After that, owing to the increase in the charge voltage of the battery cell, when the circuit for detecting overcharge senses that the battery cell reaches the upper limit voltage, the charging condition of the battery cell is changed in a second step. Here, charging is stopped and discharging is started, for example.

<Operation Example of Power Storage Device>

Figure 26:
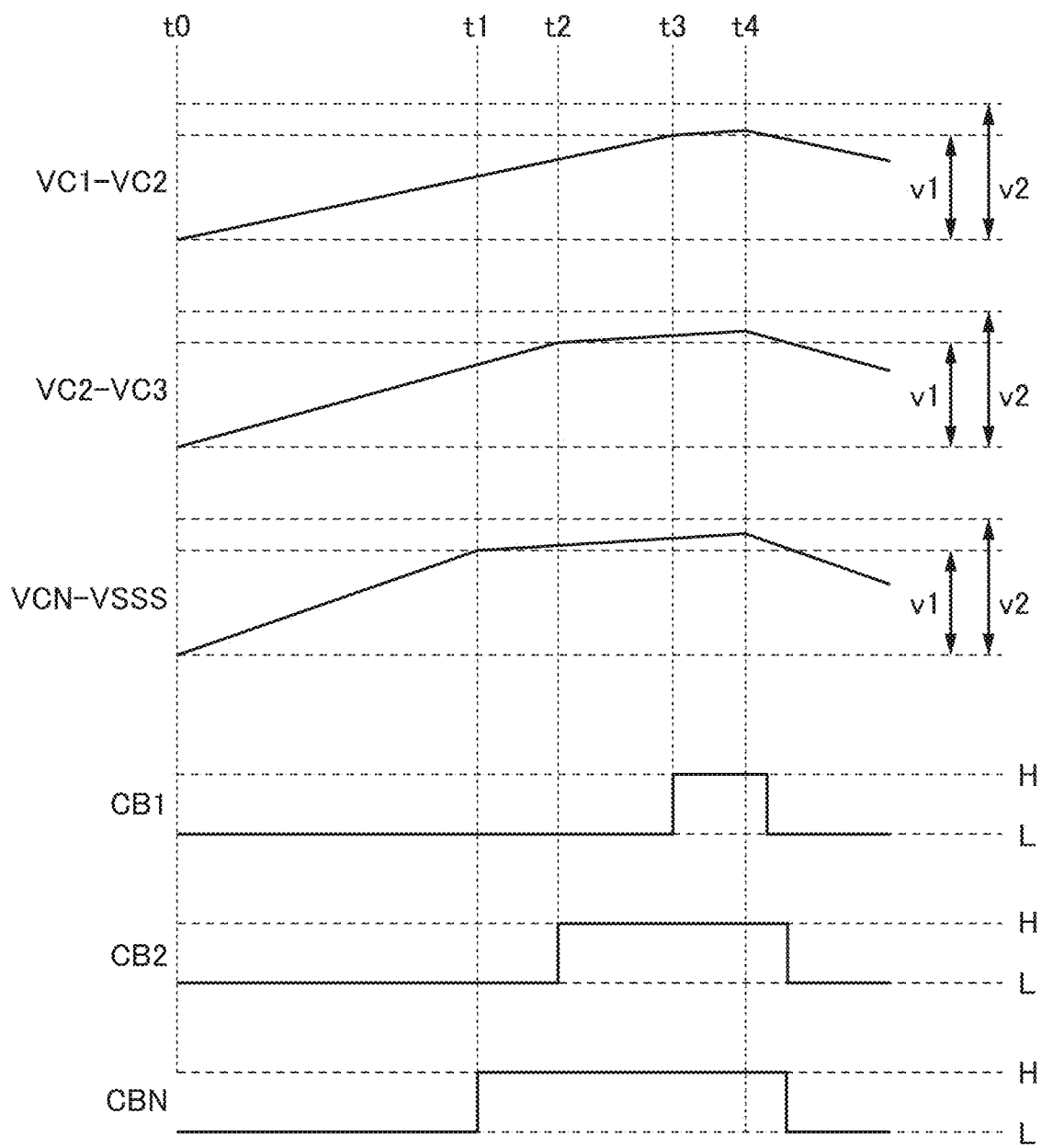
FIG. 26 shows an operation example of a power storage device of one embodiment of the present invention.

A timing chart in FIG. 26 shows an operation example of the power storage device of one embodiment of the present invention. In the example shown in FIG. 26, when a voltage VC1-VC2, a voltage VC2-VC3, and a voltage VCN-VSSS that are potential differences between the positive electrode and the negative electrode of the battery cell 121(1), the battery cell 121(2), and the battery cell 121(n), respectively, exceed a voltage v1, the cell balancing circuit 130 outputs high-potential signals from a terminal CB1, a terminal CB2, and a terminal CBN that are output terminals of the comparators corresponding to the battery cells.

In the timing chart in FIG. 26, first, in a period from Time t0 to Time t1, the assembled battery 120 is charged.

Next, at Time t1, the voltage VCN-VSSS exceeds the voltage v1, and a high-potential signal is output from the terminal CBN; the high-potential signal is supplied to the gate of the transistor 132 connected in parallel to the battery cell 121(n); a current flows through the transistor 132; and the amount of current flowing through the battery cell 121(n) decreases or almost no current flows through the battery cell 121(n).

Then, at Time t2, the voltage (VC2-VC3) exceeds the voltage v1 and a high-potential signal is output from the terminal CB2, and the amount of current flowing through the battery cell 121(2) decreases or almost no current flows through the battery cell 121(2).

Next, at Time t3, the voltage (VC1-VC2) exceeds the voltage v1 and a high-potential signal is output from the terminal CB1, and the amount of current flowing through the battery cell 121(1) decreases or almost no current flows through the battery cell 121(1).

At Time t4, discharge of the assembled battery 120 starts, and the voltage (VC1-VC2), the voltage (VC2-VC3), and the voltage (VCN-VSSS) decrease. With the voltage (VC1-VC2), the voltage (VC2-VC3), and the voltage (VCN-VSSS) being lower than the voltage v1, low-potential signals are output from the terminals CB1, CB2, and CBN.

In the period from Time t1 to Time t4, when any of the voltage (VC1-VC2), the voltage (VC2-VC3), and the voltage (VCN-VSSS) exceeds a voltage v2, the circuit 185c detects overcharge, and charging is stopped by supplying a high-potential signal to a gate of the transistor 140, for example.

Here, the value input to the comparator 113 may be a value obtained by dividing a voltage of the difference between the positive electrode and the negative electrode of the battery cell by the resistors. In that case, the upper limit voltage of the cell balancing circuit and the upper limit voltage of the overcharge detection circuit can also be values obtained by dividing the voltage v1 and the voltage v2 by the resistors.

<Operation Results of Comparator>

The comparator 113 having an inverting input terminal to which the memory element 114 using an OS transistor was connected was prepared and its operation was examined.

Voltages under three conditions were sequentially applied to the non-inverting input terminal and the inverting input terminal of the comparator 113, and the operation was examined. In the first condition, the voltage of the non-inverting input terminal is denoted by a voltage Va, and a voltage obtained at the output terminal is denoted by Voa. In the second condition, the voltage of the non-inverting input terminal is denoted by a voltage Vb, and a voltage obtained at the output terminal is denoted by Vob. In the third condition, the voltage of the non-inverting input terminal is denoted by a voltage Vc, and a voltage obtained at the output terminal is denoted by Voc.

As the voltage Va, the voltage Vb, and the voltage Vc, a value obtained by reducing the voltage (VC1-VC2) to ¼ by resistance division, a value obtained by reducing (the voltage VC1-VC2) to ¼ by resistance division, and a value obtained by reducing (the voltage VCN-VSSS) to ¼ by resistance division were assumed and input.

The inverting input terminal was supplied with voltages obtained by reducing 4.2 V to ¼ in the first condition, the second condition, and the third condition, and the values were retained by the memory element 114. Here, 4.2 V is assumed to be a value obtained by adding 2.2 V as a predetermined potential difference detected by the cell balancing circuit, to a negative electrode potential of 2 V, for example. That is, the voltage v1 shown in FIG. 26 was assumed to be 4.2 V.

Note that in this verification, control using the transistor 132 after each comparator supplied a high-potential signal was not examined.

Figure 27A:
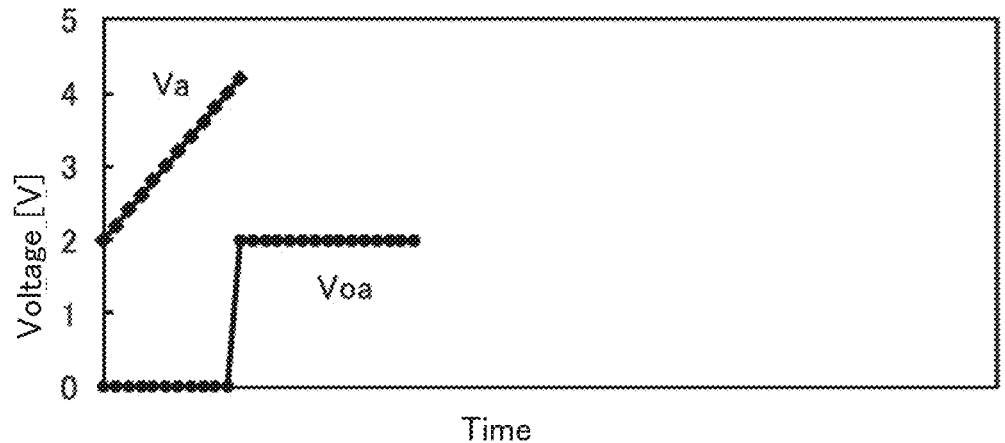
FIG. 27A, FIG. 27B, and FIG. 27C show operation results of a comparator.
Figure 27B:
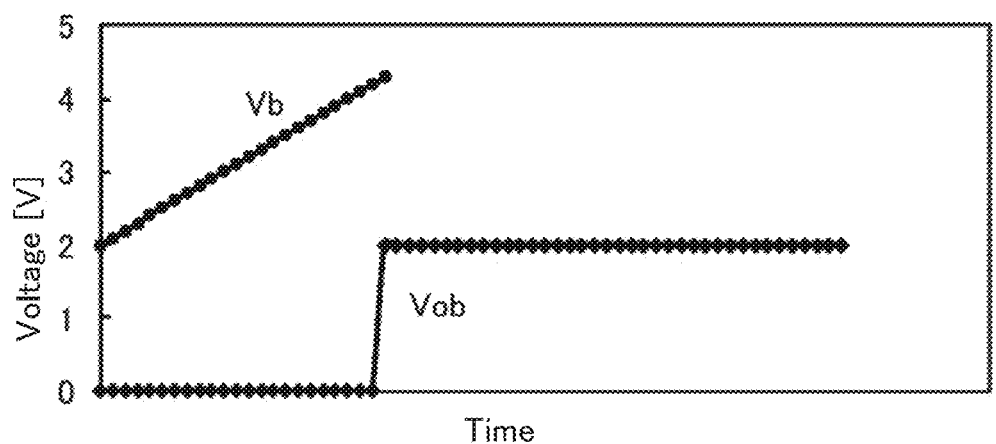
Figure 27C:
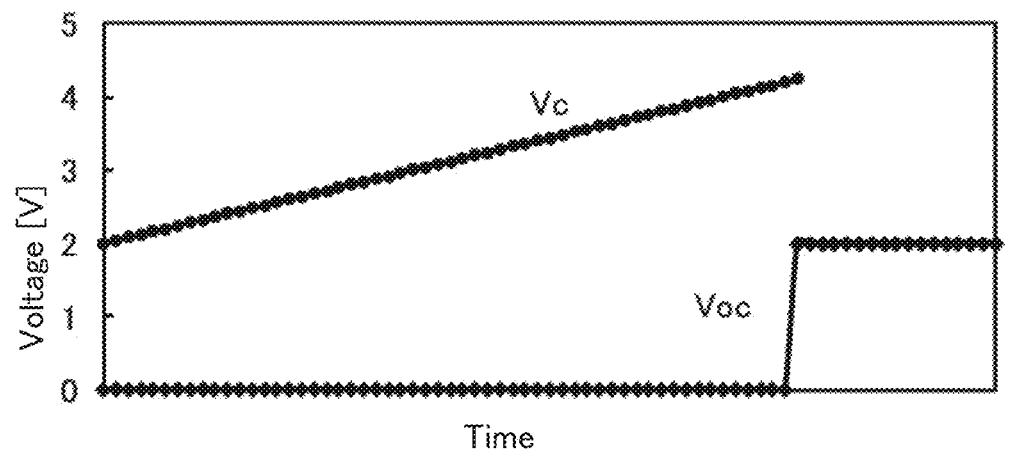

FIG. 27A shows the input voltage Va and the output voltage Voa as a result of applying the first condition to the comparator; FIG. 27B shows the input voltage Vb and the output voltage Vob as a result of applying the second condition to the comparator; and FIG. 27C shows the input voltage Vc and the output voltage Voc as a result of applying the third condition to the comparator. It was confirmed that when the input voltage exceeds the value stored at the inverting input terminal, a high-potential signal is output from each comparator.

<Other Components of Power Storage Device>

Examples of other components of the power storage device of one embodiment of the present invention will be described below.

Figure 5A:
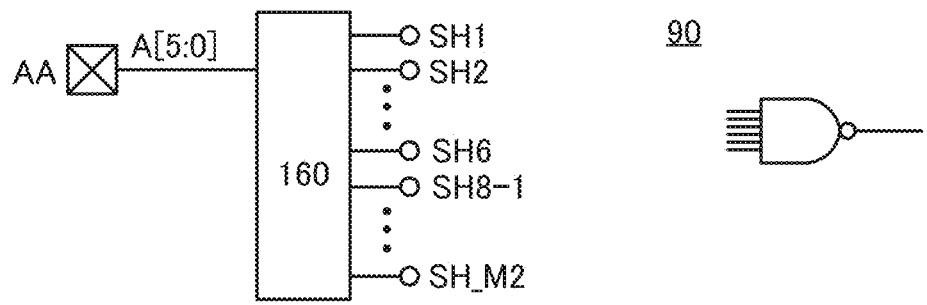
FIG. 5A is a block diagram illustrating operation of a power storage device of one embodiment of the present invention.
Figure 5B:
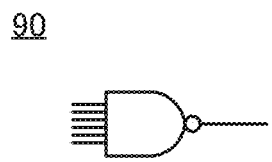
FIG. 5B is a circuit diagram illustrating one embodiment of the present invention.
Figure 5C:
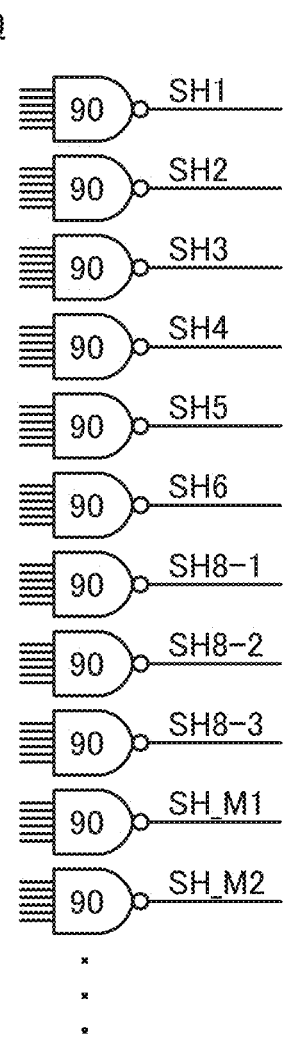
FIG. 5C is a circuit diagram illustrating one embodiment of the present invention.
Figure 5D:
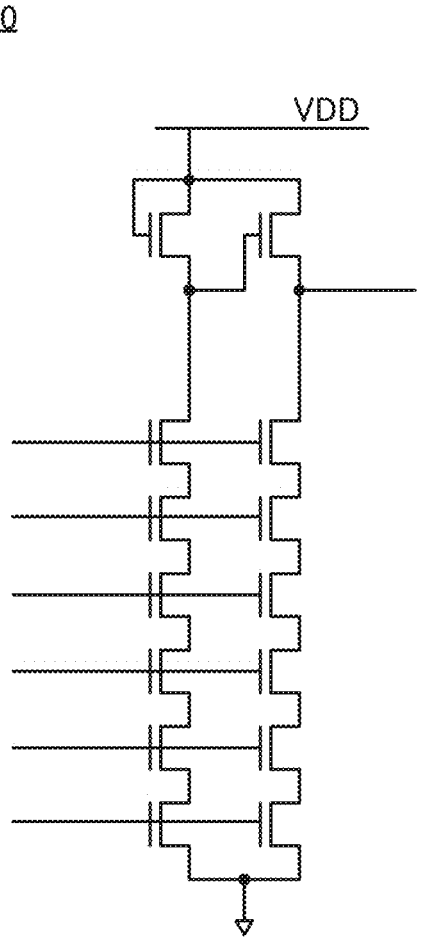
FIG. 5D is a circuit diagram illustrating one embodiment of the present invention.

FIG. 5A illustrates an example where a 6-bit signal is supplied from the terminal AA to the decoder 160. FIG. 5A merely shows one example, and there is no limitation on the bit count of signals supplied from the terminal AA to the decoder 160. FIG. 5B shows a circuit symbol of a NAND circuit 90. As illustrated in FIG. 5C, the decoder 160 can be configured using a plurality of NAND circuits 90. FIG. 5D illustrates a specific example of the NAND circuit 90. Here, a high power supply potential is supplied to a wiring VDD, for example.

Figure 6:
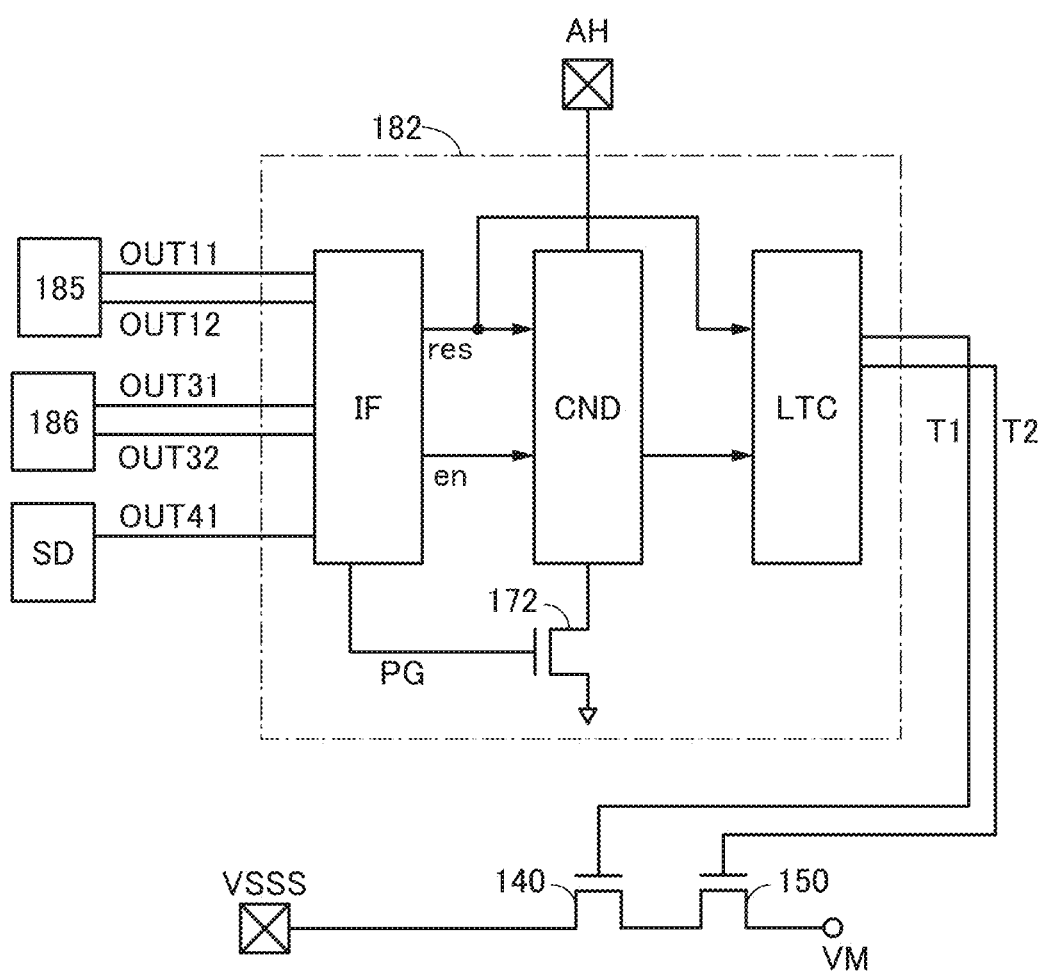
FIG. 6 is a block diagram illustrating one embodiment of the present invention.

FIG. 6 illustrates an example of the logic circuit 182. The logic circuit 182 illustrated in FIG. 6 includes an interface circuit IF, a counter circuit CND, a latch circuit LTC, and a transistor 172. An OS transistor is preferably used as the transistor 172.

The interface circuit IF is supplied with signals from an output terminal OUT11 and an output terminal OUT12 of the detection circuit 185, signals from an output terminal OUT31 and an output terminal OUT32 of the detection circuit 186, and a signal from an output terminal OUT41 of the detection circuit SD. The output terminal OUT11 supplies a signal corresponding to overcharge, for example. The output terminal OUT12 supplies a signal corresponding to overdischarge, for example. The output terminal OUT31 supplies a signal corresponding to overcurrent at charging, for example. The output terminal OUT32 supplies a signal corresponding to overcurrent at discharging, for example.

The interface circuit IF supplies a signal PG to a gate of the transistor 172 when detecting an abnormality detection signal, for example, a signal corresponding to at least one of overcharge, overdischarge, and overcurrent.

The transistor 172 is connected to the counter circuit.

The counter circuit operates a counter and a delay circuit when the signal PG is a signal for turning on the transistor 172, specifically, when a high-potential signal is output, for example. Meanwhile, the operation of the counter circuit CND can be stopped or the counter circuit CND can be set in a standby state when the signal PG is a signal for turning off the transistor 172, specifically, when a low-potential signal is output, for example. A signal res is supplied from the interface circuit IF to the counter circuit CND and the latch circuit LTC. The signal res is a reset signal. The counter circuit CND is supplied with the signal res and starts counting. A signal en is an enable signal. The counter circuit CND starts operating or stops operating according to the signal en.

When an abnormality detection signal is supplied to the interface circuit IF, the counter circuit CND counts for a predetermined period, and then a signal corresponding to the detected abnormality is supplied to the latch circuit LTC through the counter circuit CND.

The latch circuit LTC supplies the gate of the transistor 140 or the transistor 150 with a signal for turning off the transistor in accordance with the detected abnormality.

Figure 7A:
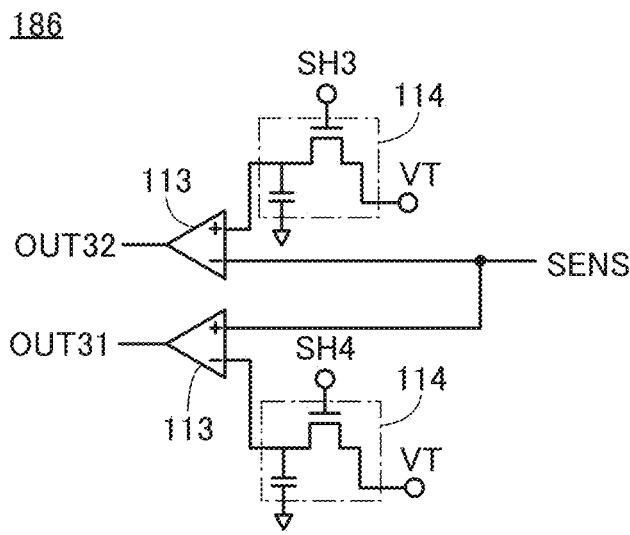
FIG. 7A is a circuit diagram illustrating one embodiment of the present invention.

FIG. 7A illustrates an example of a circuit diagram of the detection circuit 186. The detection circuit 186 includes two comparators 113.

The memory element 114 in which a voltage corresponding to discharge overcurrent detection is retained is electrically connected to the non-inverting input terminal of one of the comparators 113. The terminal SH3 is electrically connected to the gate of the transistor included in the memory element 114. A terminal SENS is electrically connected to the inverting input terminal. When an overcurrent is detected from the voltage applied to the inverting input terminal, an output from the output terminal OUT32 is inverted.

The terminal SENS is electrically connected to the non-inverting input terminal of the other comparator 113. The memory element 114 associated with charge overcurrent detection is electrically connected to the inverting input terminal. The terminal SH4 is electrically connected to the gate of the transistor included in the memory element 114. When an overcurrent is detected from the voltage applied to the non-inverting input terminal, an output from the output terminal OUT31 is inverted.

Figure 7B:
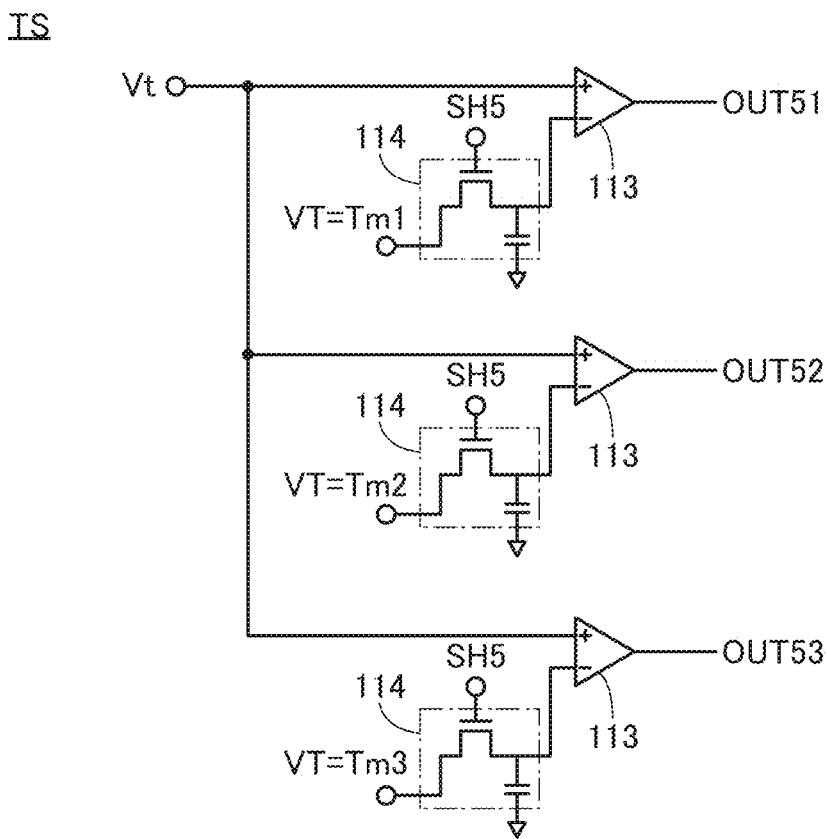
FIG. 7B is a circuit diagram illustrating one embodiment of the present invention.

The temperature sensor TS has a function of measuring the temperature of the assembled battery 120 or the power storage device 100 including the assembled battery 120. FIG. 7B is a circuit diagram illustrating an example of the temperature sensor TS. Note that the circuit diagram in FIG. 7B may show some circuits of the temperature sensor TS.

The temperature sensor TS in FIG. 7B includes three comparators 113, and voltages VT (VT=Tm1, Tm2, Tm3) corresponding to different temperatures are applied to the inverting input terminals of the respective comparators. Each of the applied voltages VT is retained in the memory element 114 that is electrically connected to the inverting input terminal. The voltages Tm1, Tm2, and Tm3 may be applied from, for example, the voltage generator circuit 119.

A voltage corresponding to the measured temperature is applied to an input terminal Vt. The input terminal Vt is supplied to the non-inverting input terminal of each of the three comparators 113.

In accordance with the results of comparison of the voltage applied to the input terminal Vt with the voltage of the inverting input terminal of each of the comparators 113, signals are output from the output terminals (an output terminal OUT51, an output terminal OUT52, and an output terminal OUT53) of the comparators, whereby the temperature can be determined.

An OS transistor has a feature in that the resistance value becomes lower when the temperature rises. By utilizing this feature, the ambient temperature can be converted into a voltage. This voltage can be applied to the input terminal Vt, for example.

The logic circuit 182 may be configured to detect the output from the temperature sensor TS, and turn off the transistor 140 and (or) the transistor 150 to stop charging and (or) discharging when the temperature exceeds the temperature range in which the assembled battery 120 can operate.

<Battery Cell>

A lithium-ion secondary battery cell can be used as the battery cell 121. The battery cell 121 is not limited to a lithium-ion secondary battery cell and as a positive electrode material of the secondary battery, a material including an element A, an element X, and oxygen can be used, for example. The element A is one or more selected from the Group 1 elements and the Group 2 elements. As the Group 1 element, for example, an alkali metal such as lithium, sodium, or potassium can be used. As the Group 2 element, for example, calcium, beryllium, magnesium, or the like can be used. As the element X, for example, one or more selected from metal elements, silicon, and phosphorus can be used. Moreover, the element X is one or more selected from cobalt, nickel, manganese, iron, and vanadium. Typical examples include lithium-cobalt composite oxide $LiCoO_2$ and lithium iron phosphate $LiFePO_4$.

<Transistor>

In the structure of one embodiment of the present invention, with the use of a memory element including an OS transistor, a reference voltage can be retained in the memory element by utilizing an extremely low leakage current flowing between a source and a drain when the transistor is off (hereinafter off-state current). At this time, the memory element can be powered off; thus, with the use of the memory element including the OS transistor, the reference voltage can be retained with extremely low power consumption.

The memory element including the OS transistor can retain an analog potential. For example, a voltage of a secondary battery can be retained in the memory element without being converted to a digital value with an analog-to-digital converter circuit. Since the converter circuit is unnecessary, the circuit area can be reduced.

In addition, the memory element using the OS transistor can rewrite and read the reference voltage by charging or discharging electric charge; thus, a substantially unlimited number of times of acquisition and reading of the monitor voltage is possible. The memory element using the OS transistor is superior in rewrite endurance because, unlike a magnetic memory or a resistive random-access memory, it does not go through atomic-level structure change. Furthermore, unlike in a flash memory, unstableness due to the increase of electron trap centers is not observed in the memory element using the OS transistor even when rewrite operation is repeated.

An OS transistor has features of an extremely low off-state current and favorable switching characteristics even in a high-temperature environment. Accordingly, charging or discharging of the assembled battery 120 can be controlled without a malfunction even in a high-temperature environment.

A memory element using an OS transistor can be freely placed by being stacked over a circuit using an Si transistor or the like, so that integration can be easy. Furthermore, an OS transistor can be manufactured with a manufacturing apparatus similar to that for a Si transistor and thus can be manufactured at low cost.

An OS transistor can be a four-terminal semiconductor element including a back gate electrode in addition to a gate electrode, a source electrode, and a drain electrode. An electric network where input and output of signals flowing between a source and a drain can be independently controlled in accordance with a voltage applied to a gate electrode or a back gate electrode can be constituted. Thus, circuit design with the same ideas as those of an LSI is possible. Furthermore, electrical characteristics of the OS transistor are better than those of a Si transistor in a high-temperature environment. Specifically, the ratio between on-state current and off-state current is large even at a high temperature higher than or equal to 100° C. and lower than or equal to 200° C., preferably higher than or equal to 125° C. and lower than or equal to 150° C.; hence, favorable switching operation can be performed.

An OS transistor is preferably used as the transistor 162. An OS transistor may be used as the transistor 132. OS transistors may be used as the transistor 140 and the transistor 150.

The comparator may be formed using OS transistors.

This embodiment can be combined with any of the other embodiments as appropriate.

Embodiment 2

In this embodiment, a structure example of a semiconductor device according to one embodiment of the present invention will be described. The semiconductor device according to one embodiment of the present invention has a function of detecting a spontaneous potential change (here, potential decrease) due to a micro-short circuit in a secondary battery during charge and discharge by sampling (obtaining) a potential between the positive electrode and the negative electrode of the secondary battery at fixed intervals and comparing the sampled potential with a post-sampling potential between the positive electrode and the negative electrode. By repeating sampling at fixed intervals, the semiconductor device can deal with a potential change in the secondary battery during charge and discharge, and can be operated using the potential between the positive electrode and the negative electrode of the secondary battery.

Note that in this embodiment, potential changes in a secondary battery and a semiconductor device in the secondary battery during charging will be described using a timing chart and the like. Potential changes during discharging will be easily understood by those skilled in the art, and therefore, the description thereof is omitted.

<Example of Detection Circuit>

Figure 8A:
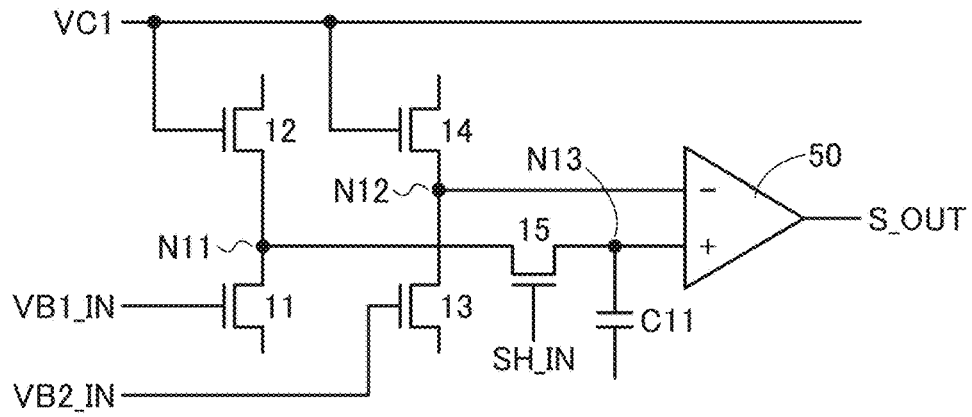
FIG. 8A is a circuit diagram illustrating one embodiment of the present invention.

FIG. 8A is a circuit diagram illustrating a structure example of the detection circuit MSD. The detection circuit MSD includes a transistor 11 to a transistor 15, a capacitor C11, and a comparator 50. Note that in the drawing described in this specification and the like, the flow of main signals is indicated by an arrow or a line, and a power supply line and the like are omitted in some cases. A hysteresis comparator may be used as the comparator 50 included in the detection circuit MSD. The detection circuit MSD may perform detection on a plurality of battery cells connected in series or perform detection on one battery cell at a time. Although FIG. 7 shows an example where the detection circuit MSD is connected to the terminal VC1 and the terminal VSSS when performing detection on a plurality of battery cells that are illustrated in FIG. 4 and connected in series, the detection circuit MSD is connected to a positive electrode and a negative electrode of one battery cell instead of the terminal VC1 and the terminal VSSS.

The detection circuit MSD illustrated in FIG. 8A includes the terminal VC1, a wiring VB1_IN supplied with a predetermined potential VB1, a wiring VB2_IN supplied with a predetermined potential VB2, a wiring SHIN supplied with a sampling signal, and an output terminal S_OUT.

Here, the predetermined potential VB1 is higher than the predetermined potential VB2, and the predetermined potential VB2 is higher than the potential of the terminal VSSS.

Figure 8B:
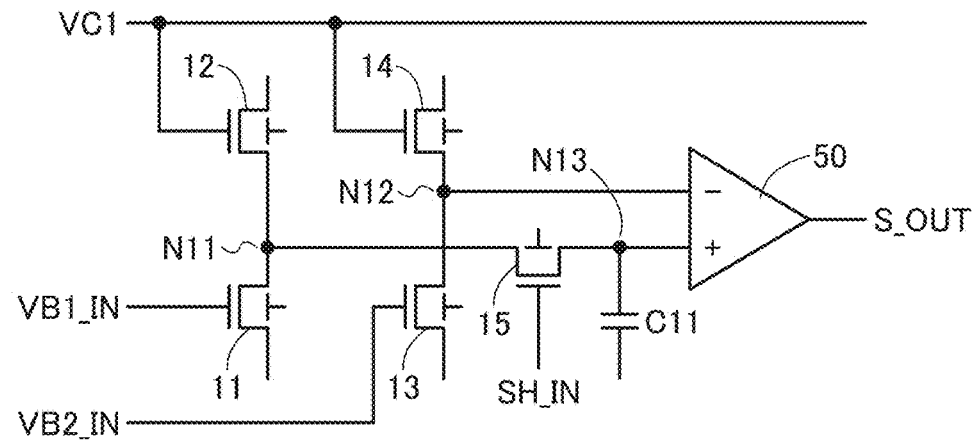
FIG. 8B is a circuit diagram illustrating one embodiment of the present invention.

FIG. 8B differs from FIG. 8A in that the transistor 11 to the transistor 15 included in the detection circuit MSD each have a second gate.

Figure 8C:
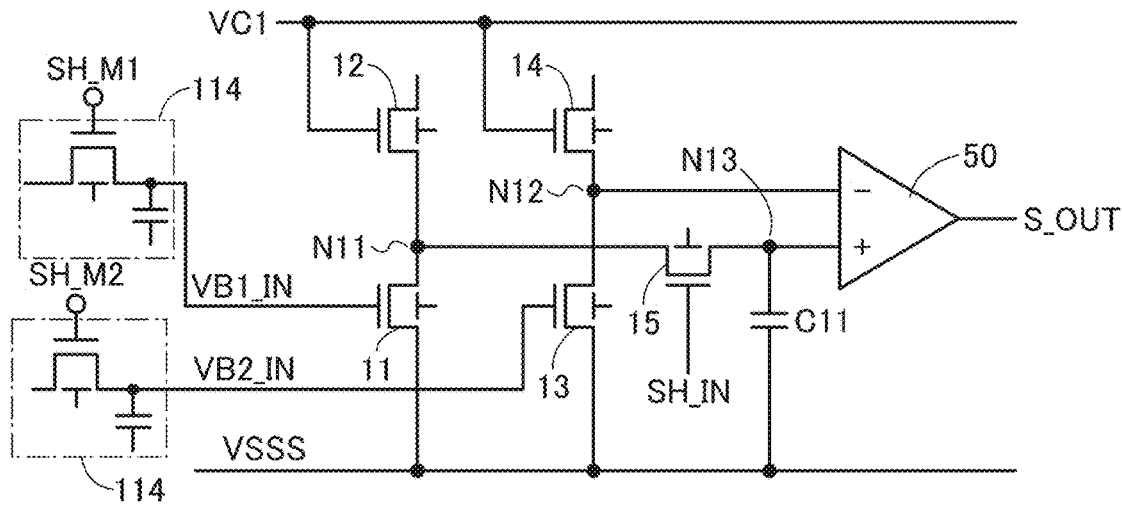
FIG. 8C is a circuit diagram illustrating one embodiment of the present invention.

FIG. 8C differs from FIG. 8B in including the terminal VSSS, including the memory element 114 connected to the wiring VB1_IN, and including the memory element 114 connected to the wiring VB2_IN. Moreover, in FIG. 8C, one of a source and a drain of the transistor 11, one of a source and a drain of the transistor 13, and one electrode of the capacitor C11 are electrically connected to the terminal VSSS. The potential VB1 and the potential VB2 are respectively supplied to the wiring VB1_IN and the wiring VB2_IN through the memory elements 114; thus, the supplied potentials can be retained by the memory elements 114. Consequently, a voltage generator circuit that supplies the potential VB1 and the potential VB2, specifically the voltage generator circuit 119, for example, can be powered off or set in a standby state.

The transistor 11 to the transistor 15 are n-channel transistors. Although an example in which the detection circuit MSD is formed using n-channel transistors is described in this specification and the like, p-channel transistors may alternatively be used. It will be easily understood by those skilled in the art that n-channel transistors in a circuit diagram configured using the n-channel transistors can be replaced with p-channel transistors; thus, the description is omitted.

In the detection circuit MSD, the one of the source and the drain of the transistor 11 is electrically connected to the terminal VSSS; the other of the source and the drain of the transistor 11 is electrically connected to one of a source and a drain of the transistor 12 and one of a source and a drain of the transistor 15; a gate of the transistor 11 is electrically connected to the wiring VB1_IN; and the other of the source and the drain of the transistor 12 and a gate of the transistor 12 are electrically connected to the terminal VC1.

The one of the source and the drain of the transistor 13 is electrically connected to the terminal VSSS; the other of the source and the drain of the transistor 13 is electrically connected to one of a source and a drain of the transistor 14 and an inverting input terminal (denoted by "−" in FIG. 8A) of the comparator 50; a gate of the transistor 13 is electrically connected to the wiring VB2_IN; and the other of the source and the drain of the transistor 14 and a gate of the transistor 14 are electrically connected to the terminal VC1.

The other of the source and the drain of the transistor 15 is electrically connected to the other terminal of the capacitor C11 and a non-inverting input terminal (denoted by "+" in FIG. 8A) of the comparator 50; a gate of the transistor 15 is electrically connected to the wiring SH_IN; the one terminal of the capacitor C11 is electrically connected to the terminal VSSS; and an output terminal of the comparator 50 is electrically connected to the output terminal S_OUT. Note that the one terminal of the capacitor C11 may be electrically connected to a wiring other than the terminal VSSS as long as it is supplied with a predetermined potential.

Here, a connection portion where the other of the source and the drain of the transistor 11, the one of the source and the drain of the transistor 12, and the one of the source and the drain of the transistor 15 are electrically connected to each other is referred to as a node N11; a connection portion where the other of the source and the drain of the transistor 13, the one of the source and the drain of the transistor 14, and the inverting input terminal of the comparator 50 are electrically connected to each other is referred to as a node N12; and a connection portion where the other of the source and the drain of the transistor 15, the other terminal of the capacitor C11, and the non-inverting input terminal of the comparator 50 are electrically connected to each other is referred to as a node N13.

The transistor 11 and the transistor 12 form a first source follower, and the transistor 13 and the transistor 14 form a second source follower. That is, the gate of the transistor 11 corresponds to an input of the first source follower, and the first source follower outputs a signal to the node N11. The gate of the transistor 13 corresponds to an input of the second source follower, and the second source follower outputs a signal to the node N12.

An example of the operation of the detection circuit MSD is described using the circuit illustrated in FIG. 8C.

When charging is started in an assembled battery, the sampling signal supplied to the wiring SH_IN becomes high level at predetermined intervals. As the potential VB1, a potential higher than the potential VB2 is supplied. The potential of the node N11 and the potential of the node N12 increase along with charging.

When the positive electrode potential decreases instantaneously because of occurrence of a micro-short circuit, the potentials of the node N11 and the node N12 decrease instantaneously. Meanwhile, when the sampling signal supplied to the wiring SH_IN is at low level, the potential of the node N13 is not affected by the potential of the node N11, and the potential of the node N12 becomes lower than the potential of the node N13. Then, the output of the comparator 50 is inverted, and a micro-short circuit is detected.

To increase the accuracy of detecting a micro-short circuit, a micro-short circuit may be detected or predicted in such a manner that the voltage of a secondary battery is converted into digital data by an analog-to-digital converter circuit, and arithmetic operation is performed on the basis of the digital data by a processor unit or the like to analyze a charge waveform or a discharge waveform. For example, a micro-short circuit is detected or predicted using a change of a voltage difference between time steps in the charge waveform or the discharge waveform. A change of a voltage difference is obtained by calculating voltage differences and calculating a difference with the previous step.

A neural network may be used to increase the accuracy of detecting a micro-short circuit.

A neural network is a method and is neural network processing performed in a neural network portion (including a CPU (Central Processor Unit), a GPU (Graphics Processing Unit), an APU (Accelerated Processing Unit), a memory, and the like, for example). Note that an APU refers to a chip integrating a CPU and a GPU into one.

In a secondary battery mounted on a device, discharge, which is likely to depend on a way of using the device by the user, occurs at random; whereas charge can be said to be more easily predicted than discharge because the charging condition is fixed. Using a rather large number of charge curves as data for learning, an accurate value can be predicted with a neural network. When a charge curve is obtained, initial SOC(0), FCC, $R_0$, $R_d$, and $C_d$ can be obtained using a neural network. For arithmetic operation of a neural network, a microprocessor or the like can be used, for example.

Specifically, a variety of obtained data are evaluated and learned using machine learning or artificial intelligence to analyze the expected degree of degradation of a secondary battery, and when there is an abnormality, charging of the secondary battery is stopped or the current density of constant-current charging is adjusted.

For example, in an electric vehicle, learning data can be obtained while the electric vehicle is running, and the degradation state of a secondary battery can be known. Note that a neural network is used to estimate the degradation state of the secondary battery. The neural network can be formed of a neural network including a plurality of hidden layers, that is, a deep neural network. Note that learning in a deep neural network is referred to as deep learning in some cases.

In machine learning, first, a feature value is extracted from learning data. A relative change amount that changes with time is extracted as a feature value, and a neural network is made to learn based on the extracted feature value. For the learning means, the neural network can be made to learn based on learning patterns that are different between each time division. A coupling weight applied to the neural network can be updated according to a leaning result based on the leaning data.

As a method of estimating the charging state of a secondary battery by using a neural network, a regression model such as a Kalman filter, for example, can be used for calculation processing.

A Kalman filter is a kind of infinite impulse response filter. Multiple regression analysis is multivariate analysis and uses a plurality of independent variables in regression analysis. Examples of the multiple regression analysis include a least-squares method. The regression analysis requires a large number of observation values of time series, whereas the Kalman filter has an advantage of being able to obtain an optimal correction coefficient successively as long as a certain amount of data is accumulated. Moreover, the Kalman filter can also be applied to transient time series.

As a method of estimating the internal resistance and the state of charge (SOC) of a secondary battery, a non-linear Kalman filter (specifically an unscented Kalman filter (also referred to as UKF)) can be used. In addition, an extended Kalman filter (also referred to as EKF) can also be used. The SOC refers to a charging state (also referred to as state of charge), and is an index indicating that the fully charged state is 100% and the completely discharged state is 0%.

Initial parameters obtained by an optimization algorithm are collected in every n (n is an integer, e.g., 50) cycles, and neural network processing is performed using these data groups as teacher data; thus, the SOC can be estimated with high accuracy.

A leaning system includes a teacher data generation device and a learning device. The teacher data generation device generates teacher data that the learning device uses for learning. Teacher data includes data whose recognition target is the same as that of process target data, and the evaluation of a label corresponding to the data. The teacher data generation device includes an input data acquisition portion, an evaluation acquisition portion, and a teacher data generation portion. The input data acquisition portion may obtain input data from data stored in a memory device or obtain input data for learning via the Internet; input data is data used for learning and includes a current value and a voltage value of a secondary battery. Teacher data is not necessarily measured data; data close to actual measurement may be created by varying initial parameters to increase the diversity, and neural network processing may be performed using a predetermined property database as teacher data to estimate the state of charge (SOC). Alternatively, data close to actual measurement can be created on the basis of charge and discharge characteristics of one battery, and neural network processing can be performed using a predetermined property database as teacher data to efficiently estimate the SOC of batteries of the same kind.

In the case where degradation of a secondary battery proceeds, an SOC error might occur when FCC, the initial parameter, changes greatly; hence, initial parameters used for arithmetic operation to estimate the SOC may be updated. The initial parameters to be updated are calculated by an optimization algorithm using data on charge and discharge characteristics that are measured in advance. By calculation processing with a regression model using updated initial parameters, for example, a Kalman filter, the SOC can be estimated with high accuracy even after degradation. In this specification, calculation processing using a Kalman filter is also expressed as Kalman filter processing.

The timing of updating the initial parameters can be at random; to estimate the SOC with high accuracy, the frequency of updates is preferably high and successive updates at regular intervals are preferable. Note that when the temperature of a secondary battery is high and its SOC is high, degradation of the secondary battery is likely to progress in some cases. In such a case, it is preferable to inhibit degradation of the secondary battery by discharging the secondary battery to lower the SOC.

This embodiment can be combined with any of the other embodiments as appropriate.

Embodiment 3

This embodiment will describe a structure example of a comparator.

Figure 9:
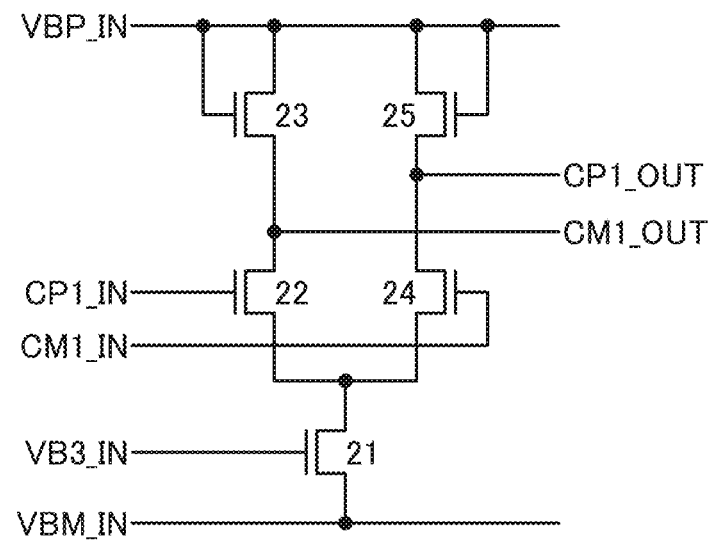
FIG. 9 is a circuit diagram illustrating one embodiment of the present invention.

FIG. 9 illustrates a structure example of the comparator 50 described in the foregoing embodiment. The comparator 50 includes a transistor 21 to a transistor 25. The comparator 50 also includes a wiring VBM_IN supplied with a negative electrode potential of a secondary battery, a wiring VBP_IN supplied with a positive electrode potential VBP of the secondary battery, a wiring VB3_IN supplied with a predetermined potential VB3, an input terminal CP1_IN, an input terminal CM1_IN, an output terminal CP1_OUT, and an output terminal CM1_OUT.

In the case where the comparator 50 in FIG. 9 is used in the cell balancing circuit 130(1) and the detection circuit 185(1) in FIG. 4, potentials are supplied from the terminal VC1 to the wiring VBP_IN and from the terminal VC2 to the wiring VBN_IN, for example.

Here, the predetermined potential VB3 is higher than a negative electrode potential VBM, and in the comparator 50, the positive electrode potential VBP is a high power supply potential and the negative electrode potential VBM is a low power supply potential.

In the comparator 50, one of a source and a drain of the transistor 21 is electrically connected to the wiring VBM_IN; the other of the source and the drain of the transistor 21 is electrically connected to one of a source and a drain of the transistor 22 and one of a source and a drain of the transistor 24; and a gate of the transistor 21 is electrically connected to the wiring VB3_1N.

The other of the source and the drain of the transistor 22 is electrically connected to one of a source and a drain of the transistor 23 and the output terminal CM1_OUT; the other of the source and the drain of the transistor 23 and a gate of the transistor 23 are electrically connected to the wiring VBP_IN; and a gate of the transistor 22 is electrically connected to the input terminal CP1_IN.

The other of the source and the drain of the transistor 24 is electrically connected to one of a source and a drain of the transistor 25 and the output terminal CP1_OUT; the other of the source and the drain of the transistor 25 and a gate of the transistor 25 are electrically connected to the wiring VBP_IN; and a gate of the transistor 24 is electrically connected to the input terminal CM1_IN.

Alternatively, a plurality of circuits in FIG. 9 may be connected in parallel and used as the comparator 50. That is, the output of the comparator illustrated in FIG. 9 may be input to a next-stage comparator 50, and a plurality of comparators may be connected and used.

This embodiment can be combined with any of the other embodiments as appropriate.

Embodiment 4

A structure example of a semiconductor device applicable to the battery control circuit described in the above embodiment will be described.

Figure 10:
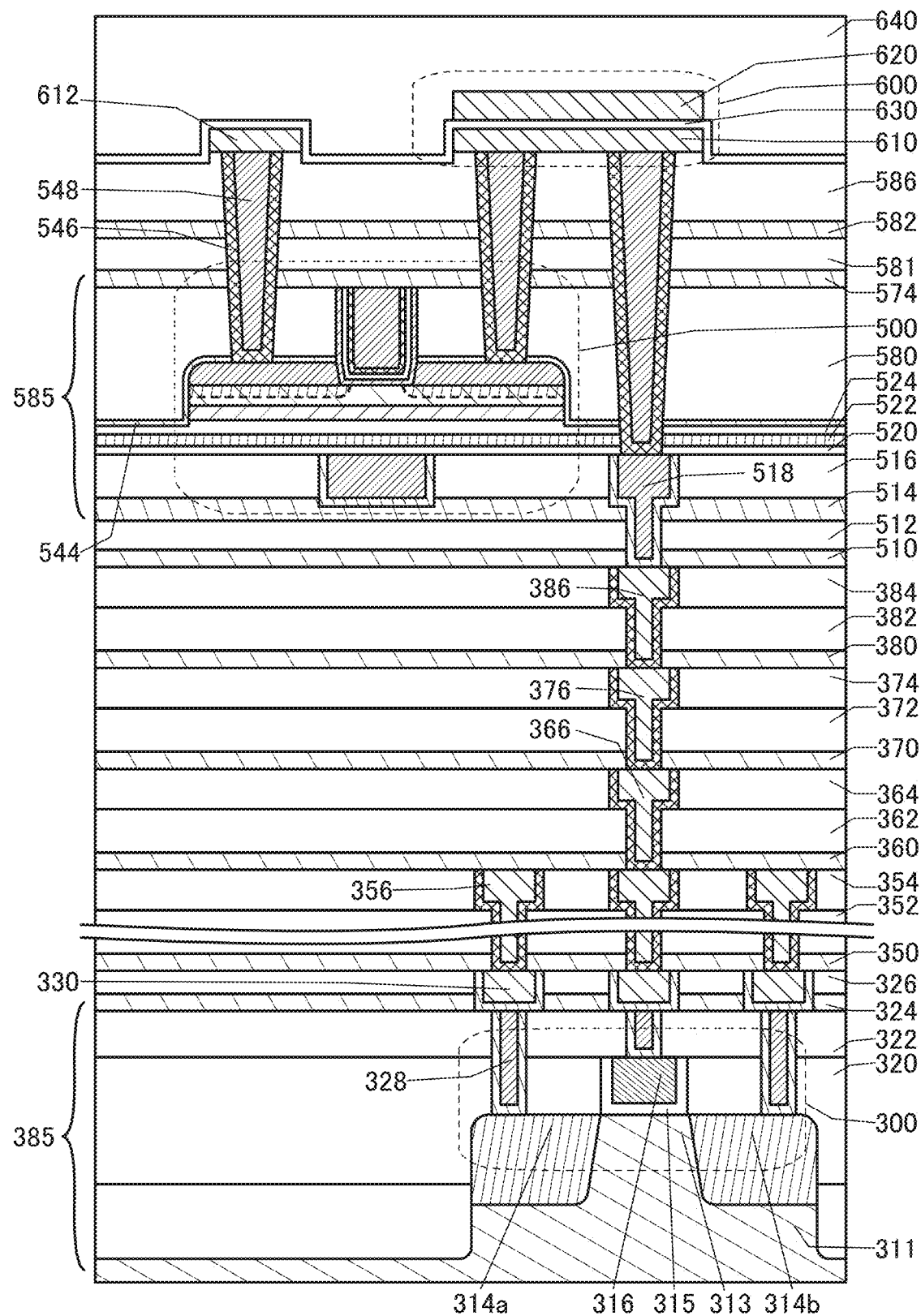
FIG. 10 is a cross-sectional view illustrating a structure example of a semiconductor device.
Figure 12A:
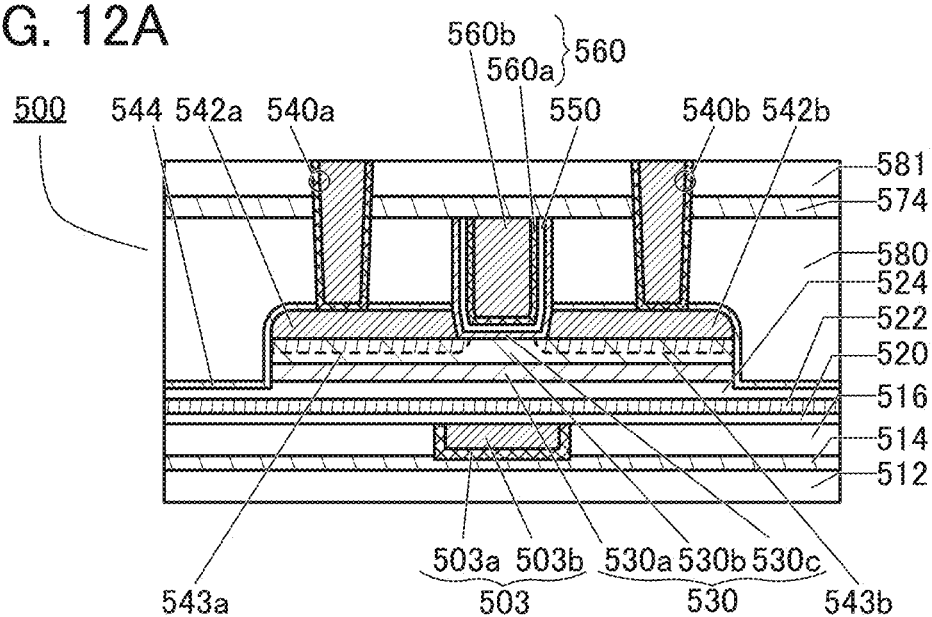
FIG. 12A is a cross-sectional view illustrating a structure example of a transistor.
Figure 12B:
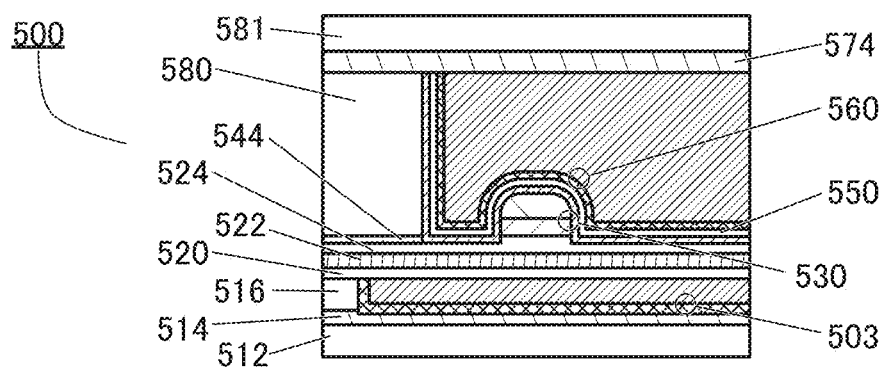
FIG. 12B is a cross-sectional view illustrating the structure example of the transistor.
Figure 12C:
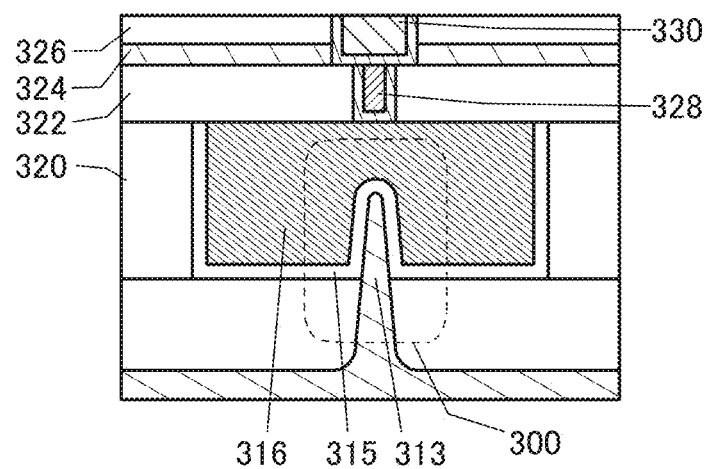
FIG. 12C is a cross-sectional view illustrating a structure example of a transistor.

A semiconductor device illustrated in FIG. 10 includes a transistor 300, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 300 in the channel width direction.

The transistor 500 is an OS transistor. Since the off-state current of the transistor 500 is low, the use of the transistor 500 as an OS transistor included in the semiconductor device enables long-term retention of written data.

The transistor 500 is an n-channel transistor, for example.

Here, the battery control circuit described in the above embodiment may be formed with OS transistors. For example, part of the battery control circuit described in the above embodiment is preferably formed with OS transistors. For example, the transistor 162 and the transistor 172 included in the battery control circuit are preferably OS transistors. As another example, the comparator included in the battery control circuit can be formed with OS transistors.

The comparator included in the battery control circuit may be formed only with transistors having the same conductivity type, for example, n-channel transistors.

The semiconductor device described in this embodiment includes the transistor 300, the transistor 500, and the capacitor 600 as shown in FIG. 10. The transistor 500 is provided above the transistor 300, and the capacitor 600 is provided above the transistor 300 and the transistor 500. A layer 385 is a layer where the transistor 300 is provided. In FIG. 10, for example, the layer 385 includes a substrate 311 and layers positioned between the substrate 311 and an insulator 322. A layer 585 is a layer where the transistor 500 is provided. In FIG. 10, for example, the layer 585 includes layers positioned between an insulator 514 and an insulator 574. The substrate 311, the insulator 322, the insulator 514, and the insulator 574 will be described later.

The transistor 300 is provided on the substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used as the transistor included in the comparator in the above embodiment, for example.

In the transistor 300, the top surface and the side surface in the channel width direction of the semiconductor region 313 are covered with the conductor 316 with the insulator 315 therebetween, as illustrated in FIG. 12C. Such a Fin-type transistor 300 can have an increased effective channel width, and thus the transistor 300 can have improved on-state characteristics. In addition, contribution of an electric field of a gate electrode can be increased, so that the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of the conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 11:
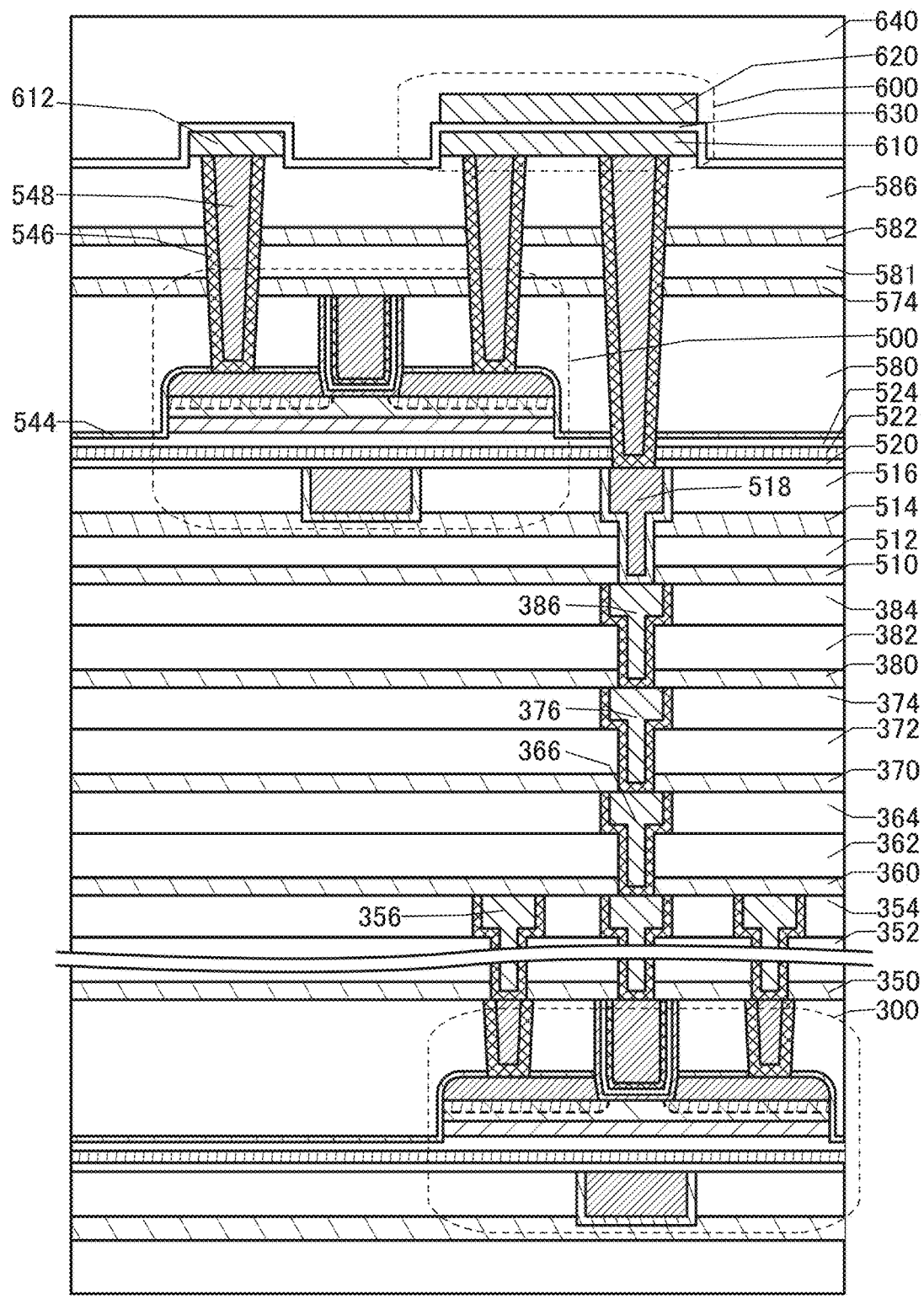
FIG. 11 is a cross-sectional view illustrating a structure example of a semiconductor device.

Note that the transistor 300 illustrated in FIG. 10 is an example and the structure is not limited thereto; an appropriate transistor can be used in accordance with a circuit configuration or a driving method. For example, when the semiconductor device is composed of only OS transistors, the transistor 300 has a structure similar to that of the transistor 500 using an oxide semiconductor, as illustrated in FIG. 11. Note that the details of the transistor 500 will be described later.

An insulator 320, the insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 10, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of the wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 10, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. The conductor 366 preferably contains a conductor having a barrier property against hydrogen. In particular, the conductor having a barrier property against hydrogen is preferably formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 10, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. The conductor 376 preferably contains a conductor having a barrier property against hydrogen. In particular, the conductor having a barrier property against hydrogen is preferably formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 10, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. The conductor 386 preferably contains a conductor having a barrier property against hydrogen. In particular, the conductor having a barrier property against hydrogen is preferably formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device according to this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, the insulator 514, and an insulator 516 are stacked in this order over the insulator 384. A material having a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Thus, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 12A and FIG. 12B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on a formation surface of the oxide 530c, and a conductor 560 positioned on a formation surface of the insulator 550.

As illustrated in FIG. 12A and FIG. 12B, an insulator 544 is preferably provided between the insulator 580 and the oxide 530a, the oxide 530b, the conductor 542a, and the conductor 542b. In addition, as illustrated in FIG. 12A and FIG. 12B, the conductor 560 preferably includes a conductor 560a provided inside the insulator 550 and a conductor 560b provided to be embedded inside the conductor 560a. As illustrated in FIG. 12A and FIG. 12B, the insulator 574 is preferably positioned over the insulator 580, the conductor 560, and the insulator 550.

Note that in the following description, the oxide 530a, the oxide 530b, and the oxide 530c are sometimes collectively referred to as an oxide 530.

The transistor 500 has a structure in which the three layers of the oxide 530a, the oxide 530b, and the oxide 530c are stacked in the region where the channel is formed and its vicinity; however, the present invention is not limited to this. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 10 and FIG. 12A is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be increased, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of an opening in the insulator 514 and the insulator 516, and a conductor 503b is formed on the inner side. Although the transistor 500 in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In the case where the conductor 503 also functions as a wiring, a conductive material that has high conductivity and contains tungsten, copper, or aluminum as its main component is preferably used for the conductor 503b. In that case, the conductor 503a is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the reaction of the conductor 503 with oxygen included in the insulator 524 and the oxide 530 can be suppressed.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

Note that in the transistor 500 in FIG. 12A and FIG. 12B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

The oxide 530b may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. Oxygen extraction from the oxide 530b can be suppressed even when heat treatment is performed; thus, the transistor 500 is stable with respect to high temperatures in the manufacturing process (what is called thermal budget).

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. As the oxide 530c, a metal oxide that can be used as the oxide 530a or the oxide 530b can be used.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

Although the conductor 542a and the conductor 542b each having a single-layer structure are illustrated in FIG. 12, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 12A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

As the insulator 544, it is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose the conductivity even after absorbing oxygen. Design is appropriately set in consideration of required transistor characteristics.

With the insulator 544, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably provided in contact with the inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high relative permittivity.

Although the conductor 560 functioning as the first gate electrode has a two-layer structure in FIG. 12A and FIG. 12B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

A conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530*c*, oxygen in the insulator 580 can be efficiently supplied to the oxide 530 through the oxide 530*c*. The concentration of impurities such as water or hydrogen in the insulator 580 is preferably lowered.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A material having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Thus, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, it is possible to use a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in FIG. 10, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. The insulator 640 may function as a planarization film that covers an uneven shape therebelow.

With the use of this structure, a change in electrical characteristics can be inhibited and the reliability can be improved in a semiconductor device using a transistor including an oxide semiconductor. Alternatively, a battery control circuit using a transistor including an oxide semiconductor can be miniaturized or highly integrated.

The transistor 140 and the transistor 150 described in Embodiment 1 are sometimes referred to as power MOSFETs. The transistor 300 illustrated in each of FIG. 30, FIG. 31A, FIG. 31B, and FIG. 31C is preferably used particularly as the transistor 140 and the transistor 150. The transistor 300 illustrated in each of FIG. 30, FIG. 31A, FIG. 31B, and FIG. 31C is referred to as a D-MOS (Double Diffusion Metal Oxide Semiconductor) FET.

Figure 30:
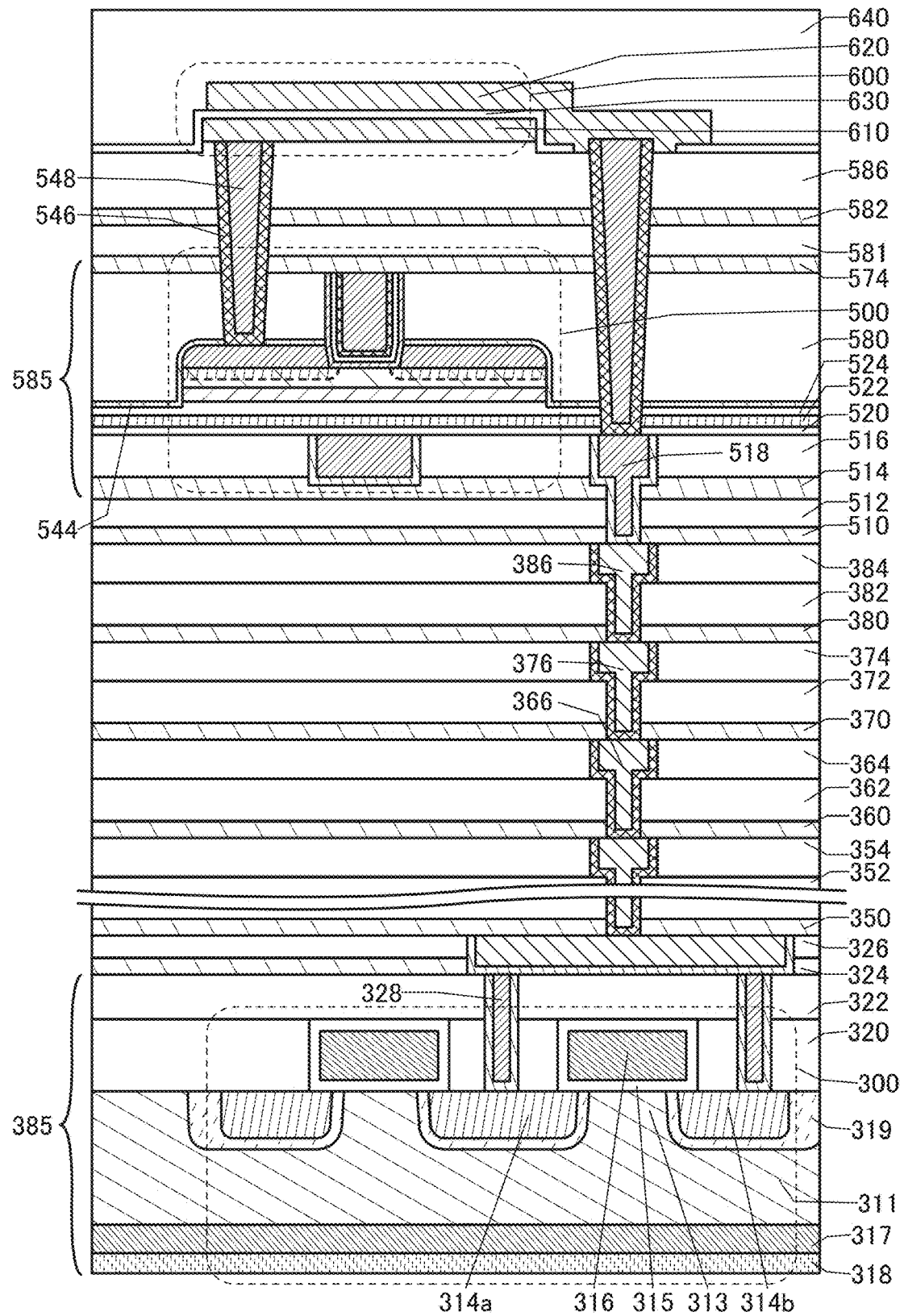
FIG. 30 is a cross-sectional view illustrating a structure example of a semiconductor.

The transistor 300 illustrated in FIG. 30 is a planar transistor. The transistor 300 can be operated as a MOSFET by using the low-resistance region 314a and the low-resistance region 314b as a source region and a drain region; here, the transistor 300 can function as a D-MOSFET by making both the low-resistance region 314a and the low-resistance region 314b function as a source, forming a region 319 outside the low-resistance region 314a and the low-resistance region 314b, providing a low-resistance region 317 in a region below the semiconductor region 313 of the silicon substrate in the cross section of FIG. 30, and providing a rear electrode 318 functioning as a drain electrode below the low-resistance region 317. Alternatively, both the low-resistance region 314a and the low-resistance region 314b may function as a drain, and the rear electrode 318 may function as a source electrode. The region 319 preferably has a conductivity type opposite to that of the low-resistance region 314a and the low-resistance region 314b. For example, in the case where the low-resistance region 314a and the low-resistance region 314b are n-type regions, the region 319 is preferably a p-type region. Alternatively, the region 319 may be a high-resistance region. The region 319 is an intrinsic region in some cases.

Note that in FIG. 30, the low-resistance region 314a and the low-resistance region 314b are in contact with the region 319 having the opposite conductivity type, whereby a pn junction is formed. Such a pn junction region is referred to as a parasitic diode in this specifications and the like. The parasitic diode has functions of backflow prevention, rectification, and the like. The parasitic diode also has a function of protecting a transistor. The parasitic diode is formed between the drain (e.g., the low-resistance region 314a and the low-resistance region 314b) and the source (e.g., the rear electrode 318), whereby electric field concentration at the time of applying a high voltage between the source and the drain is reduced, for example, and breakage or deterioration of the transistor can be inhibited.

Figure 31A:
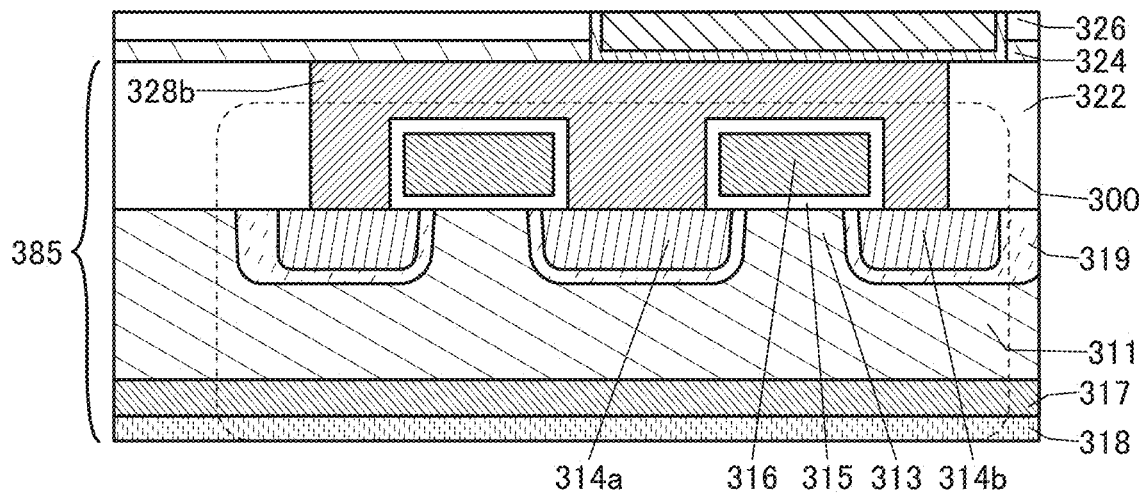
FIG. 31A is a cross-sectional view illustrating a structure example of a transistor.

FIG. 30 illustrates an example where respective plugs such as the conductors 328 are electrically connected to the low-resistance region 314a and the low-resistance region 314b; FIG. 31A illustrates an example where a conductor 328b is electrically connected to a plurality of low-resistance regions. The conductor 328b preferably has a shape covering at least part of each of the plurality of low-resistance regions. Furthermore, the conductor 328b preferably overlaps with at least part of each of the plurality of low-resistance regions.

Figure 31B:
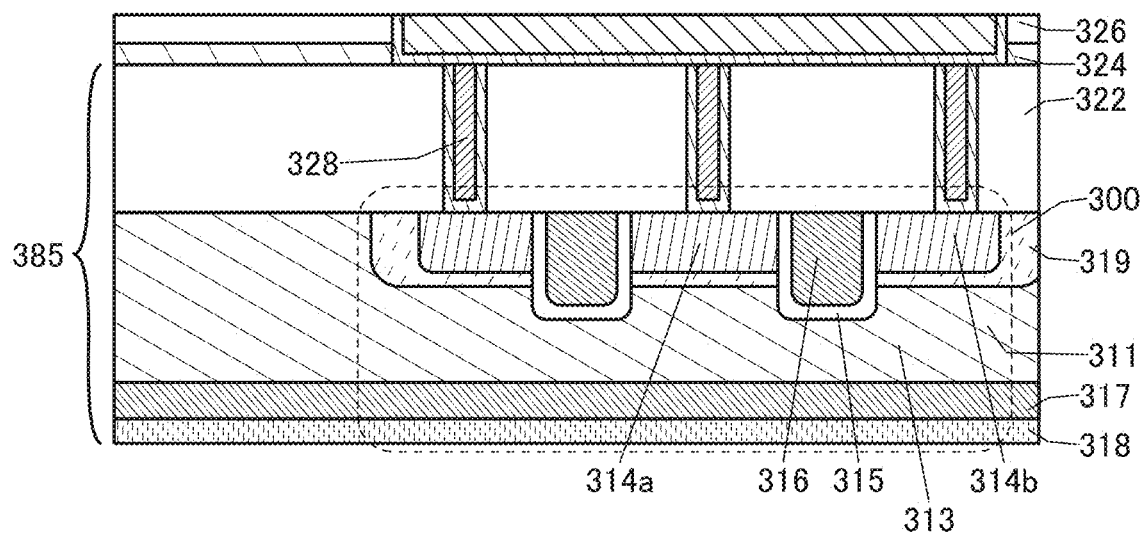
FIG. 31B is a cross-sectional view illustrating a structure example of a transistor.

FIG. 30 illustrates an example where the transistor 300 is a D-MOSFET with a planar structure; FIG. 31B illustrates an example where the transistor 300 is a D-MOSFET with a trench structure. In FIG. 31A, the conductor 316 functioning as a gate is formed in a trench provided between the low-resistance region 314a and the low-resistance region 314b. The insulator 315 functioning as a gate insulator is formed between the low-resistance regions 314a and 314b and the conductor 316.

Figure 31C:
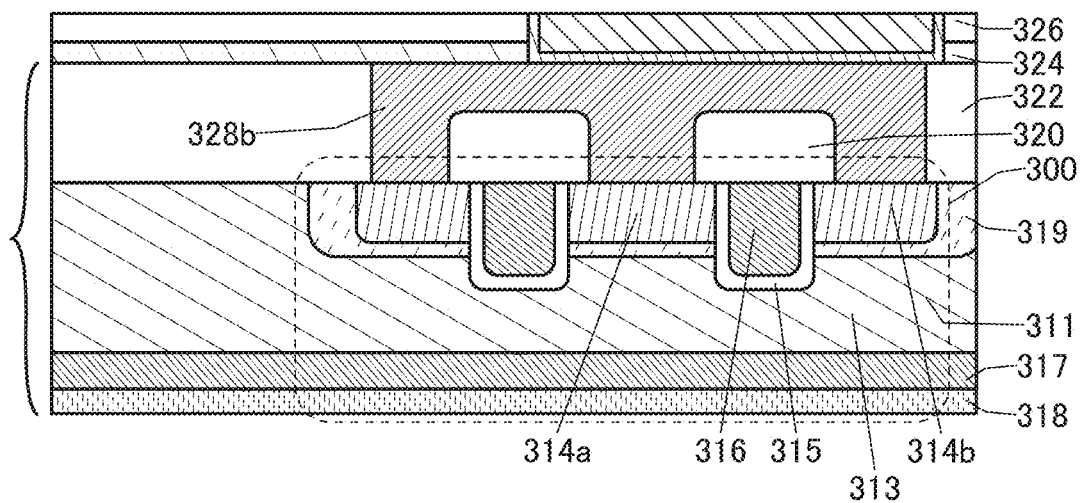
FIG. 31C is a cross-sectional view illustrating a structure example of a transistor.

FIG. 31B illustrates an example where respective plugs such as the conductors 328 are electrically connected to the low-resistance region 314a and the low-resistance region 314b; FIG. 31C illustrates an example where the conductor 328b is electrically connected to a plurality of low-resistance regions. The conductor 328b preferably has a shape covering at least part of each of the plurality of low-resistance regions. Furthermore, the conductor 328b preferably overlaps with at least part of each of the plurality of low-resistance regions.

With the trench structure, the area of an integrated circuit is reduced preferably to 0.5 times or less, further preferably to 0.4 times or less, compared to the case of employing the planar structure.

FIG. 13A, FIG. 13B, FIG. 13C, FIG. 14A, and FIG. 14B are perspective views illustrating examples of the structure of a semiconductor device of one embodiment of the present invention. FIG. 13A, FIG. 13B, FIG. 13C, FIG. 14A, and FIG. 14B each illustrate an example where circuits included in a semiconductor device 900 are provided in the above-described layer 385 and the above-described layer 585. The layer 385 is, for example, a layer including Si transistors. The layer 585 is, for example, a layer including OS transistors. Note that the expression "each circuit is provided in the layer 385 or the layer 585" means, for example, that transistors among elements constituting each circuit are formed in the layer 385 or the layer 585. A capacitor and a resistor included in each circuit may be provided between these layers or over the layer 585, for example.

In the examples of the semiconductor device 900 illustrated in FIG. 13A, FIG. 13B, FIG. 13C, FIG. 14A, and FIG. 14B, the battery control circuit 101 described in the foregoing embodiment includes a circuit 102 and a circuit 103, for example.

The circuit 102 includes, for example, at least one of the cell balancing circuit 130, the detection circuit 185, the detection circuit 186, the detection circuit MSD, the detection circuit SD, the temperature sensor TS, the decoder 160, and the logic circuit 182.

The circuit 103 includes at least one of the transistor 140 and the transistor 150.

Some circuits included in the circuit 102 are included in a circuit 102b, and the other circuits are included in a circuit 102a. Transistors included in the circuit 102b are mainly provided in the layer 385. Transistors included in the circuit 102a are mainly provided in the layer 585. The circuit 102b includes the decoder 160 and the logic circuit 182, for example.

The circuit 102b may include a charging circuit, for example.

For example, transistors included in the voltage generator circuit 119 described in the foregoing embodiment are mainly provided in the layer 385.

A circuit 195 includes an arithmetic circuit such as an MPU, an MCU, or a CPU. Moreover, the circuit 195 preferably includes a memory element. The arithmetic circuit included in the circuit 195 may include a circuit 195a that mainly includes transistors provided in the layer 385, in addition to a circuit 195b that mainly includes transistors provided in the layer 385. When the arithmetic circuit included in the circuit 195 includes the circuit 195a, power consumption in a standby state can be reduced in some cases. Specifically, the circuit 195a includes a flip-flop circuit or the like including an OS transistor, for example.

The circuit 195 has a function of controlling the amount of charge current in accordance with the degree of degradation, a function of a battery indicator, and the like, for example. The circuit 195 also has a function of transmitting and receiving signals to/from the battery control circuit 101. For example, the circuit 195 performs arithmetic operation using a signal from the battery control circuit 101 and supplies a signal to the battery control circuit 101 on the basis of the arithmetic result.

Figure 13A:
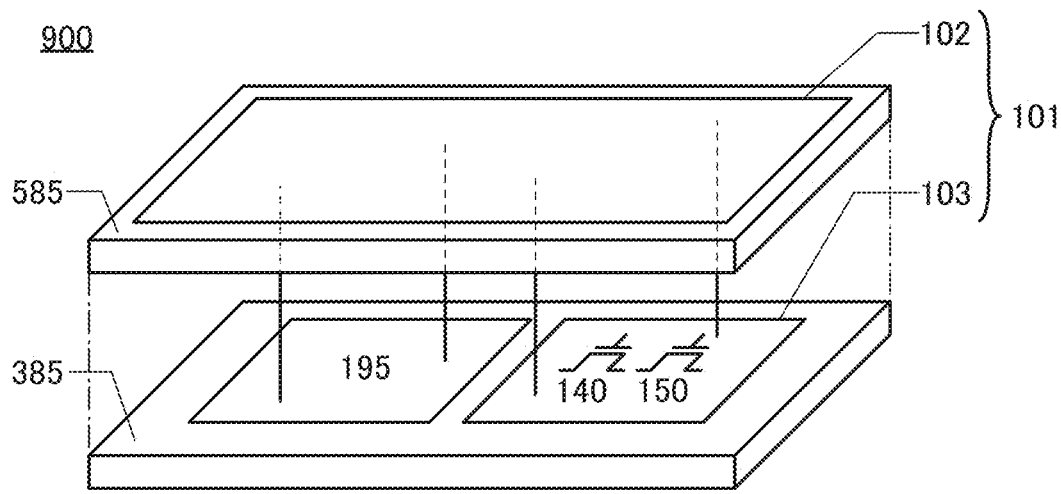
FIG. 13A is a perspective view illustrating an example of a semiconductor device.

In the example of the semiconductor device illustrated in FIG. 13A, the circuit 103 and the circuit 195 are provided in the layer 385, and the circuit 102 is provided in the layer 585.

Figure 13B:
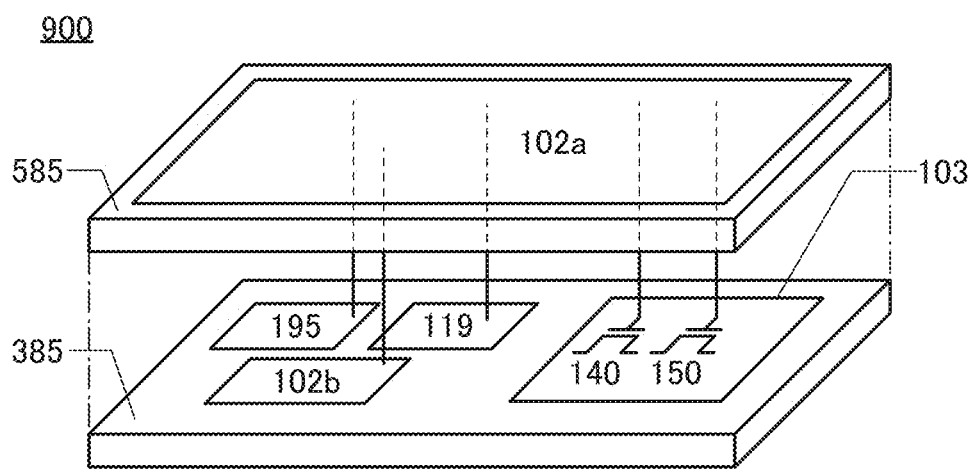
FIG. 13B is a perspective view illustrating an example of a semiconductor device.

In the example of the semiconductor device illustrated in FIG. 13B, the circuit 195, the circuit 102b, the circuit 103, and the voltage generator circuit 119 are provided in the layer 385, and the circuit 102a is provided in the layer 585.

Figure 13C:
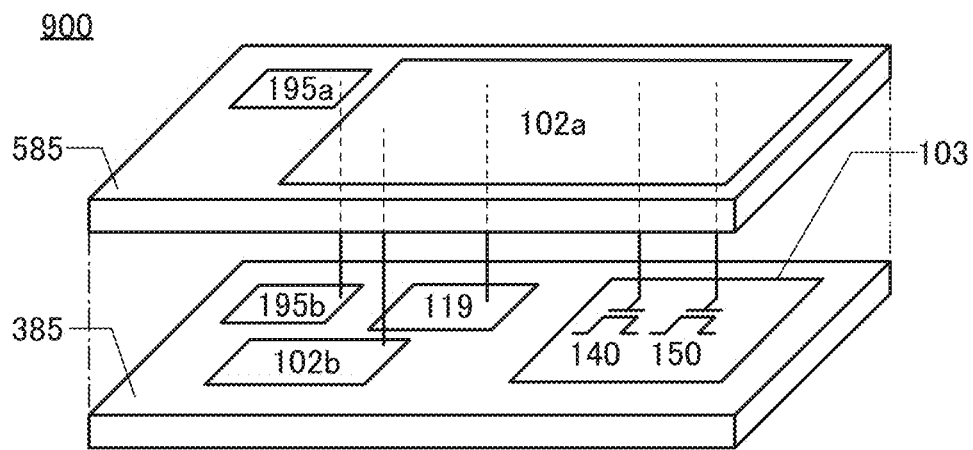
FIG. 13C is a perspective view illustrating an example of a semiconductor device.

In the example of the semiconductor device illustrated in FIG. 13C, the circuit 195b, the circuit 102b, the circuit 103, and the voltage generator circuit 119 are provided in the layer 385, and the circuit 195a and the circuit 102a are provided in the layer 585.

Figure 14A:
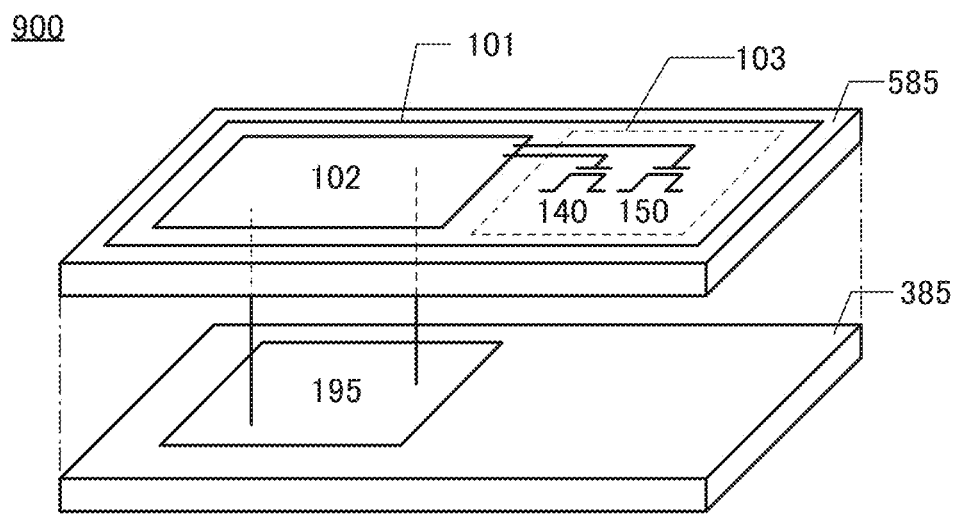
FIG. 14A is a perspective view illustrating an example of a semiconductor device.

In the example of the semiconductor device illustrated in FIG. 14A, the circuit 195 is provided in the layer 385, and the circuit 102 and the circuit 103 are provided in the layer 585.

Figure 14B:
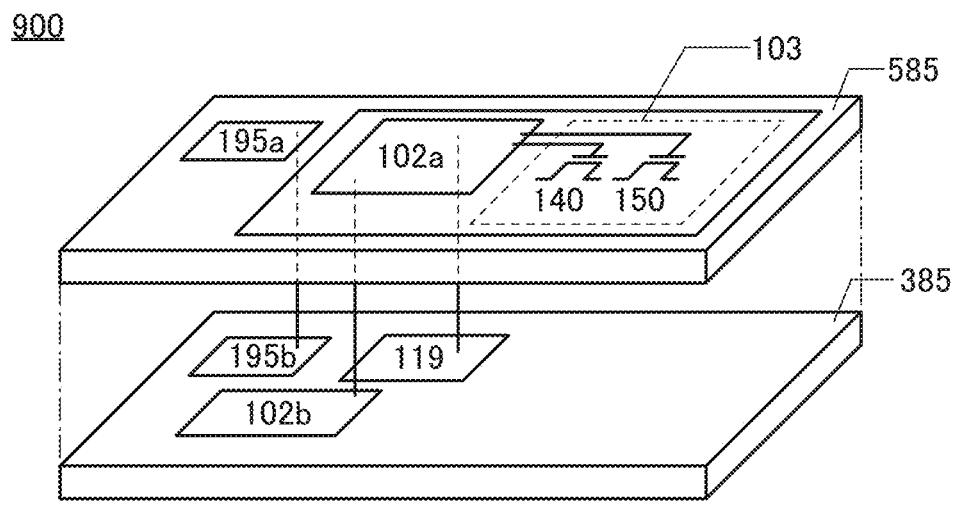
FIG. 14B is a perspective view illustrating an example of a semiconductor device.

In the example of the semiconductor device illustrated in FIG. 14B, the circuit 195b, the circuit 102b, and the voltage generator circuit 119 are provided in the layer 385, and the circuit 195a, the circuit 102a, and the circuit 103 are provided in the layer 585.

The examples of the semiconductor device illustrated in FIG. 13A, FIG. 13B, FIG. 13C, FIG. 14A, and FIG. 14B can be used for control circuits such as a control circuit 420 and a control circuit 590 that will be described later, for example.

This embodiment can be combined with any of the other embodiments as appropriate.

Embodiment 5

In this embodiment, a metal oxide of one embodiment of the present invention will be described.

<<Metal Oxide>>

For the oxide 530, a metal oxide functioning as an oxide semiconductor is preferably used. A metal oxide that can be used for the oxide 530 according to the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. In addition, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. Meanwhile, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained in some cases when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide will be described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to be released and may behave like fixed charges. Thus, a transistor whose channel formation region includes a metal oxide having a high density of trap states has unstable electrical characteristics in some cases.

If impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by secondary ion mass spectrometry (SIMS) is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In some cases, bonding of part of hydrogen to oxygen bonded to a metal atom generates electrons serving as carriers.

Thus, a transistor using an oxide semiconductor that contains a large amount of hydrogen is likely to have normally-on characteristics. Moreover, hydrogen in an oxide semiconductor moves easily by a stress such as heat or an electric field; hence, a large amount of hydrogen in an oxide semiconductor might degrade the reliability of a transistor.

Accordingly, the amount of VoH in the metal oxide is preferably reduced as much as possible so that the metal oxide becomes a highly purified intrinsic or substantially highly purified intrinsic metal oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

An oxide semiconductor with a low carrier concentration is preferably used for a transistor. To reduce the carrier concentration of the oxide semiconductor, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of impurities in the oxide semiconductor include hydrogen, nitrogen, an alkali metal, an alkaline earth metal, iron, nickel, and silicon.

In particular, hydrogen contained in an oxide semiconductor reacts with oxygen bonded to a metal atom to be water, and thus forms oxygen vacancies in the oxide semiconductor in some cases. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy (VoH) can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, as the parameter of the oxide semiconductor, the carrier concentration assuming the state where an electric field is not applied is sometimes used instead of the donor concentration. That is, "carrier concentration" in this specification and the like can be replaced with "donor concentration" in some cases.

Consequently, hydrogen in the oxide semiconductor is preferably reduced as much as possible. Specifically, the hydrogen concentration in the oxide semiconductor that is obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

According to one embodiment of the present invention, a semiconductor device with high reliability can be provided. According to another embodiment of the present invention, a semiconductor device having favorable electrical characteristics can be provided. According to another embodiment of the present invention, a semiconductor device with a high on-state current can be provided. According to another embodiment of the present invention, a semiconductor device that can be miniaturized or highly integrated can be provided. Another object of one embodiment of the present invention is to provide a semiconductor device with low power consumption.

<<Other Semiconductor Materials>>

A semiconductor material that can be used for the oxide 530 is not limited to the above metal oxides. A semiconductor material that has a band gap (a semiconductor material that is not a zero-gap semiconductor) can be used for the oxide 530. For example, a single-element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and a chalcogenide. A chalcogenide is a compound containing a chalcogen. Chalcogen is a general term of elements belonging to Group 16, which includes oxygen, sulfur, selenium, tellurium, polonium, and livermorium. Examples of chalcogenides include transition metal chalcogenides and Group 13 chalcogenides.

As the oxide 530, a transition metal chalcogenide functioning as a semiconductor is preferably used, for example. Specific examples of the transition metal chalcogenide that can be used as the oxide 530 include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

This embodiment can be combined with any of the other embodiments as appropriate.

Embodiment 6

In this embodiment, an example in which the battery control circuit described in the above embodiment is made into an electronic component will be described using FIG. 15A and FIG. 15B.

Figure 15A:
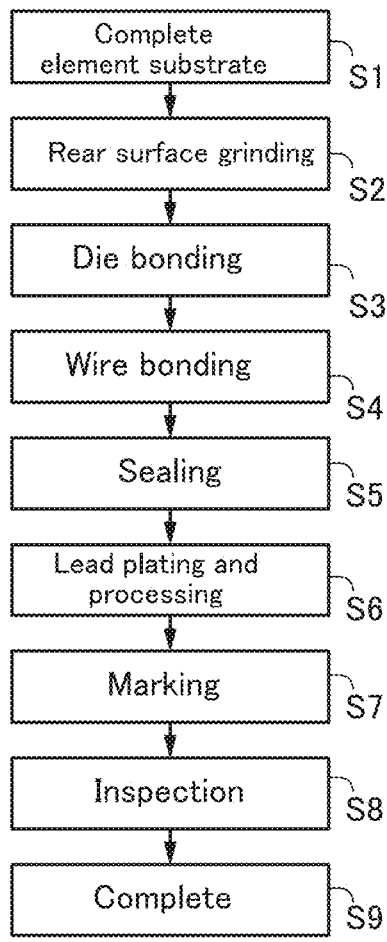
FIG. 15A is a flow chart illustrating a manufacturing process of an electronic component.

FIG. 15A shows an example in which the battery control circuit described in the above embodiment is made into an electronic component. Note that the electronic component is also referred to as a semiconductor package or an IC package. For the electronic component, there are a plurality of standards and names corresponding to a terminal extraction direction and a terminal shape. Thus, an example thereof is described in this embodiment.

A circuit portion including an OS transistor or a Si transistor is completed by integrating a plurality of detachable components on a printed circuit board through an assembly process (a post-process).

The post-process can be completed through steps shown in FIG. 15A. Specifically, after an element substrate obtained in a pre-process is completed (Step S1), a rear surface of the substrate is ground (Step S2). The substrate is thinned down at this stage, so that warpage or the like of the substrate in the pre-process is reduced and the size of the component is reduced.

The rear surface of the substrate is ground, and a dicing step is performed to divide the substrate into a plurality of chips. Then, a die bonding step of individually picking up the divided chips to be mounted on and bonded to a lead frame is performed (Step S3). To bond the chip and the lead frame in this die bonding step, a method such as bonding with a resin or bonding with a tape is selected as appropriate depending on products. Note that in the die bonding step, chips may be mounted on and bonded to an interposer.

Next, wire bonding in which a lead of the lead frame and an electrode on the chip are electrically connected with a metal fine line (wire) is performed (Step S4). A silver line or a gold line can be used as the metal fine line. Furthermore, ball bonding or wedge bonding can be used as the wire bonding.

The wire-bonded chip is subjected to sealing with an epoxy resin or the like in a molding step (Step S5). With the molding step, the inside of the electronic component is filled with a resin, so that damage to the incorporated circuit portion and wire due to external mechanical force can be reduced, and degradation in characteristics due to moisture or dust can be reduced.

Next, the lead of the lead frame is subjected to plating treatment. Then, the lead is cut and processed (Step S6). This plating treatment prevents corrosion of the lead and enables more reliable soldering at the time of mounting the electronic component on a printed circuit board in a later step.

Next, printing treatment (marking) is performed on a surface of the package (Step S7). Then, through a final inspection step (Step S8), an electronic component that includes a circuit portion including a PLD is completed (Step S9).

Figure 15B:
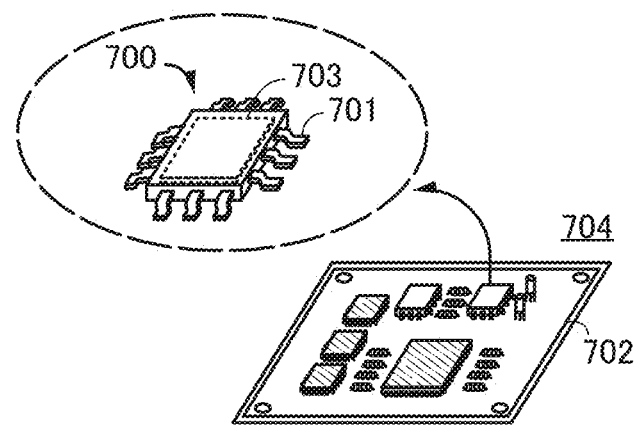
FIG. 15B is a schematic perspective view illustrating the manufacturing process of the electronic component.

FIG. 15B is a schematic perspective view of the completed electronic component. FIG. 15B shows a schematic perspective view of a QFP (Quad Flat Package) as an example of the electronic component. A lead 701 and a circuit portion 703 of an electronic component 700 are shown in FIG. 15B. The electronic component 700 shown in FIG. 15B is mounted on a printed circuit board 702, for example. A plurality of electronic components 700 that are combined and electrically connected to each other over the printed circuit board 702 can be mounted inside an electric device. A completed circuit board 704 is provided in an electric device or the like.

An example of one of the plurality of electronic components mounted on the printed circuit board 702 is an electronic component including the battery control circuit described in the foregoing embodiment. Other examples of the electronic components include a chip coil and a chip inductor. When a chip coil, a chip inductor, or the like is formed by a sputtering method, an evaporation method, or the like in the layer 385 or the layer 585, each of which is described in the foregoing embodiment, or a layer stacked over the layer 585, the area of the circuit board can be reduced in some cases.

This embodiment can be combined with any of the other embodiments as appropriate.

Embodiment 7

This embodiment will describe structures of a power storage device and a power storage system to which the electronic component including the battery control circuit described in the above embodiment can be applied.

[Cylindrical Secondary Battery]

Figure 16A:
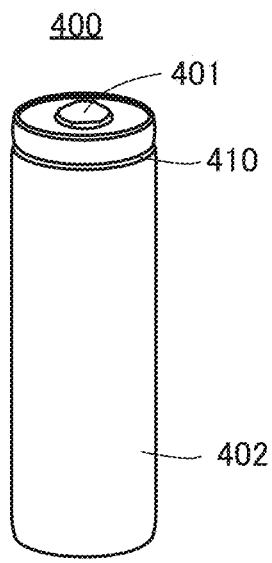
FIG. 16A is a diagram illustrating an electric device of one embodiment of the present invention.

An example of a cylindrical secondary battery is described with reference to FIG. 16A. A cylindrical secondary battery 400 includes, as illustrated in FIG. 16A, a positive electrode cap (battery lid) 401 on a top surface and a battery can (outer can) 402 on a side surface and a bottom surface. The positive electrode cap 401 and the battery can (outer can) 402 are insulated from each other by a gasket (insulating packing) 410.

Figure 16B:
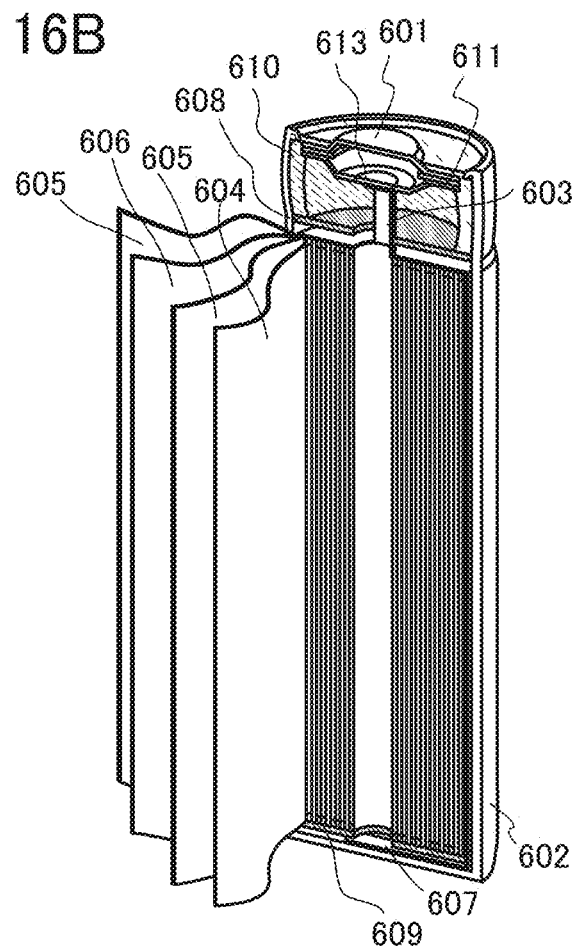
FIG. 16B is a diagram illustrating an electric device of one embodiment of the present invention.

FIG. 16B is a schematic cross-sectional view of a cylindrical secondary battery. The cylindrical secondary battery illustrated in FIG. 16B includes a positive electrode cap (battery lid) 601 on a top surface and a battery can (outer can) 602 on a side surface and a bottom surface. The positive electrode cap and the battery can (outer can) 602 are insulated from each other by a gasket (insulating gasket) 610.

Inside the battery can 602 having a hollow cylindrical shape, a battery element in which a strip-like positive electrode 604 and a strip-like negative electrode 606 are wound with a separator 605 located therebetween is provided. Although not illustrated, the battery element is wound around a center pin. One end of the battery can 602 is close and the other end thereof is open. For the battery can 602, a metal having corrosion resistance to an electrolyte solution, such as nickel, aluminum, or titanium, an alloy of such a metal, or an alloy of such a metal and another metal (e.g., stainless steel) can be used. The battery can 602 is preferably covered with nickel, aluminum, or the like in order to prevent corrosion due to the electrolyte solution. Inside the battery can 602, the battery element in which the positive electrode, the negative electrode, and the separator are wound is provided between a pair of insulating plates 608 and 609 that face each other. Furthermore, a nonaqueous electrolyte solution (not illustrated) is injected inside the battery can 602 provided with the battery element. As the nonaqueous electrolyte, a nonaqueous electrolyte that is similar to that for a coin-type secondary battery can be used.

Since a positive electrode and a negative electrode that are used for a cylindrical storage battery are wound, active materials are preferably formed on both surfaces of a current collector. A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 613 and the bottom of the battery can 602, respectively. The safety valve mechanism 613 is electrically connected to the positive electrode cap 601 through a PTC (Positive Temperature Coefficient) element 611. The safety valve mechanism 613 cuts off electrical connection between the positive electrode cap 601 and the positive electrode 604 when the internal pressure of the battery exceeds a predetermined threshold. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 16C:
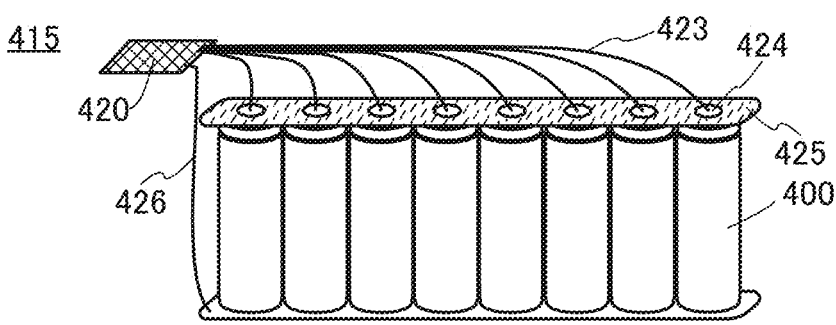
FIG. 16C is a diagram illustrating an electric device of one embodiment of the present invention.

FIG. 16C illustrates an example of a power storage system 415. The power storage system 415 includes a plurality of secondary batteries 400. Positive electrodes of the secondary batteries are in contact with and electrically connected to conductors 424 isolated by an insulator 425. The conductor 424 is electrically connected to a control circuit 420 through a wiring 423. Negative electrodes of the secondary batteries are electrically connected to the control circuit 420 through a wiring 426. As the control circuit 420, the battery control circuit described in the above embodiment can be used.

Figure 16D:
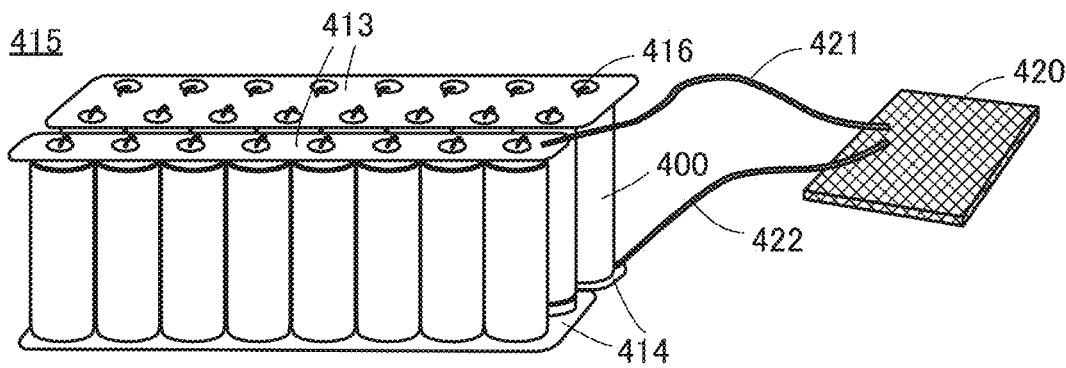
FIG. 16D is a diagram illustrating an electric device of one embodiment of the present invention.

FIG. 16D illustrates an example of the power storage system 415. The power storage system 415 includes a plurality of secondary batteries 400, and the plurality of secondary batteries 400 are sandwiched between a conductive plate 413 and a conductive plate 414. The plurality of secondary batteries 400 are electrically connected to the conductive plate 413 and the conductive plate 414 through a wiring 416. The plurality of secondary batteries 400 may be connected in parallel, connected in series, or connected in series after being connected in parallel. With the power storage system 415 including the plurality of secondary batteries 400, large electric power can be extracted.

The case where the plurality of secondary batteries 400 are connected in parallel and then further connected in series is considered. In such a case, in the power storage device illustrated in FIG. 1 or FIG. 2, for example, the battery cells 121 correspond to the plurality of secondary batteries connected in parallel, and one cell balancing circuit 130 is electrically connected to the plurality of secondary batteries connected in parallel.

A temperature control device may be provided between the plurality of secondary batteries 400. When the secondary batteries 400 are heated excessively, the temperature control device can cool them, and when the secondary batteries 400 get too cold, the temperature control device can heat them. Thus, the performance of the power storage system 415 is not easily influenced by the outside temperature.

In FIG. 16D, the power storage system 415 is electrically connected to the control circuit 420 through a wiring 421 and a wiring 422. As the control circuit 420, the battery control circuit described in the above embodiment can be used. The wiring 421 is electrically connected to the positive electrodes of the plurality of secondary batteries 400 through the conductive plate 413. The wiring 422 is electrically connected to the negative electrodes of the plurality of secondary batteries 400 through the conductive plate 414.

[Secondary Battery Pack]

Next, examples of a power storage system of one embodiment of the present invention will be described with reference to FIG. 17A, FIG. 17B, and FIG. 17C.

Figure 17A:
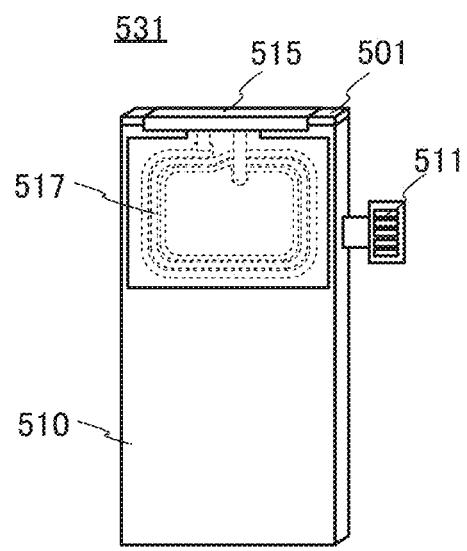
FIG. 17A is a diagram illustrating an electric device of one embodiment of the present invention.
Figure 17B:
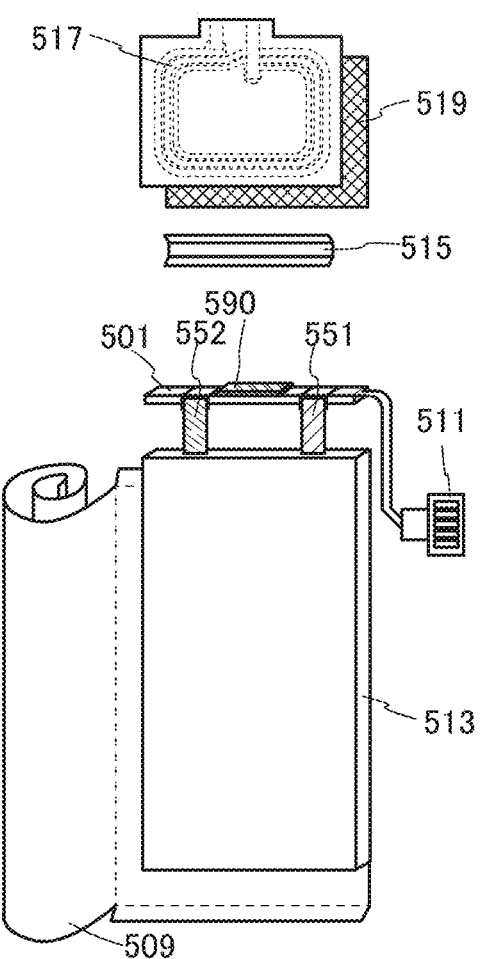
FIG. 17B is a diagram illustrating the electric device of one embodiment of the present invention.

FIG. 17A is an external view of a secondary battery pack 531. FIG. 17B illustrates a structure of the secondary battery pack 531. The secondary battery pack 531 includes a circuit board 501 and a secondary battery 513. A label 509 is attached onto the secondary battery 513. The circuit board 501 is fixed by a sealant 515. The secondary battery pack 531 also includes an antenna 517.

The circuit board 501 includes a control circuit 590. As the control circuit 590, the battery control circuit described in the above embodiment can be used. For example, as illustrated in FIG. 17B, the control circuit 590 is provided over the circuit board 501. The circuit board 501 is electrically connected to a terminal 511. The circuit board 501 is electrically connected to the antenna 517, one 551 of a positive electrode lead and a negative electrode lead of the secondary battery 513, and the other 552 of the positive electrode lead and the negative electrode lead.

Figure 17C:
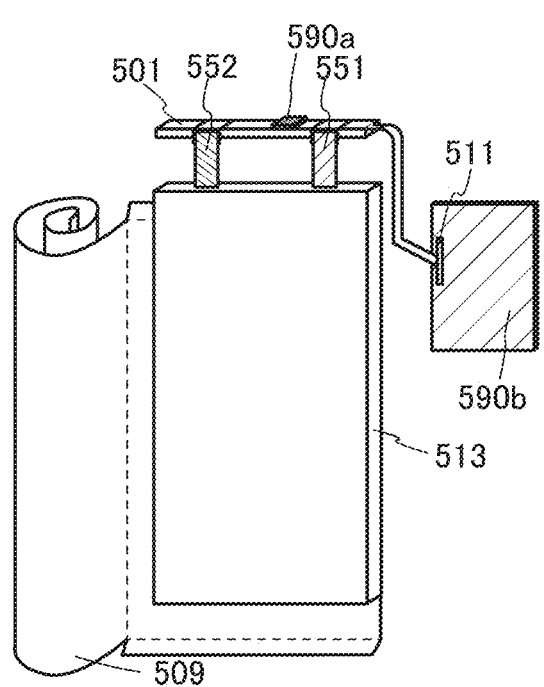
FIG. 17C is a diagram illustrating an electric device of one embodiment of the present invention.

Alternatively, as illustrated in FIG. 17C, a secondary battery pack may include a circuit system 590a provided over the circuit board 501 and a circuit system 590b electrically connected to the circuit board 501 through the terminal 511. For example, a part of the control circuit of one embodiment of the present invention is provided in the circuit system 590a, and another part thereof is provided in the circuit system 590b.

The shape of the antenna 517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 517 may be a flat-plate conductor. This flat-plate conductor can serve as one of conductors for electric field coupling. That is, the antenna 517 may serve as one of two conductors of a capacitor. Thus, electric power can be transmitted and received not only by an electromagnetic field or a magnetic field but also by an electric field.

The secondary battery pack 531 includes a layer 519 between the antenna 517 and the secondary battery 513. The layer 519 has a function of blocking an electromagnetic field from the secondary battery 513, for example. For the layer 519, a magnetic material can be used, for instance.

The secondary battery 513 is obtained, for example, by winding a sheet of a stack in which the negative electrode and the positive electrode overlap each other with the separator positioned therebetween.

This embodiment can be combined with any of the other embodiments as appropriate.

Embodiment 8

This embodiment will describe examples in which the power storage system of one embodiment of the present invention is mounted on a vehicle. Examples of vehicles include automobiles, motorcycles, and bicycles.

The use of power storage systems in vehicles enables production of next-generation clean energy vehicles such as hybrid electric vehicles (HEVs), electric vehicles (EVs), and plug-in hybrid electric vehicles (PHEVs).

Figure 18A:
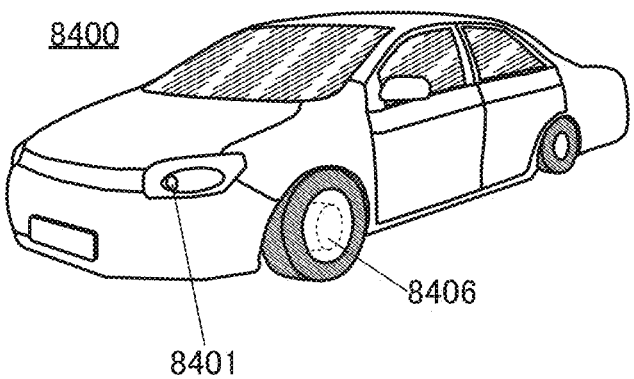
FIG. 18A is a diagram illustrating an electric device of one embodiment of the present invention.
Figure 18B:
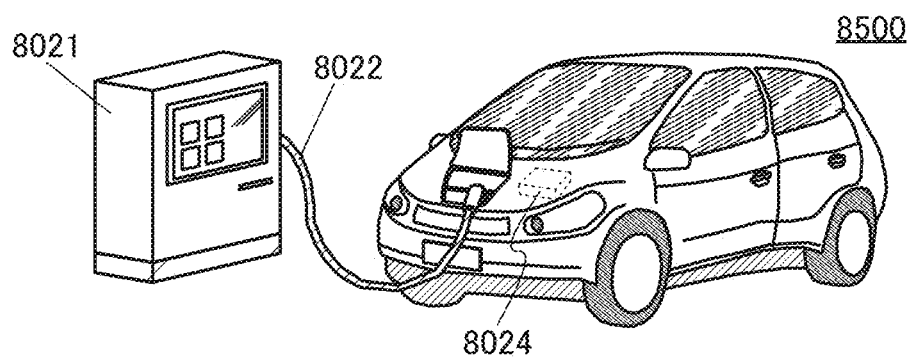
FIG. 18B is a diagram illustrating an electric device of one embodiment of the present invention.
Figure 18C:
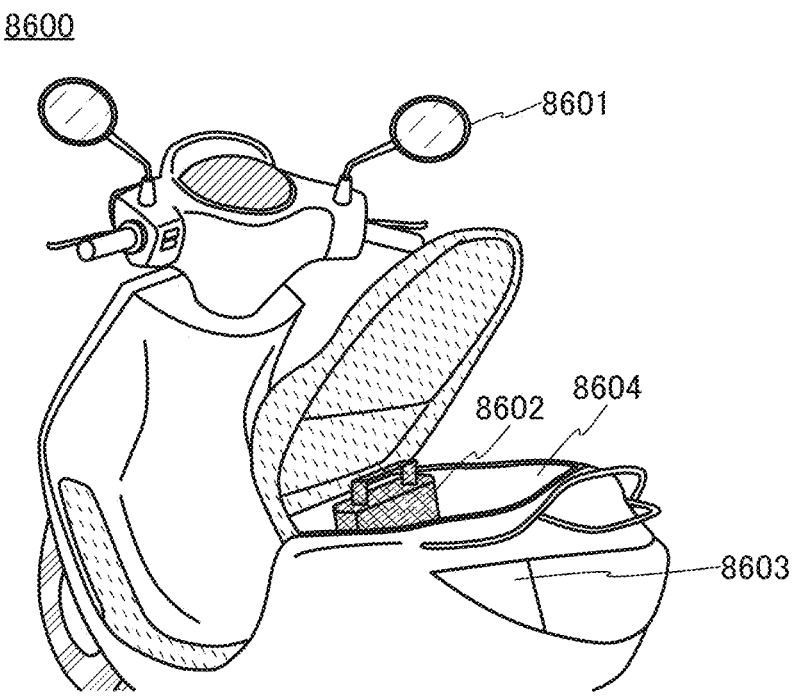
FIG. 18C is a diagram illustrating an electric device of one embodiment of the present invention.

FIG. 18A, FIG. 18B, and FIG. 18C illustrate examples of vehicles using the power storage system of one embodiment of the present invention. An automobile 8400 illustrated in FIG. 18A is an electric vehicle that runs on the power of an electric moto as a power source. Alternatively, the automobile 8400 is a hybrid electric vehicle capable of driving appropriately using either an electric motor or an engine as a power source. The use of one embodiment of the present invention can achieve a high-mileage vehicle. The automobile 8400 includes a power storage system. The power storage system is used not only for driving an electric motor 8406, but also for supplying electric power to a light-emitting device such as a headlight 8401 or a room light (not illustrated).

The power storage system can also supply electric power to a display device of a speedometer, a tachometer, or the like included in the automobile 8400. Furthermore, the power storage system can supply electric power to a navigation system or the like included in the automobile 8400.

An automobile 8500 illustrated in FIG. 18B can be charged when a power storage system 8024 included in the automobile 8500 is supplied with electric power from external charging equipment by a plug-in system, a contactless power feeding system, or the like. FIG. 18B illustrates the state in which the power storage system 8024 included in the automobile 8500 is charged with a ground-based charging device 8021 through a cable 8022. For charging, a given method such as CHAdeMO (registered trademark) or Combined Charging System is employed as a charge method, the standard of a connector, or the like as appropriate. The charging device 8021 may be a charging station provided in a commerce facility or a household power source. With the use of a plug-in technique, the power storage system 8024 included in the automobile 8500 can be charged by being supplied with electric power from the outside, for example. Charging can be performed by converting AC electric power into DC electric power through a converter such as an AC-DC converter.

Furthermore, although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven. The contactless power feeding system may be utilized to perform transmission and reception of electric power between vehicles. Furthermore, a solar cell may be provided in the exterior of the vehicle to charge the power storage system when the vehicle stops or moves.

To supply electric power in such a contactless manner, an electromagnetic induction method or a magnetic resonance method can be used.

FIG. 18C shows an example of a motorcycle using the power storage system of one embodiment of the present invention. A motor scooter 8600 illustrated in FIG. 18C includes a power storage system 8602, side mirrors 8601, and indicator lights 8603. The power storage system 8602 can supply electricity to the indicator lights 8603.

In the motor scooter 8600 illustrated in FIG. 18C, the power storage system 8602 can be stored in an under-seat storage unit 8604. The power storage system 8602 can be stored in the under-seat storage unit 8604 even with a small size.

Figure 19A:
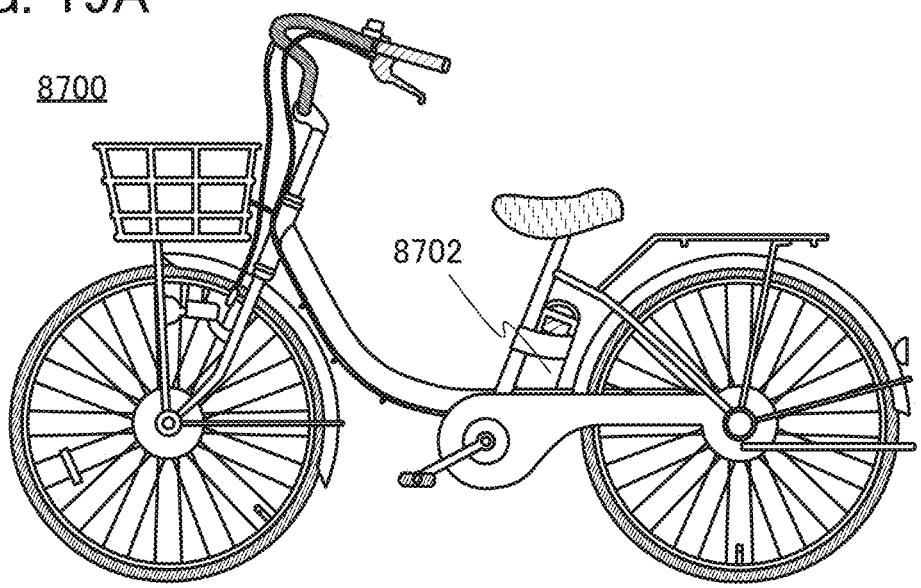
FIG. 19A is a diagram illustrating an electric device of one embodiment of the present invention.

FIG. 19A shows an example of an electric bicycle using the power storage system of one embodiment of the present invention. The power storage system of one embodiment of the present invention can be used for an electric bicycle 8700 illustrated in FIG. 19A. The power storage system of one embodiment of the present invention includes a plurality of storage batteries, a protection circuit, and a neural network, for example.

Figure 19B:
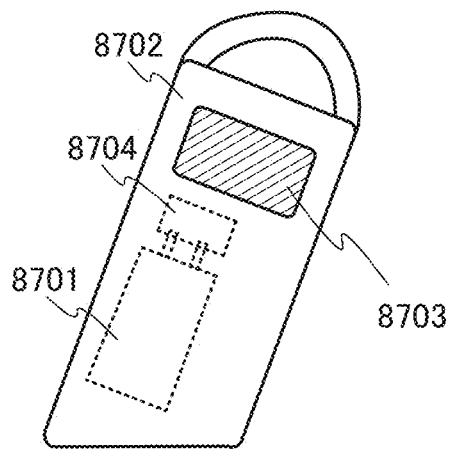
FIG. 19B is a diagram illustrating the electric device of one embodiment of the present invention.

The electric bicycle 8700 includes a power storage system 8702. The power storage system 8702 can supply electricity to a motor that assists a rider. The power storage system 8702 is portable, and FIG. 19B illustrates the state where the power storage system 8702 is detached from the bicycle. A plurality of storage batteries 8701 included in the power storage system of one embodiment of the present invention are incorporated in the power storage system 8702, and the remaining battery capacity and the like can be displayed on a display portion 8703. The power storage system 8702 also includes a control circuit 8704 of one embodiment of the present invention. The control circuit 8704 is electrically connected to a positive electrode and a negative electrode of the storage battery 8701. The battery control circuit described in the above embodiment can be used as the control circuit 8704.

This embodiment can be combined with any of the other embodiments as appropriate.

Embodiment 9

This embodiment will describe examples in which the power storage system described in the above embodiment is mounted on an electronic device.

Figure 20A:
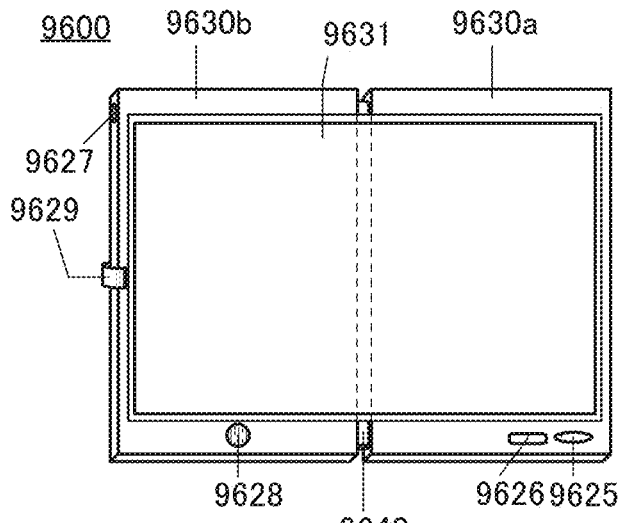
FIG. 20A is a diagram illustrating an electric device of embodiment of the present invention.
Figure 20B:
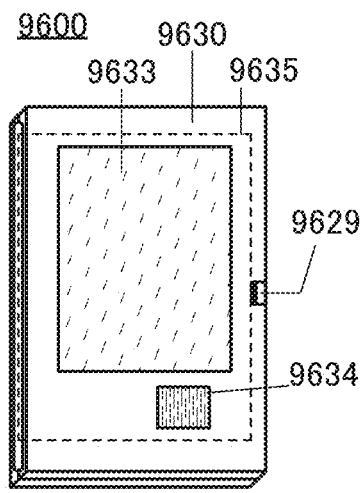
FIG. 20B is a diagram illustrating the electric device of one embodiment of the present invention.

FIG. 20A and FIG. 20B illustrate an example of a tablet terminal that can be folded in half (including a clamshell tablet). A tablet terminal 9600 illustrated in FIG. 20A and FIG. 20B includes a housing 9630a, a housing 9630b, a movable portion 9640 connecting the housing 9630a and the housing 9630b, a display portion 9631, a display mode changing switch 9626, a power switch 9627, a power saving mode changing switch 9625, a fastener 9629, and an operation switch 9628. A flexible panel is used for the display portion 9631, whereby a tablet terminal having a larger display portion can be provided. FIG. 20A illustrates the tablet terminal 9600 that is opened, and FIG. 20B illustrates the tablet terminal 9600 that is closed.

The tablet terminal 9600 includes a power storage unit 9635 inside the housing 9630a and the housing 9630b. The power storage unit 9635 is provided across the housing 9630a and the housing 9630b, passing through the movable portion 9640.

Part of the display portion 9631 can be a touch panel region, and data can be input when a displayed operation key is touched. When a position where a keyboard display switching button is displayed on the touch panel is touched with a finger, a stylus, or the like, keyboard buttons can be displayed on the display portion 9631.

The display mode changing switch 9626 can switch the display between a portrait mode and a landscape mode, and between monochrome display and color display, for example. With the power saving mode changing switch 9625, display luminance can be optimized in accordance with the amount of external light in use, which is detected with an optical sensor incorporated in the tablet terminal 9600. Another detection device including a sensor for detecting inclination, such as a gyroscope sensor or an acceleration sensor, may be incorporated in the tablet terminal, in addition to the optical sensor.

FIG. 20B shows the tablet terminal 9600 that is closed, and the tablet terminal 9600 includes the housing 9630, a solar cell 9633, and the power storage system of one embodiment of the present invention. The power storage system includes a control circuit 9634 and the power storage unit 9635. The battery control circuit described in the above embodiment can be used as the control circuit 9634.

The tablet terminal 9600 can be folded in half and thus can be folded such that the housing 9630a and the housing 9630b overlap with each other when not in use. Thus, the display portion 9631 can be protected owing to the folding, which increases the durability of the tablet terminal 9600.

The tablet terminal illustrated in FIG. 20A and FIG. 20B can also have a function of displaying various kinds of information (a still image, a moving image, a text image, and the like), a function of displaying a calendar, a date, the time, or the like on the display portion, a touch-input function of operating or editing information displayed on the display portion by touch input, a function of controlling processing by various kinds of software (programs), and the like.

The solar cell 9633, which is attached on the surface of the tablet terminal, supplies electric power to the touch panel, the display portion, an image signal processor, and the like. Note that the solar cell 9633 can be provided on one surface or both surfaces of the housing 9630, and the power storage unit 9635 can be charged efficiently.

Figure 20C:
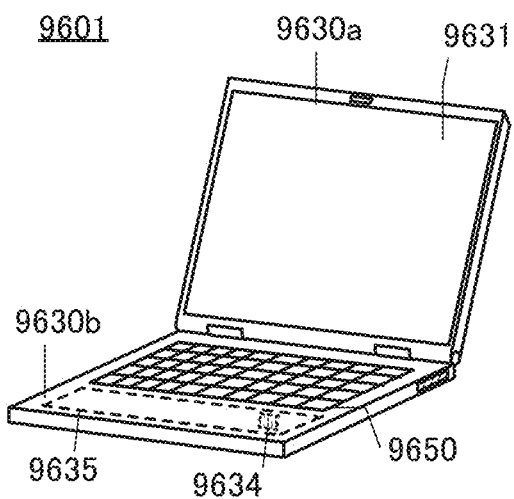
FIG. 20C is a diagram illustrating an electric device of one embodiment of the present invention.

Note that although FIG. 20A and FIG. 20B illustrate a structure in which the control circuit using the battery control circuit described in the above embodiment is used for a tablet terminal that can be folded in half, another structure may be employed. For example, application to a laptop personal computer that is a clamshell terminal is possible as illustrated in FIG. 20C. FIG. 20C illustrates a laptop personal computer 9601 including a display portion 9631 in a housing 9630a and a keyboard portion 9650 in a housing 9630b. The laptop personal computer 9601 includes the control circuit 9634 and the power storage unit 9635, which are described with reference to FIG. 20A and FIG. 20B. The battery control circuit described in the above embodiment can be used as the control circuit 9634.

Figure 21:
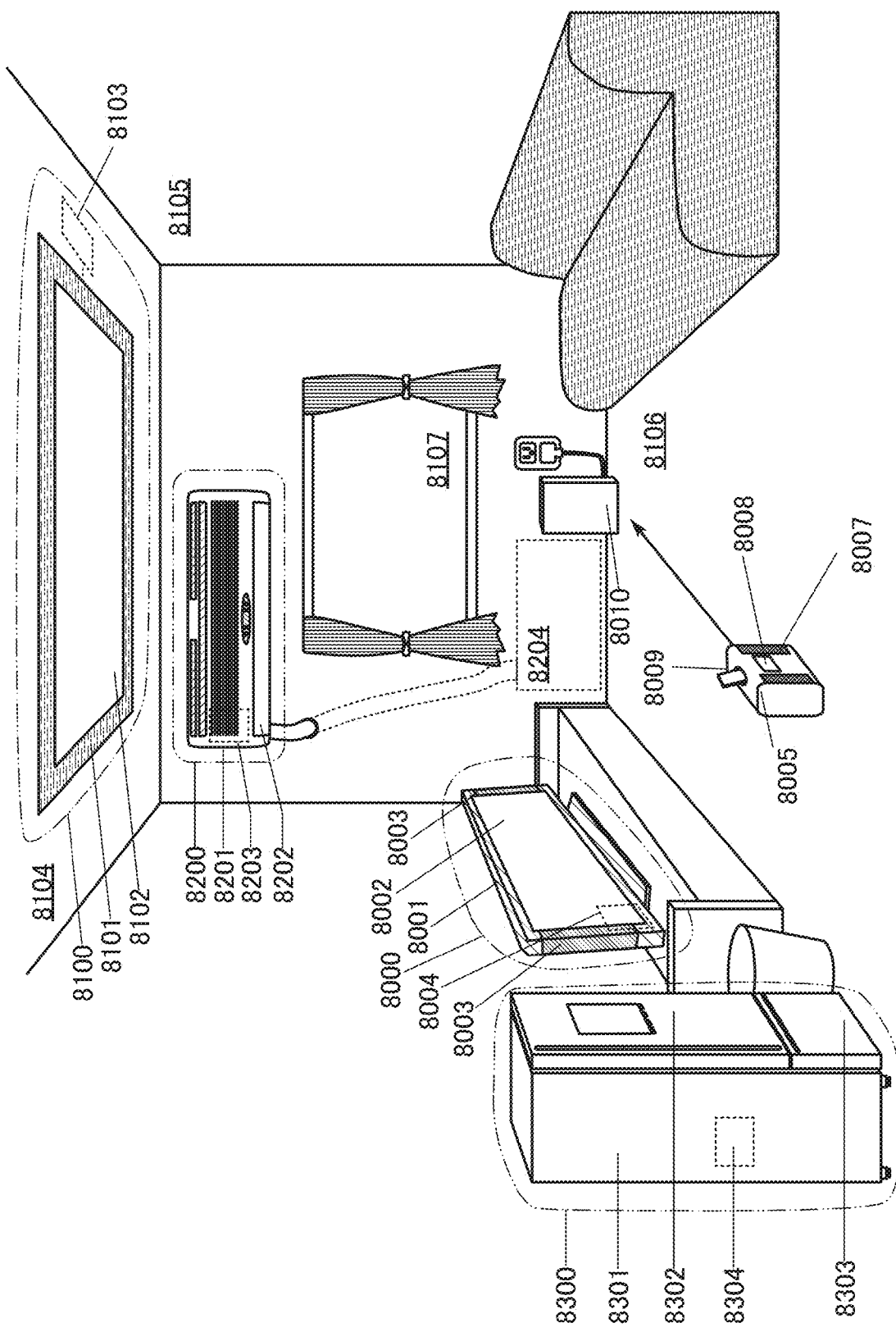
FIG. 21 is a diagram illustrating electric devices of embodiments of the present invention.

FIG. 21 illustrates other examples of electronic devices. In FIG. 21, a display device 8000 is an example of an electronic device including the power storage system of one embodiment of the present invention. Specifically, the display device 8000 corresponds to a display device for TV broadcast reception and includes a housing 8001, a display portion 8002, speaker portions 8003, a secondary battery 8004, and the like. A detection system according to one embodiment of the present invention is provided in the housing 8001. The display device 8000 can receive electric power from a commercial power supply and can use electric power stored in the secondary battery 8004.

A semiconductor display device such as a liquid crystal display device, a light-emitting device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

An audio input device 8005 also uses a secondary battery. The audio input device 8005 includes the power storage system described in the above embodiment. The audio input device 8005 includes a plurality of sensors (e.g., an optical sensor, a temperature sensor, a humidity sensor, a pressure sensor, an illuminance sensor, and a motion sensor) including a microphone, in addition to wireless communication elements. In accordance with an instruction spoken by a user, the audio input device 8005 can operate another device, for example, control power on/off of the display device 8000 and adjust the amount of light from a lighting device 8100. The audio input device 8005 is capable of operating a peripheral device with voice and substitutes for a manual remote controller.

The audio input device 8005 includes a wheel or a mechanical transfer means and is configured to be capable of, while listening to an instruction precisely with the incorporated microphone by moving in the direction in which speaking by the user can be heard, displaying the content on a display portion 8008 or performing touch input operation on the display portion 8008.

The audio input device 8005 can also function as a charging dock of a portable information terminal 8009 such as a smartphone. Electric power can be transmitted and received with a wire or wirelessly between the portable information terminal 8009 and the audio input device 8005. The portable information terminal 8009 does not particularly need to be carried indoors, and a load on the secondary battery and degradation thereof are desirably avoided while a necessary capacity is ensured. Thus, management, maintenance, and the like of the secondary battery are desirably performed by the audio input device 8005. Since the audio input device 8005 includes the speaker 8007 and the microphone, hands-free conversation is possible even while the portable information terminal 8009 is charged. When the capacity of the secondary battery of the audio input device 8005 decreases, the audio input device 8005 moves in the direction indicated by the arrow and is charged by wireless charging from a charging module 8010 connected to an external power source.

The audio input device 8005 may be put on a stand. The audio input device 8005 may be provided with a wheel or a mechanical transfer means to move to a desired position. Alternatively, without having a stand or a wheel, the audio input device 8005 may be fixed to a desired position, for example, on the floor or the like.

Note that the display device includes, in its category, all of information display devices for personal computers, advertisement displays, and the like besides for TV broadcast reception.

In FIG. 21, the installation lighting device 8100 is an example of an electronic device using a secondary battery 8103 that is controlled by a microprocessor for controlling charge (including an APS). Specifically, the lighting device 8100 includes a housing 8101, alight source 8102, the secondary battery 8103, and the like. Although FIG. 21 illustrates an example of the case where the secondary battery 8103 is provided in a ceiling 8104 on which the housing 8101 and the light source 8102 are installed, the secondary battery 8103 may be provided in the housing 8101. The lighting device 8100 can receive electric power from a commercial power supply and can use electric power stored in the secondary battery 8103.

Note that although the installation lighting device 8100 provided on the ceiling 8104 is illustrated in FIG. 21 as an example, the secondary battery 8103 can be used in an installation lighting device provided in, for example, a side wall 8105, a floor 8106, a window 8107, or the like other than the ceiling 8104. Alternatively, the secondary battery can be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element are given as.

In FIG. 21, an air conditioner including an indoor unit 8200 and an outdoor unit 8204 is an example of an electronic device using a secondary battery 8203. Specifically, the indoor unit 8200 includes a housing 8201, an air outlet 8202, the secondary battery 8203, and the like. Although FIG. 21 illustrates an example of the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can receive electric power from a commercial power supply and can use electric power stored in the secondary battery 8203.

In FIG. 21, an electric refrigerator-freezer 8300 is an example of an electronic device using a secondary battery 8304. Specifically, the electric refrigerator-freezer 8300 includes a housing 8301, a refrigerator door 8302, a freezer door 8303, the secondary battery 8304, and the like. The secondary battery 8304 is provided in the housing 8301 in FIG. 21. The electric refrigerator-freezer 8300 can receive electric power from a commercial power supply and can use electric power stored in the secondary battery 8304.

In addition, in a time period when electronic devices are not used, particularly when the proportion of the amount of electric power that is actually used to the total amount of electric power that can be supplied from a commercial power supply source (such a proportion is referred to as a usage rate of electric power) is low, electric power is stored in the secondary battery, whereby the usage rate of electric power can be reduced in a time period other than the above time period. For example, in the case of the electric refrigerator-freezer 8300, electric power is stored in the secondary battery 8304 in night time when the temperature is low and the refrigerator door 8302 and the freezer door 8303 are not opened and closed. On the other hand, in daytime when the temperature is high and the refrigerator door 8302 and the freezer door 8303 are opened and closed, the secondary battery 8304 is used as an auxiliary power supply; thus, the usage rate of electric power in daytime can be reduced.

A secondary battery can be provided in any electronic device other than the above-described electronic devices. According to one embodiment of the present invention, the secondary battery can have excellent cycle characteristics. Thus, a microprocessor that controls charge (including an APS) of one embodiment of the present invention is mounted on the electronic device described in this embodiment, whereby an electronic device with a longer lifetime can be obtained. This embodiment can be implemented in appropriate combination with the other embodiments.

FIG. 22A to FIG. 22E show examples in which the power storage system of one embodiment of the present invention is mounted on an electronic device. Examples of electronic devices using the power storage system of one embodiment of the present invention include television sets (also referred to as televisions or television receivers), monitors of computers and the like, digital cameras, digital video cameras, digital photo frames, mobile phones (also referred to as cellular phones or mobile phone devices), portable game machines, portable information terminals, audio reproducing devices, and large game machines such as pachinko machines.

Figure 22A:
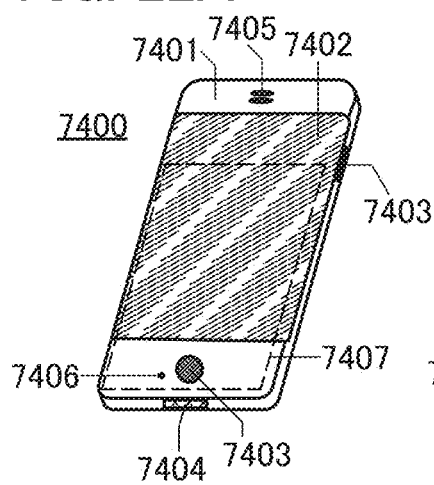
FIG. 22A is a diagram illustrating an electric device of one embodiment of the present invention.

FIG. 22A illustrates an example of a mobile phone. A mobile phone 7400 includes an operation button 7403, an external connection port 7404, a speaker 7405, a microphone 7406, and the like in addition to a display portion 7402 incorporated in a housing 7401. The mobile phone 7400 includes the power storage system of one embodiment of the present invention. The power storage system of one embodiment of the present invention includes, for example, a storage battery 7407 and the battery control circuit described in the above embodiment.

Figure 22B:
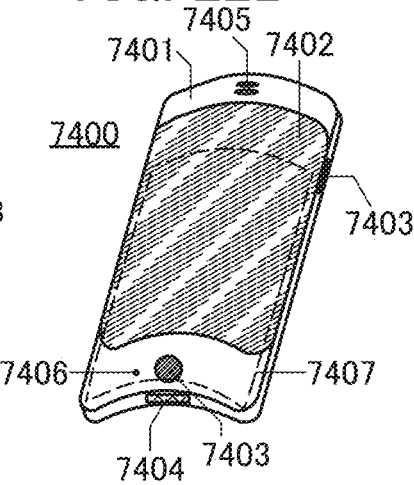
FIG. 22B is a diagram illustrating the electric device of one embodiment of the present invention.
Figure 22C:
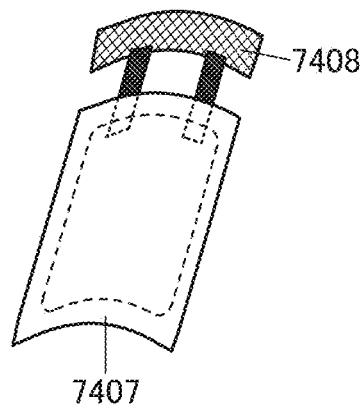
FIG. 22C is a diagram illustrating the electric device of one embodiment of the present invention.

FIG. 22B illustrates the mobile phone 7400 in a bent state. When the mobile phone 7400 is entirely curved by external force, the storage battery 7407 provided therein is also curved in some cases. In such a case, a storage battery having flexibility is preferably used as the storage battery 7407. FIG. 22C illustrates the state where the storage battery having flexibility is curved. A control circuit 7408 is electrically connected to the storage battery. The battery control circuit described in the above embodiment can be used as the control circuit 7408.

A storage battery having a flexible shape can also be incorporated along a curved surface of an inside wall or an outside wall of a house or a building or an interior or an exterior of an automobile.

Figure 22D:
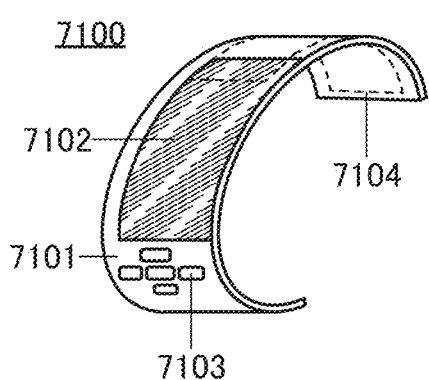
FIG. 22D is a diagram illustrating an electric device of one embodiment of the present invention.

FIG. 22D illustrates an example of a bangle-type display device. A portable display device 7100 includes a housing 7101, a display portion 7102, operation buttons 7103, and the power storage system of one embodiment of the present invention. The power storage system of one embodiment of the present invention includes, for example, a storage battery 7104 and the battery control circuit described in the above embodiment.

Figure 22E:
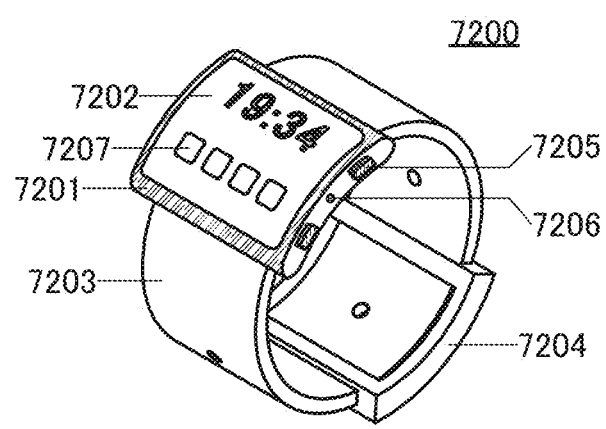
FIG. 22E is a diagram illustrating an electric device of one embodiment of the present invention.

FIG. 22E illustrates an example of a watch-type portable information terminal. A portable information terminal 7200 includes a housing 7201, a display portion 7202, a band 7203, a buckle 7204, an operation button 7205, an input/output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is curved, and images can be displayed on the curved display surface. In addition, the display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operating system incorporated in the portable information terminal 7200.

The portable information terminal 7200 can employ near field communication based on an existing communication standard. For example, mutual communication between the portable information terminal 7200 and a headset capable of wireless communication can be performed, and thus hands-free calling is possible.

The portable information terminal 7200 includes the input/output terminal 7206, and data can be directly transmitted to and received from another information terminal via a connector. In addition, charging via the input/output terminal 7206 is possible. Note that the charging operation may be performed by wireless power feeding without using the input/output terminal 7206.

The portable information terminal 7200 includes the power storage system of one embodiment of the present invention. The power storage system includes a storage battery and the battery control circuit described in the above embodiment.

The portable information terminal 7200 preferably includes a sensor. As the sensor, for example, a human body sensor such as a fingerprint sensor, a pulse sensor, or a temperature sensor, a touch sensor, a pressure sensitive sensor, or an acceleration sensor is preferably mounted.

This embodiment can be combined with any of the other embodiments as appropriate.

Embodiment 10

This embodiment will describe an example of a system including the battery control circuit of one embodiment of the present invention.

Figure 23A:
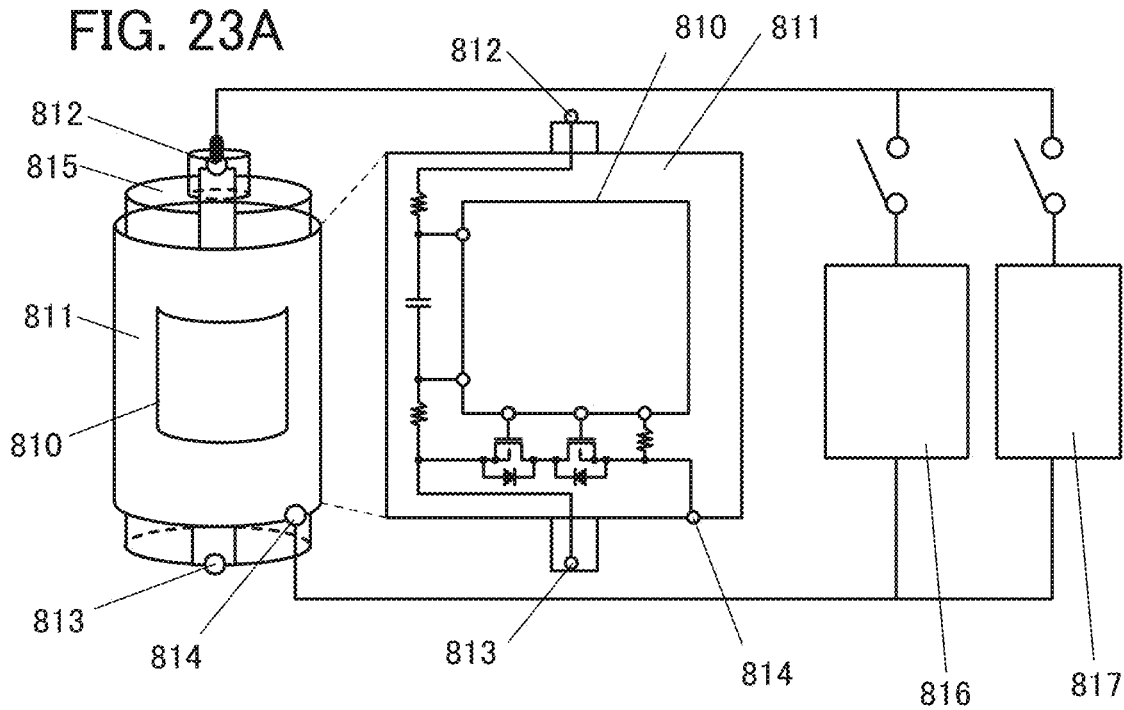
FIG. 23A, FIG. 23B, and FIG. 23C show an example of a system of one embodiment of the present invention.

FIG. 23A is a conceptual diagram of a battery control system in which a semiconductor device 810 formed over a flexible substrate 811 that is a flexible film is mounted on a cylindrical secondary battery 815.

As the semiconductor device 810, the semiconductor device 900 described in the foregoing embodiment can be used, for example. Alternatively, as the semiconductor device 810, some components of the semiconductor device 900 described in the foregoing embodiment, such as the components provided in the layer 585, may be used, for example.

The battery control system of one embodiment of the present invention includes at least the cylindrical secondary battery 815, the semiconductor device 810, and a switch.

The cylindrical secondary battery 815 includes a first terminal 812 on the top surface and a second terminal 813 on the bottom surface. A first transmission path which is connected to the first terminal 812 of the cylindrical secondary battery and through which electric power output from the cylindrical secondary battery 815 is transmitted is electrically connected to a terminal of the charge control circuit through an electrode 818. A second transmission path connected to the second terminal 813 of the cylindrical secondary battery is connected through an electrode 819 to a switch that interrupts the second transmission path.

In FIG. 23A, two switches for interrupting the second transmission path (also referred to as interrupter switches) are provided, diodes are connected to the respective switches, and they function as a protection circuit for preventing overdischarge, overcharge, or overcurrent. The switch controls conducting and interrupting operations and can also be referred to as a switching means that switches between supply and interrupt. A third terminal 814 that is the other terminal of the second transmission path and formed over the flexible substrate 811 is connected to a charger 816 and a mobile device 817.

As a manufacturing method for forming the semiconductor device 810 over the flexible substrate 811, a method in which the semiconductor device is formed on a semiconductor substrate, and then separated by a separation method and fixed onto the flexible substrate 811 is employed. A known technique can be used in the separation method. Alternatively, a method in which the semiconductor device is formed on a semiconductor substrate, a rear surface is polished, and then the semiconductor device is fixed onto the flexible substrate 811 may be employed. Alternatively, a method in which the semiconductor device is subjected to what is called laser cutting, by which the semiconductor device is partly cut with laser light, and then is fixed onto the flexible substrate 811 may be employed. Alternatively, a method in which the semiconductor device 810 is directly formed over the flexible substrate 811 may be employed. Alternatively, a method in which the semiconductor device 810 formed over a glass substrate is separated by a separation method and then fixed onto the flexible substrate 811 is used.

Although this embodiment shows the example where these diodes and switches are also formed over or mounted on the flexible substrate 811, the structure is not particularly limited thereto.

In the case where the semiconductor device 810 detects an abnormality such as a micro-short circuit, the second transmission path can be interrupted by input of a signal to a gate of the switch for interrupting the second transmission path. By interrupting the second transmission path, the supply of a current from the charger 816 or the supply of a current to the mobile device 817 can be stopped. Furthermore, when a signal voltage applied to the gate of the switch for interrupting the second transmission path is retained in a memory circuit (including a transistor using an oxide semiconductor), interrupt can be maintained for a long time. Thus, a highly safe charge control system can be achieved.

Figure 23B:
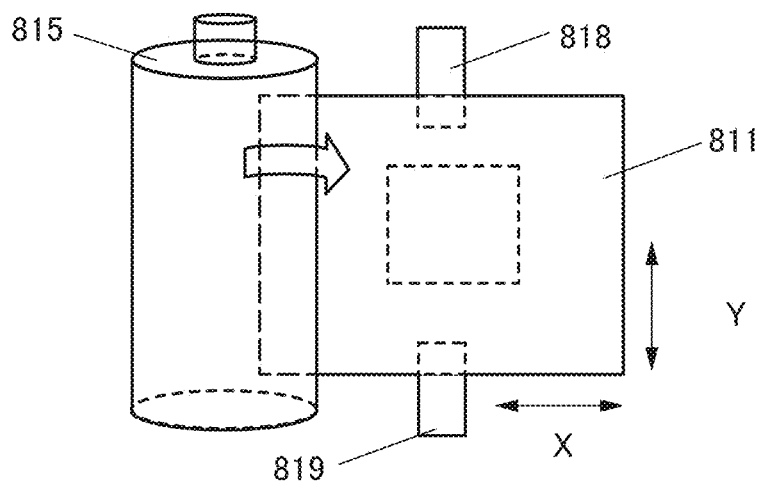
Figure 23C:
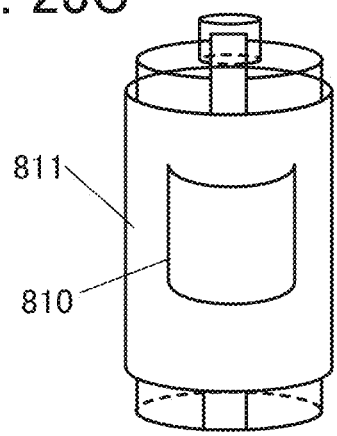

FIG. 23B is a diagram illustrating a step right before bonding of the cylindrical secondary battery 815 and the flexible substrate 811 and illustrates the contact surface side of the flexible substrate 811. As illustrated in FIG. 23B, the body of the cylindrical secondary battery 815 is put and rolled on the contact surface of the flexible substrate 811, so that the flexible substrate 811 winds around and attaches to the body in the circumference direction. The electrode 818 and the electrode 819 are disposed in the Y direction over the flexible substrate 811; however, without particular limitation, one of them may be displaced in the X direction. Note that FIG. 23C is a diagram illustrating the state after rolling.

An exterior film is equipped to cover an outer peripheral surface of the body of the cylindrical secondary battery 815. This exterior film is used to protect a metal can that seals the internal structure of the secondary battery and keep the insulation from the metal can.

In the case where an exterior film is not used and the outer surface (excluding the terminal portion) of the cylindrical secondary battery 815 is a metal surface, it is preferable to provide an insulating sheet between the metal surface and each of the electrode 818 and the electrode 819. The electrode 818 or the electrode 819 is conductive metal foil, a conductive tape formed of a conductive material, or a lead wire and is connected to the terminals of the cylindrical secondary battery 815 by a known method such as soldering or a wire bonding method. Furthermore, the electrode 818 or the electrode 819 is connected to the terminals of the charge control circuit by soldering or a wire bonding method.

In the case where electric power is supplied from the cylindrical secondary battery 815 to the mobile device 817 as illustrated in FIG. 23A, the cylindrical secondary battery 815 enters a discharging state. The semiconductor device 810 monitors the behavior of a voltage, a current, and the like of the first terminal 812 and the second terminal 813 and, when detecting an abnormality, interrupts the second transmission path to stop discharging.

The mobile device 817 refers to the structure except the secondary battery, and the power source for the mobile device 817 is the cylindrical secondary battery 815. Note that the mobile device 817 is a portable electronic device that can be carried around.

In the case where the cylindrical secondary battery 815 is charged with electric power supplied from the charger 816, the cylindrical secondary battery 815 enters a charging state. The semiconductor device 810 monitors the behavior of a voltage, a current, and the like of the first terminal 812 and the second terminal 813 and, when detecting an abnormality, interrupts the second transmission path to stop charging.

The charger 816 refers to a device including an adaptor connected to an external power source and a device that performs power transmission using a wireless signal. Note that the charger 816 is sometimes incorporated into the mobile device 817.

FIG. 23 illustrates the example of a cylindrical secondary battery; as a different example, FIG. 24 illustrates an example where a semiconductor device 964 formed over a flexible substrate 910 that is a flexible film is mounted on a flat secondary battery 963.

The semiconductor device 964 is formed over or fixed to the flexible substrate 910. The semiconductor device 964 detects an abnormality such as a micro-short circuit. Furthermore, the semiconductor device 964 may have a function of a protection circuit for protecting the secondary battery 963 from overcharge, overdischarge, and overcurrent.

As the semiconductor device 964, the semiconductor device 900 described in the foregoing embodiment can be used, for example. Alternatively, the semiconductor device 810 may include some components of the semiconductor device 900 described in the foregoing embodiment, for example, the components provided in the layer 585.

An antenna, a receiver circuit, and a rectifier circuit may be provided in addition to the semiconductor device 964. Contactless charging of the secondary battery 963 can also be performed using the antenna. The shape of the antenna is not limited to a coil shape and may be a linear shape or a plate shape, for example. An antenna such as a planar antenna, an aperture antenna, a traveling-wave antenna, an EH antenna, a magnetic-field antenna, or a dielectric antenna may be used. The antenna has a function of communicating data with an external device, for example. As a system for communication using the antenna between a battery pack and another device, a response method that can be used between the battery pack and another device, such as NFC, can be employed.

Figure 24A:
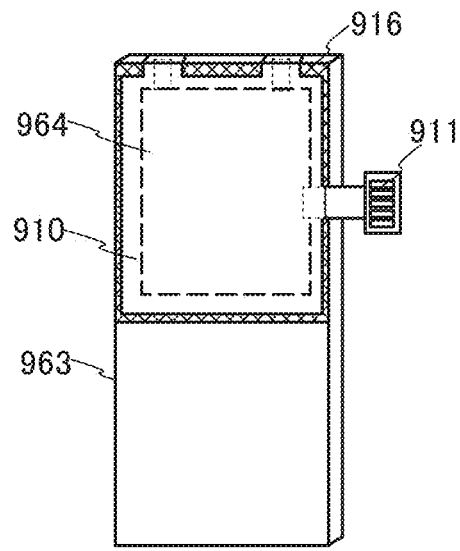
FIG. 24A and FIG. 24B show an example of a system of one embodiment of the present invention.
Figure 24B:
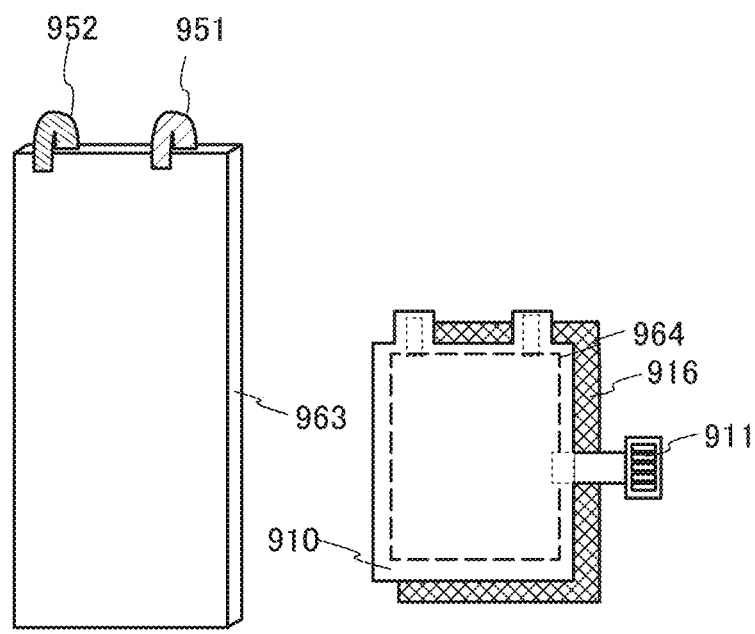

As illustrated in FIG. 24B, a connection terminal 911 is electrically connected to a terminal 951 and a terminal 952 of the secondary battery 963 through the semiconductor device 964. Note that a plurality of connection terminals 911 serving as a control signal input terminal, a power supply terminal, and the like may be provided.

The battery pack includes an insulating sheet layer 916 between the semiconductor device 964 and the secondary battery 963. The insulating sheet layer 916 has a function of preventing a short circuit due to the secondary battery 963, for example. As the insulating sheet layer 916, an organic resin film or an adhesive sheet can be used, for example.

FIG. 24A illustrates an example in which the insulating sheet layer 916 is provided on a surface of a housing and the flexible substrate is fixed with a surface provided with the semiconductor device 964 positioned on the inner side; however, without particular limitation, the surface provided with the charge control circuit may be positioned on the outer side and be connected to the terminal 951 and the terminal 952. However, the connection portion is exposed in such a case, and thus assembly should be performed carefully in consideration of a risk of electrostatic breakdown or a short circuit.

The example of providing the semiconductor device 964 over the flexible substrate is described above; however, without particular limitation, a protection circuit, an interrupter switch, an antenna, a sensor, and the like may be provided over the same substrate. The semiconductor device 964 is formed over the flexible substrate, is bendable, and can detect an abnormality such as a micro-short circuit of a secondary battery. Moreover, the semiconductor device of one embodiment of the present invention can be provided on a side surface of a secondary battery, and thus can achieve space saving and a reduction in the number of components.

Figure 25:
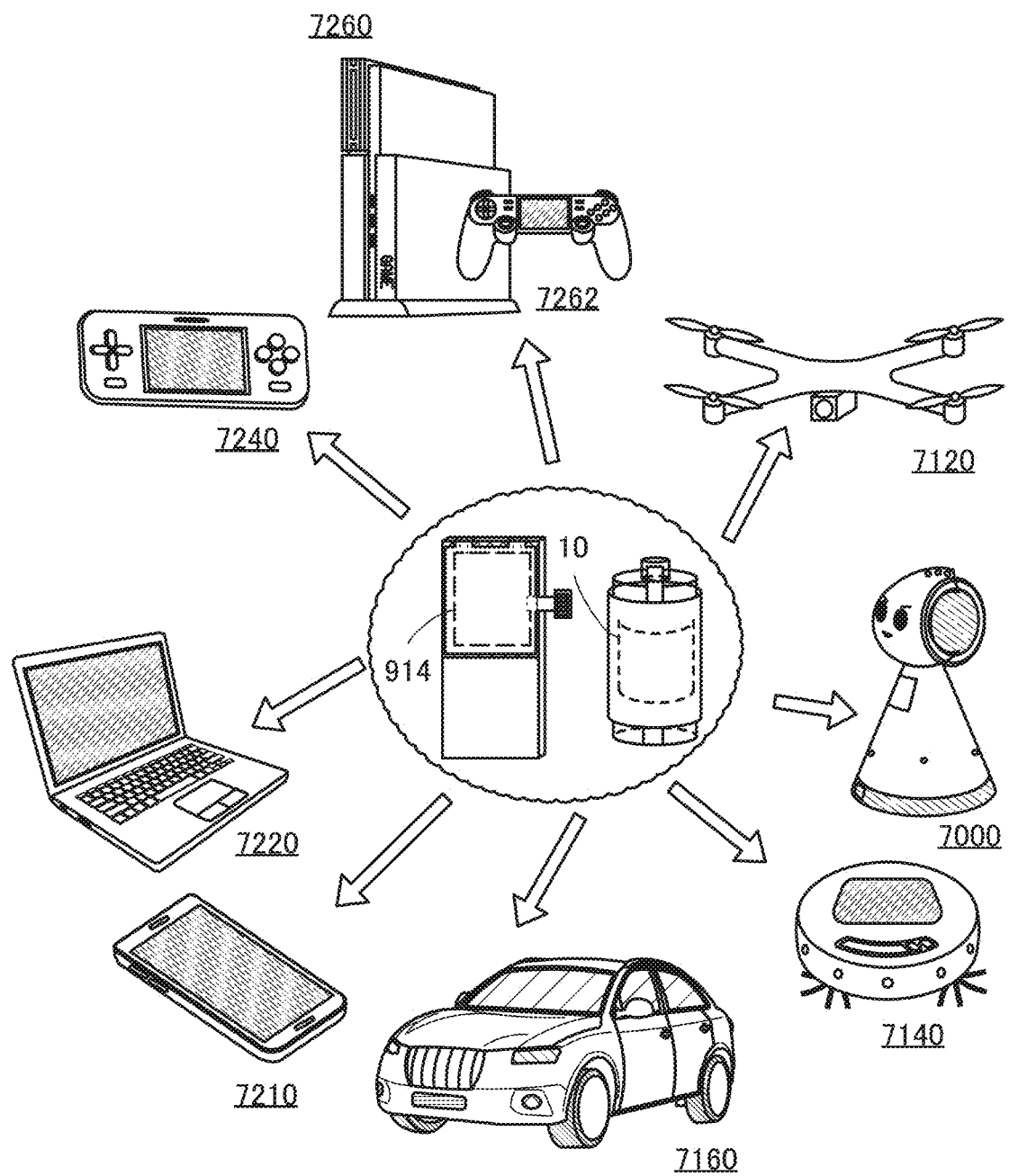
FIG. 25 shows examples of systems of embodiments of the present invention.

Examples of electronic devices each including the battery control circuit of one embodiment of the present invention will be described with reference to FIG. 25.

A cleaning robot 7000 includes a secondary battery, a display provided on the top surface, a plurality of cameras provided on the side surface, a brush, an operation button, various kinds of sensors, and the like. Although not illustrated, the cleaning robot 7000 is provided with a tire, an inlet, and the like. The cleaning robot 7000 can run autonomously, detect dust, and vacuum the dust through the inlet provided on the bottom surface. The use of the semiconductor device including the battery control circuit of one embodiment of the present invention, which is electrically connected to a secondary battery of the cleaning robot 7000, allows a reduction in the number of components and detection of an abnormality, such as a micro-short circuit, of the secondary battery.

The cleaning robot 7000 includes a secondary battery, an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The semiconductor device including the battery control circuit of one embodiment of the present invention is used for the secondary battery of the cleaning robot 7000; thus, control, protection, and the like of the secondary battery are possible.

The microphone has a function of detecting acoustic signals of a speaking voice of a user, an environmental sound, and the like. The speaker has a function of outputting audio signals such as a voice and a warning beep. The cleaning robot 7000 can analyze an audio signal input via the microphone and output a necessary audio signal from the speaker. The cleaning robot 7000 can communicate with the user with the use of the microphone and the speaker.

The camera has a function of taking images of the surroundings of the cleaning robot 7000. The cleaning robot 7000 has a function of moving with use of the moving mechanism. The cleaning robot 7000 can take images of the surroundings with use of the camera and analyze the images to sense whether there is an obstacle in the way of the movement. A flying object 7120 includes propellers, a camera, a secondary battery, and the like and has a function of flying autonomously.

The semiconductor device including the battery control circuit of one embodiment of the present invention is used for the secondary battery of the flying object 7120; thus, control, protection, and the like of the secondary battery as well as a reduction in weight are possible.

An electric vehicle 7160 is shown as an example of a moving object. The electric vehicle 7160 includes a secondary battery, tires, a brake, a steering gear, a camera, and the like. The use of the semiconductor device including the battery control circuit of one embodiment of the present invention, which is electrically connected to the secondary battery of the electric vehicle 7160, allows a reduction in the number of components and detection of an abnormality, such as a micro-short circuit, of the secondary battery.

Note that although an electric vehicle is described above as an example of a moving object, the moving object is not limited to an electric vehicle. Examples of the moving object include a train, a monorail train, a ship, and a flying object (a helicopter, an unmanned aircraft (a drone), an airplane, and a rocket). The use of the semiconductor device including the battery control circuit of one embodiment of the present invention, which is electrically connected to secondary batteries of these moving objects, allows a reduction in the number of components and detection of an abnormality, such as a micro-short circuit, of the secondary batteries.

A cylindrical secondary battery provided with the semiconductor device 810 and/or a battery pack provided with the semiconductor device 964 can be incorporated in a smartphone 7210, a PC 7220 (personal computer), a game machine 7240, and the like. Note that the semiconductor device 810 attached to a cylindrical secondary battery corresponds to the semiconductor device 810 illustrated in FIG. 23. The semiconductor device 964 attached to a battery pack corresponds to the semiconductor device 964 illustrated in FIG. 24.

The smartphone 7210 is an example of a portable information terminal. The smartphone 7210 includes a microphone, a camera, a speaker, various kinds of sensors, and a display portion. These peripheral devices are controlled by the semiconductor device including the battery control circuit. The use of the semiconductor device including the battery control circuit of one embodiment of the present invention, which is electrically connected to the secondary battery of the smartphone 7210, can reduce the number of components, control and protect the secondary battery, and increase the safety.

The PC 7220 is an example of a laptop PC. The use of the semiconductor device including the battery control circuit of one embodiment of the present invention, which is electrically connected to the secondary battery of the laptop PC, can reduce the number of components, control and protect the secondary battery, and increase the safety.

The game machine 7240 is an example of a portable game machine. A game machine 7260 is an example of a home-use stationary game machine. To the game machine 7260, a controller 7262 is connected with or without a wire. The use of the semiconductor device including the battery control circuit of one embodiment of the present invention in the controller 7262 can reduce the number of components, control and protect the secondary battery, and increase the safety.

This embodiment can be implemented in an appropriate combination with the structures described in the other embodiments and the like.

Embodiment 11

Embodiment 10 describes the example where a semiconductor device formed over a flexible substrate that is a flexible film is mounted on a cylindrical secondary battery;

as another example, this embodiment will describe an example where a semiconductor device and a battery layer are stacked inside an exterior body. Note that in FIG. 28, the components that are the same as those in FIG. 17 are described using the same reference numerals.

Figure 28:
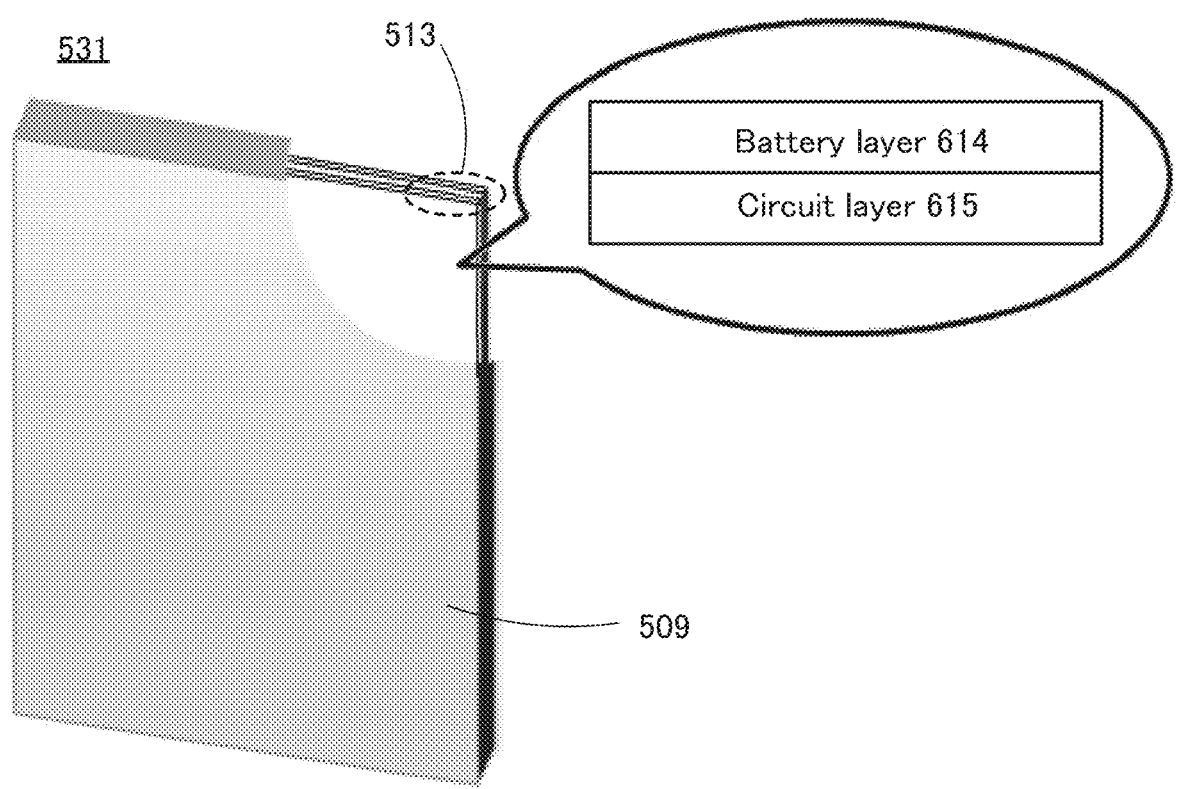
FIG. 28 is a perspective view illustrating one embodiment of the present invention.

As illustrated in FIG. 28, the secondary battery 513 is sealed in the battery pack 531 using a rectangular exterior body. The label 509 is attached to the rectangular exterior body.

A plurality of battery layers 614 are stacked, one of the battery layers 614 is stacked with a circuit layer 615, and they are collectively sealed in the exterior body. An electrolyte solution may be sealed in the rectangular exterior body, or a polymer gel electrolyte may be used.

The circuit layer 615 includes a battery control circuit, a battery protection circuit, and the like, and these circuits are configured with OS transistors and the like and have a small thickness; hence, the circuit layer 615 can be stacked with the battery layer 614. For example, when the circuit layer 615 detects an abnormality of the battery layer 614, supply of current to each layer can be separately interrupted. Consequently, even if an abnormality (e.g., a short circuit) is caused in one layer, only the one layer can be disconnected and the other layers can be continuously used.

The battery layer 614 refers to a stack including at least one or more selected from a positive electrode, a separator, a solid electrolyte, and a negative electrode. Note that a positive electrode or a negative electrode is a component made by forming an active material on a current collector.

When a solid electrolyte is used in the battery layer 614, a separator and a spacer do not need to be provided. Furthermore, the battery can be entirely solidified; therefore, there is no possibility of liquid leakage and thus the safety of the battery is dramatically increased.

The battery pack 531 illustrated in FIG. 28 incorporates an OS transistor battery control circuit with a low off-state current, a battery protection circuit, and the like and thus enables anomaly detection such as micro-short circuit detection. The circuit layer 615 includes the battery control circuit, the battery protection circuit, and the like, and these circuits are configured with OS transistors and the like and have a small thickness and a light weight; hence, the design quality of the battery unit can be improved and the size of the peripheral circuits can be reduced.

Since the battery pack 531 illustrated in FIG. 28 incorporates the protection circuit and the like, the need for a printed circuit board for the protection circuit can be eliminated.

This embodiment can be freely combined with the other embodiments.

Embodiment 12

This embodiment will describe an example where components of the power storage device of one embodiment of the present invention are provided over a substrate.

Figure 29:
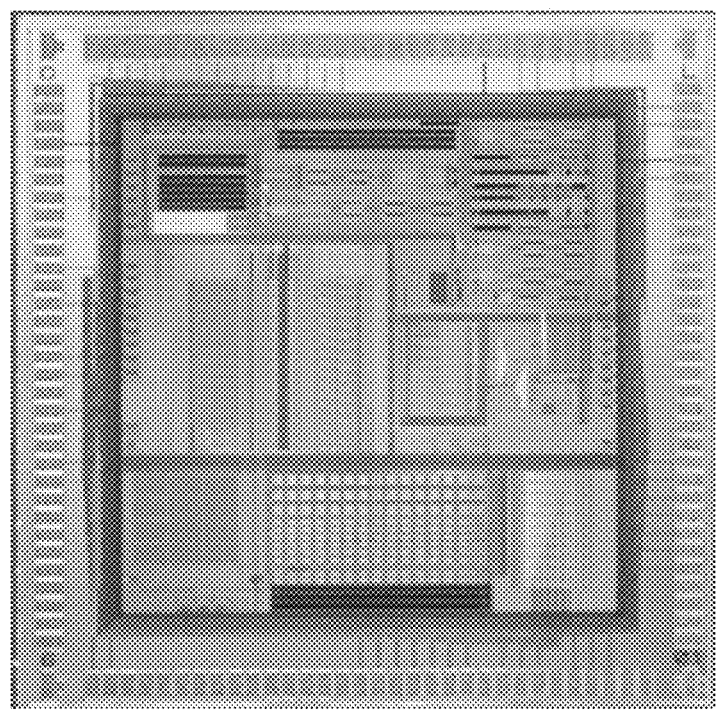
FIG. 29 is a photograph showing one embodiment of the present invention.

FIG. 29 shows a photograph of a chip that is configured using OS transistors formed over a silicon wafer and has a function of the battery control circuit of one embodiment of the present invention. The length of one side of the chip is 4 mm. Although the battery control circuit shown in FIG. 29 is formed over a silicon wafer, the circuit can be flexible when separated from the silicon wafer and transferred onto a film.

The battery control circuit shown in FIG. 29 has a structure to which the example described in the above embodiment is applied, and includes a cell balancing circuit, a circuit having a function of detecting overcharge and overdischarge, a circuit having a function of detecting overcurrent, a circuit having a function of detecting a micro-short circuit, a temperature sensor, a decoder, and the like.

This embodiment can be implemented in an appropriate combination with the structures described in the other embodiments and the like.

(Notes on description of this specification and the like) The description of the above embodiments and each structure in the embodiments are noted below.

One embodiment of the present invention can be constituted by appropriately combining the structure described in an embodiment with the structures described in the other embodiments. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, content described in the embodiment is content described using a variety of diagrams or content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions and shown as independent blocks in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

In the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, expressions "one of a source and a drain" (or a first electrode or a first terminal) and "the other of the source and the drain" (or a second electrode or a second terminal) for the other of the source and the drain are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conducting state (an on state) or a non-conducting (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" means the case where electrical signals can be transmitted and received between A and B when an object having any electric action exists between A and B.

REFERENCE NUMERALS

90: NAND circuit, 100: power storage device, 101: battery control circuit, 113: comparator, 114: memory element, 120: assembled battery, 121: battery cell, 121(1): battery cell, 121(2): battery cell, 121(3): battery cell, 121(k): battery cell, 121(n): battery cell, 161: capacitor, 162: transistor, 119: voltage generator circuit, 130: cell balancing circuit, 130(1): cell balancing circuit, 130(2): cell balancing circuit, 130(k): cell balancing circuit, 130(n): cell balancing circuit, 131: resistor, 132: transistor, 140: transistor, 150: transistor, 160: decoder, 172: transistor, 182: logic circuit, 185: detection circuit, 185c: circuit, 185d: circuit, 185(1): detection circuit, 185(2): detection circuit, 185(k): detection circuit, 185(n): detection circuit, 186: detection circuit, 190: digital-to-analog converter circuit

The invention claimed is:

1. A semiconductor device comprising:
a first comparator circuit configured to output a first signal controlling charging of a secondary battery;
a second comparator circuit configured to output a second signal controlling charging of the secondary battery;
a third comparator circuit configured to output a third signal controlling discharging of the secondary battery;
a first transistor of which one of a source electrode and a drain electrode is electrically connected to an inverting input terminal of the first comparator circuit;
a first capacitor of which one electrode is electrically connected to the one of the source electrode and the drain electrode of the first transistor;
a second transistor of which one of a source electrode and a drain electrode is electrically connected to an inverting input terminal of the second comparator circuit;
a second capacitor of which one electrode is electrically connected to the one of the source electrode and the drain electrode of the second transistor;
a third transistor of which one of a source electrode and a drain electrode is electrically connected to a non-inverting input terminal of the third comparator circuit;
a third capacitor of which one electrode is electrically connected to the one of the source electrode and the drain electrode of the third transistor; and
a selector circuit of which an output terminal is electrically connected to the other electrode of the first capacitor, the other electrode of the second capacitor, and the other electrode of the third capacitor,
wherein the other of the source electrode and the drain electrode of the first transistor, the other of the source electrode and the drain electrode of the second transistor, and the other of the source electrode and the drain electrode of the third transistor are electrically connected to one another, and
wherein a first input terminal of the selector circuit is electrically connected to a negative electrode terminal for the secondary battery.

2. The semiconductor device according to claim 1, wherein each of a non-inverting input terminal of the first comparator circuit, a non-inverting input terminal of the second comparator circuit, and an inverting input terminal of the third comparator circuit is electrically connected to a positive electrode terminal for the secondary battery.

3. The semiconductor device according to claim 1, wherein a second input terminal of the selector circuit is electrically connected to a terminal having a ground potential.

4. The semiconductor device according to claim 1, wherein each channel formation region of the first transistor, the second transistor and the third transistor comprises a metal oxide containing indium.

5. The semiconductor device according to claim 1, further comprising a fourth transistor,
wherein one of a source electrode and a drain electrode of the fourth transistor is electrically connected to a positive electrode terminal for the secondary battery,
wherein the other of the source electrode and the drain electrode of the fourth transistor is electrically connected to the negative electrode terminal for the secondary battery, and
wherein a gate electrode of the fourth transistor is electrically connected to an output terminal of the first comparator circuit.

6. The semiconductor device according to claim 1,
wherein the semiconductor device comprises n cell balancing circuits,
wherein one of the n cell balancing circuits comprises the first comparator circuit, the second comparator circuit, the third comparator circuit, the first transistor, the first capacitor, the second transistor, the second capacitor, the third transistor, the third capacitor, and the selector circuit, and wherein each of the n cell balancing circuits has the same circuit structure as the one of the n cell balancing circuits.

7. A semiconductor device comprising:
a first comparator circuit configured to output a first signal controlling charging of a secondary battery;
a first transistor of which one of a source electrode and a drain electrode is electrically connected to an inverting input terminal of the first comparator circuit;
a first capacitor of which one electrode is electrically connected to the one of the source electrode and the drain electrode of the first transistor; and
a first selector circuit of which an output terminal is electrically connected to the other electrode of the first capacitor,
wherein a first input terminal of the first selector circuit is electrically connected to a negative electrode terminal for the secondary battery,
wherein a second input terminal of the first selector circuit is electrically connected to a terminal having a ground potential, and
wherein a non-inverting terminal of the first comparator circuit is electrically connected to a positive electrode terminal for the secondary battery.

8. The semiconductor device according to claim 7, further comprising:
a second comparator circuit configured to output a second signal controlling the secondary battery;
a third comparator circuit configured to output a third signal controlling discharging of the secondary battery;
a second transistor of which one of a source electrode and a drain electrode is electrically connected to an inverting input terminal of the second comparator circuit;
a second capacitor of which one electrode is electrically connected to the one of the source electrode and the drain electrode of the first transistor;
a third transistor of which one of a source electrode and a drain electrode is electrically connected to a non-inverting input terminal of the third comparator circuit; and
a third capacitor of which one electrode is electrically connected to the one of the source electrode and the drain electrode of the third transistor,
wherein the other of the source electrode and the drain electrode of the first transistor, the other of the source electrode and the drain electrode of the second transistor, and the other of the source electrode and the drain electrode of the third transistor are electrically connected to one another.

9. The semiconductor device according to claim 8, further comprising a second selector circuit,
wherein an output terminal of the second selector circuit is electrically connected to the other electrode of the second capacitor and the other electrode of the third capacitor.

10. The semiconductor device according to claim 8, further comprising a fourth transistor,
wherein one of a source electrode and a drain electrode of the fourth transistor is electrically connected to the positive electrode terminal for the secondary battery,
wherein the other of the source electrode and the drain electrode of the fourth transistor is electrically connected to the negative electrode terminal for the secondary battery, and wherein a gate electrode of the fourth transistor is electrically connected to an output terminal of the first comparator circuit.

11. The semiconductor device according to claim 7, wherein a channel formation region of the first transistor comprises a metal oxide containing indium.

12. The semiconductor device according to claim 7,
wherein the semiconductor device comprises n cell balancing circuits,
wherein one of the n cell balancing circuits comprises the first comparator circuit, the first transistor, the first capacitor, and the first selector circuit, and
wherein each of the n cell balancing circuits has a same circuit structure as the one of the n cell balancing circuits.

13. An operating method of a semiconductor device comprising the steps of:
providing a ground potential to one electrode of a capacitor in which the other electrode is electrically connected to an inverting input terminal of a first comparator circuit;
turning on a first transistor in which one of a source electrode and a drain electrode is electrically connected to the other electrode of the capacitor after providing the ground potential;
turning off the first transistor after turning on the first transistor;
electrically connecting the one electrode of the capacitor to a negative electrode of a first secondary battery after turning off the first transistor; and
turning on a second transistor after electrically connecting the one electrode of the capacitor,
wherein one of a source electrode and a drain electrode of the second transistor is electrically connected to a positive electrode of the first secondary battery,
wherein the other of the source electrode and the drain electrode of the second transistor is electrically connected to the negative electrode of the first secondary battery,
wherein a gate electrode of the second transistor is electrically connected to an output terminal of the first comparator circuit, and
wherein turning on the second transistor is performed by changing a potential of the output terminal of the first comparator circuit.

14. The operating method of a semiconductor device, according to claim 13, wherein the positive electrode of the first secondary battery is electrically connected to a non-inverting input terminal of the first comparator circuit.

15. The operating method of a semiconductor device, according to claim 13,
wherein the capacitor, the first comparator circuit, the first transistor, and the second transistor form a first cell balancing circuit,
wherein the semiconductor device comprises a plurality of cell balancing circuits, and
wherein the first cell balancing circuit is one of the plurality of cell balancing circuits.

16. The operating method of a semiconductor device, according to claim 13,
wherein the semiconductor device further comprises a second comparator circuit, a second capacitor, a third transistor, a third comparator circuit, a third capacitor and a fourth transistor,
wherein one electrode of the second capacitor is electrically connected to an inverting input terminal of the second comparator circuit and one of a source electrode and a drain electrode of the third transistor, wherein one electrode of the third capacitor is electrically connected to a non-inverting input terminal of the third comparator circuit and one of a source electrode and a drain electrode of the fourth transistor, and wherein in the step of turning off the first transistor, the third transistor and the fourth transistor is turned off.

17. The operating method of a semiconductor device, according to claim 13, wherein a first potential is supplied to the one electrode of the capacitor in the step of turning on the first transistor, and wherein a sum of the first potential and a potential of the negative electrode of the first secondary battery is supplied to the inverting input terminal of the first comparator circuit in the step of electrically connecting the one electrode of the capacitor.

* * * * *